(12) United States Patent
Watanabe et al.

(10) Patent No.: US 8,658,346 B2
(45) Date of Patent: *Feb. 25, 2014

(54) PATTERN FORMING PROCESS, CHEMICALLY AMPLIFIED POSITIVE RESIST COMPOSITION, AND RESIST-MODIFYING COMPOSITION

(75) Inventors: Takeru Watanabe, Joetsu (JP); Tsunehiro Nishi, Joetsu (JP); Masashi Iio, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 333 days.

This patent is subject to a terminal disclaimer.

(21) Appl. No.: 12/850,266

(22) Filed: Aug. 4, 2010

(65) Prior Publication Data
US 2011/0033799 A1 Feb. 10, 2011

(30) Foreign Application Priority Data

Aug. 5, 2009 (JP) ................................. 2009-182136

(51) Int. Cl.
*G03F 7/38* (2006.01)
*G03F 7/20* (2006.01)

(52) U.S. Cl.
CPC .................................. *G03F 7/70466* (2013.01)
USPC ........... 430/312; 430/313; 430/314; 430/323; 430/394

(58) Field of Classification Search
CPC .................................................. G03F 7/70466
USPC .................................. 430/312, 314, 323, 394
See application file for complete search history.

(56) References Cited

U.S. PATENT DOCUMENTS

| 5,756,075 | A | * | 5/1998 | Meyer .............................. 424/59 |
| 6,312,867 | B1 | | 11/2001 | Kinsho et al. |
| 7,537,880 | B2 | | 5/2009 | Harada et al. |

(Continued)

FOREIGN PATENT DOCUMENTS

| EP | 1 975 718 A2 | 10/2008 |
| EP | 2128706 A1 | 12/2009 |

(Continued)

OTHER PUBLICATIONS

Abdallah, David J. et al., "A Novel Resist Freeze Process for Double Imaging", Journal of Photopolymer Science and Technology, May 2008, pp. 655-663, vol. 21, No. 5, cited in spec.

(Continued)

*Primary Examiner* — John Chu
(74) *Attorney, Agent, or Firm* — Westerman, Hattori, Daniels & Adrian, LLP

(57) ABSTRACT

A pattern is formed by (1) coating a first positive resist composition onto a substrate, baking, patternwise exposing, PEB, and developing to form a first positive resist pattern including a large area feature, (2) applying a resist-modifying composition comprising a basic nitrogen-containing compound and heating to modify the first resist pattern, and (3) coating a second positive resist composition thereon, patternwise exposing, and developing to form a second resist pattern. The large area feature in the first resist pattern has a film retentivity of at least 50% after the second pattern formation.

15 Claims, 8 Drawing Sheets

(56) References Cited

U.S. PATENT DOCUMENTS

| | | |
|---|---|---|
| 8,105,760 B2 | 1/2012 | Hatakeyama et al. |
| 2007/0231738 A1 | 10/2007 | Kaneko et al. |
| 2008/0090172 A1 | 4/2008 | Hatakeyama et al. |
| 2008/0199814 A1 | 8/2008 | Brzozowy et al. |
| 2010/0003622 A1 | 1/2010 | Matsumaru et al. |
| 2010/0028809 A1 | 2/2010 | Vanleenhove et al. |
| 2010/0035177 A1 | 2/2010 | Ishikawa et al. |
| 2010/0062379 A1 | 3/2010 | Iwashita |
| 2010/0086878 A1* | 4/2010 | Hatakeyama et al. ......... 430/324 |
| 2010/0159392 A1* | 6/2010 | Hatakeyama et al. ...... 430/286.1 |
| 2010/0183978 A1 | 7/2010 | Yoshidome |

FOREIGN PATENT DOCUMENTS

| | | | |
|---|---|---|---|
| JP | 2000-336121 | A | 12/2000 |
| JP | 2007-297590 | A | 11/2007 |
| JP | 2008-033174 | A | 2/2008 |
| JP | 2008-078220 | A | 4/2008 |
| JP | 2008-083537 | A | 4/2008 |
| JP | 2008-111103 | A | 5/2008 |
| JP | 2008-122932 | A | 5/2008 |
| JP | 2008-192774 | A | 8/2008 |
| JP | 2009-20510 | A | 1/2009 |
| JP | 2009-42752 | A | 2/2009 |
| JP | 2010-102047 | A | 5/2010 |
| TW | 200928592 | A | 7/2009 |
| TW | 200931185 | A | 7/2009 |
| WO | 2008/059440 | A2 | 5/2008 |
| WO | 2008/070060 | A2 | 6/2008 |
| WO | 2008/114644 | A1 | 9/2008 |

OTHER PUBLICATIONS

Lin, B. J., "Semiconductor Foundry, Lithography, and Partners", Proceedings of SPIE, Jul. 2002, p. xxix, vol. 4690, cited in spec.

Bekiaris, Nikolaos et al., "A Lithographic and Process Assessment of Photoresist Stabilization for Double-Patterning using 172 nm Photoresist Curing", Proceedings of SPIE, Mar. 2008, pp. 692321-1-692321-8, vol. 6923, cited in spec.

Chen, Kuang-Jung Rex et al., "Resist Freezing Process for Double Exposure Lithography", Proceedings of SPIE, Mar. 2008, pp. 69230G-1-69230G-10, vol. 6923, cited in spec.

Hori, Masafumi et al., "Sub-40nm Half-Pitch Double Patterning with Resist Freezing Process", Proceedings of SPIE, Mar. 2008, pp. 69230H-1-69230H-8, vol. 6923, cited in spec.

Hsu, Stephen et al., "Double Exposure Technique for 45nm node and Beyond", Proceedings of SPIE, Nov. 2005, pp. 59921Q-1-59921Q-16, vol. 5992, cited in spec.

Nakamura, Hiroko et al., "Ion implantation as insoluble treatment for resist stacking process", Proceedings of SPIE, Mar. 2008, pp. 692322-1-692322-12, vol. 6923, cited in spec.

Owa, Soichi and Hiroyuki Nagasaka, "Immersion lithography; its potential performance and issues", Proceedings of SPIE, Jun. 2003, p. 724, vol. 5040, cited in spec.

Shimura, Satoru et al., "Advanced Resist process enabling implementation of CD controllability for 32nm and beyond", Proceedings of SPIE, Mar. 2008, pp. 69233C-1-69233C-6, vol. 6923, cited in spec.

Taiwanese Office Action dated Feb. 7, 2013, issued in corresponding Taiwanese Patent Application No. 099125920.

Japanese Office Action dated Jul. 2, 2013, issued in corresponding Japanese Patent Application No. 2010-174175.

* cited by examiner

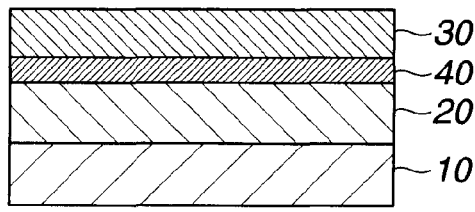
FIG.1A COAT PHOTORESIST
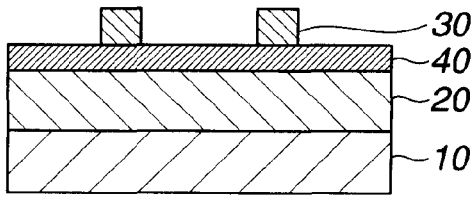
FIG.1B EXPOSE AND DEVELOP PHOTORESIST
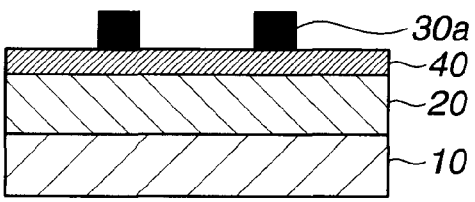
FIG.1C MODIFYING TREATMENT FOR INACTIVATION
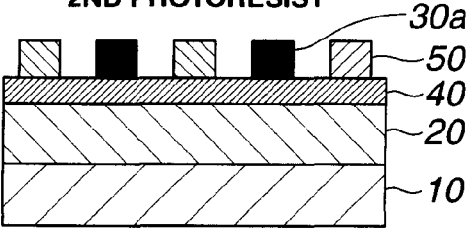
FIG.1D COAT, EXPOSE AND DEVELOP 2ND PHOTORESIST
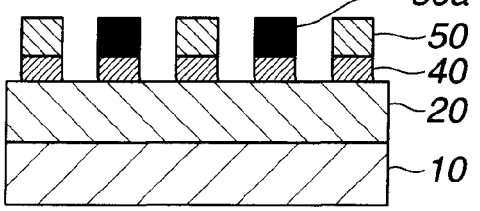
FIG.1E ETCH HARD MASK
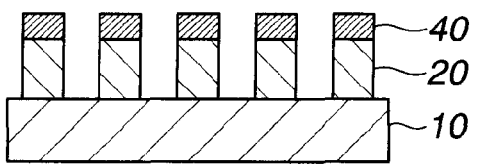
FIG.1F ETCH PROCESSABLE LAYER

FIRST PATTERN

SECOND PATTERN

FIRST PATTERN

SECOND PATTERN

COAT PHOTORESIST

EXPOSE AND DEVELOP
PHOTORESIST

ETCH HARD MASK

COAT, EXPOSE AND DEVELOP
2ND PHOTORESIST

ETCH HARD MASK

ETCH PROCESSABLE LAYER

A (FIRST PATTERN)   B (SECOND PATTERN)

PATTERN FORMING PROCESS, CHEMICALLY AMPLIFIED POSITIVE RESIST COMPOSITION, AND RESIST-MODIFYING COMPOSITION

CROSS-REFERENCE TO RELATED APPLICATION

This non-provisional application claims priority under 35 U.S.C. §119(a) on Patent Application No. 2009-182136 filed in Japan on Aug. 5, 2009, the entire contents of which are hereby incorporated by reference.

TECHNICAL FIELD

This invention relates to a patterning process involving the steps of forming a first positive resist pattern including a large area pattern feature having a short side of at least 200 nm from a first resist film through first exposure, treating the first resist pattern with a resist-modifying composition to modify the first resist pattern for inactivation to a second resist process, coating a second resist composition, and forming a second resist pattern therefrom without losing the first resist pattern including a large area pattern feature, for thereby forming a fine size pattern. It also relates to a resist composition and a resist-modifying composition suited for use in the process.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. While a number of light sources are used in the lithography for resist pattern formation, photolithography using ArF excimer laser (193 nm) has been under active investigation over a decade. The full application of ArF lithography started from the 90-nm node. The ArF lithography combined with a lens having an increased numerical aperture (NA) of 0.9 is considered to comply with 65-nm node devices. For the manufacture of next 45-nm node devices, the early introduction of ArF immersion lithography was advocated (see Proc. SPIE Vol. 4690 xxix, 2002).

In the ArF immersion lithography, water is held between the projection lens and the wafer. Since water has a refractive index of 1.44 at 193 nm, design of a lens having a numerical aperture (NA) of 1.0 or greater is possible in principle. Proposal of a catadioptric system accelerated the lens design to a NA of 1.0 or greater. A combination of a lens having NA of 1.2 or greater with strong resolution enhancement technology suggests a way to the 45-nm node (see Proc. SPIE Vol. 5040, p 724, 2003). Efforts have also been made to develop lenses of NA 1.35.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line edge or width roughness (LER or LWR) of resist film, defect-free MoSi laminate mask, reduced aberration of reflection mirror, and the like.

The water immersion lithography using a NA 1.35 lens achieves an ultimate resolution of 40 to 38 nm at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5C_{12}$) having a refractive index of at least 2 is the most promising material, but has the problems of birefringence and noticeable absorption. Even if a projection lens material with a refractive index of 1.8 or greater is developed, the liquid with a refractive index of 1.65 limits the NA to 1.55 at most, failing in resolution of 32 nm. For resolution of 32 nm, a liquid with a refractive index of 1.8 or greater is necessary. Such a liquid material has not been discovered because a tradeoff between absorption and refractive index is recognized in the art. In the case of alkane compounds, bridged cyclic compounds are preferred to linear ones in order to increase the refractive index, but the cyclic compounds undesirably have too high a viscosity to follow high-speed scanning on the exposure tool stage. If a liquid with a refractive index of 1.8 is developed, then the component having the lowest refractive index is the resist film, suggesting a need to increase the refractive index of a resist film to 1.8 or higher.

The process that now draws attention under the above-discussed circumstances is a double patterning process involving a first set of exposure and development to form a first pattern and a second set of exposure and development to form a pattern in spaces of the first pattern. See Proc. SPIE Vol. 5992, 59921Q-1-16 (2005). A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure pattern, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a second photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. However, since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern, or a RELACS method of coating a water-soluble film on the trench pattern as developed and heating to thicken the resist for achieving shrinkage of the trench pattern. These have the drawbacks that the proximity bias is degraded and the process is further complicated, leading to reduced throughputs.

Both the former and latter processes require two etchings for substrate processing, leaving the issues of a reduced throughput and deformation and misregistration of the pattern by two etchings.

One method that proceeds with a single etching is by using a negative resist material in a first exposure and a positive resist material in a second exposure. Another method is by using a positive resist material in a first exposure and a negative resist material in an alcohol that does not dissolve away the positive resist material in a second exposure. Since negative resist materials with low resolution are used, these methods entail degradation of resolution (see JP-A 2008-078220).

The critical issue associated with double patterning is an overlay accuracy between first and second patterns. Since the magnitude of misregistration is reflected by a variation of line size, an attempt to form 32-nm lines at an accuracy of 10%, for example, requires an overlay accuracy within 3.2 nm. Since currently available scanners have an overlay accuracy of the order of 8 nm, a significant improvement in accuracy is necessary.

Now under investigation is the resist pattern freezing technology involving forming a first resist pattern on a substrate, taking any suitable means for inactivating the resist pattern to a second resist process, applying a second resist thereon, and forming a second resist pattern in space portions of the first resist pattern. With this freezing technology, etching of the substrate is required only once, leading to improved throughputs and avoiding the problems of pattern deformation and misregistration due to stresses in the hard mask during etching.

With respect to the freezing technology, one basic idea is proposed in WO 2008/059440. Known variants of the freezing technology include thermal insolubilization (Proc. SPIE Vol. 6923, p 69230G (2008)); coating of a cover film and thermal insolubilization (Proc. SPIE Vol. 6923, p 69230H (2008)); insolubilization by illumination of light having an extremely short wavelength, for example, 172 nm wavelength (Proc. SPIE Vol. 6923, p 692321 (2008)); insolubilization by ion implantation (Proc. SPIE Vol. 6923, p 692322 (2008)); insolubilization through formation of thin-film oxide film by CVD; insolubilization by light illumination and special gas treatment (Proc. SPIE Vol. 6923, p 69233C1 (2008)); insolubilization of a resist pattern by treatment of resist pattern surface with a metal alkoxide or metal halide (e.g., titanium, zirconium or aluminum) or an isocyanate-containing silane compound (JP-A 2008-033174); insolubilization of a resist pattern by coating its surface with a water-soluble resin and a water-soluble crosslinker (JP-A 2008-083537); insolubilization by ethylene diamine gas and baking (J. Photopolym. Sci. Technol., Vol. 21, No. 5, p 655 (2008)); insolubilization by coating of an amine-containing solution and hard-baking for crosslinking (WO 2008/070060); and insolubilization of resist pattern by treatment with a mixture of a polar resin containing amide or analogous groups and a crosslinker (WO 2008/114644). JP-A 2008-192774 discloses a method including insolubilizing a first resist pattern by application of radiation and heat, coating the insolubilized pattern with a resist solution comprising a base polymer comprising recurring units having hexafluoroalcohol groups and acid labile groups in an alcohol solvent, and forming a second resist pattern therefrom. Of these, the process of insolubilizing or freezing a first resist pattern by treatment with a resist-modifying composition is of great interest because of a high possibility that the existing system and resist material be applicable.

The double patterning technology involving the freezing process using a resist-modifying composition suffers from several problems including alignment marks. The alignment marks are used as the reference upon alignment for SEM observation, alignment of an exposure mask or the like. They are usually provided outside the semiconductor device region as a combination of large area features having longitudinal and transverse sizes of several microns to several hundred microns. It is believed to be a common practice in the freezing process to utilize a special substrate which is obtained by etching a substrate to engrave alignment marks thereon. Manufacture of such special substrates is costly. For example, in the multilayer lithography process wherein many layers of films such as an undercoat film, intermediate film, antireflective coating and resist film are laid on alignment marks, it is sometimes difficult to detect the alignment marks from the top. For this reason, it would be desirable to design an exposure mask with a large area pattern feature for alignment, and transfer the pattern feature to a positive resist to form an alignment pattern feature as part of the positive pattern. This process still has a problem. Even when the alignment pattern feature is formed in the first pattern, the prior art freezing process fails in sufficient freezing of the large area pattern feature, allowing the alignment pattern feature to be deformed in the course of freezing, or the alignment pattern feature to be dissolved, deformed or thinned upon coating of the second resist material. In either case, the alignment pattern feature is no longer effective as the reference for alignment. The reason is as follows. The prior art freezing process often utilizes the chemical reaction under the catalysis of the acid generated from the photoacid generator upon receipt of leakage light and present in a minor amount in the first pattern (e.g., acid-catalyzed crosslinking reaction when a crosslinker is used). The desired chemical reaction does not occur at the center region of the large area pattern feature where no light is reachable and hence, no acid is generated from the photoacid generator. This results in insufficient freezing.

One possible alternative is to form an alignment pattern feature in the second pattern. Undesirably, the substrate surface area which is otherwise available for semiconductor devices is substantially reduced by an extra region for the alignment pattern feature. Under the circumstances, there exists a demand for a novel material and process which can form an effective alignment pattern feature for utilization in the double patterning technology involving the freezing process using a resist-modifying composition.

CITATION LIST

Patent Document 1: JP-A 2008-078220
Patent Document 2: WO 2008/059440
Patent Document 3: JP-A 2008-033174
Patent Document 4: JP-A 2008-083537
Patent Document 5: WO 2008/070060
Patent Document 6: WO 2008/114644
Patent Document 7: JP-A 2008-192774
Non-Patent Document 1: Proc. SPIE Vol. 4690, xxix, 2002
Non-Patent Document 2: Proc. SPIE Vol. 5040, p724, 2003
Non-Patent Document 3: Proc. SPIE Vol. 5992, 59921Q-1-16, 2005
Non-Patent Document 4: Proc. SPIE Vol. 6923, p 69230G (2008)
Non-Patent Document 5: Proc. SPIE Vol. 6923, p69230H (2008)

Non-Patent Document 6: Proc. SPIE Vol. 6923, p692321 (2008)
Non-Patent Document 7: Proc. SPIE Vol. 6923, p692322 (2008)
Non-Patent Document 8: Proc. SPIE Vol. 6923, p69233C1 (2008)
Non-Patent Document 9: J. Photopolym. Sci. Technol., Vol. 21, No. 5, p655 (2008)

SUMMARY OF INVENTION

It is understood that when substrate processing is carried out by double dry etchings using resist patterns fabricated by double exposures and developments, the throughput is reduced to one half. Also an issue of pattern misregistration by dry etchings occurs. While the number of dry etching steps can be reduced to one by applying prior art resist pattern insolubilizing techniques, the double patterning processes using the prior art resist pattern insolubilizing compositions are difficult to form an effective pattern feature for alignment.

Therefore, an object of the invention is to provide a double patterning process of processing a substrate by a single dry etching, the process capable of forming an effective alignment pattern feature, using a resist-modifying composition. Another object is to provide a chemically amplified positive resist composition and a resist-modifying composition for use in the pattern forming process.

The inventors have found that by coating a first positive resist composition comprising a polymer comprising recurring units adapted to increase alkali solubility under the action of acid and recurring units having lactone structure onto a substrate and baking to form a first resist film, exposing the first resist film to high-energy radiation, post-exposure baking, developing the first resist film with an alkaline developer to form a first positive resist pattern including a large area pattern feature having a short side of at least 200 nm, applying a resist-modifying composition comprising a basic nitrogen-containing compound having a conjugate acid pKa of at least 4 to the first resist pattern, heating to modify the first resist pattern, coating a second positive resist composition thereon and baking to form a second resist film, exposing the second resist film to high-energy radiation, post-exposure baking, and developing the second resist film with an alkaline developer to form a second resist pattern, there can be formed a fine size pattern of satisfactory profile which is difficult to produce by single patterning, and the large area pattern feature in the first resist pattern can be retained at a film retentivity of at least 50% after the formation of the second resist pattern.

In a first aspect, the invention provides a multiple pattern-forming process comprising the steps of:

(1) coating a first positive resist composition comprising as a base resin a polymer comprising recurring units adapted to increase alkali solubility under the action of acid and recurring units having lactone structure onto a substrate and baking to form a first resist film, exposing the first resist film to high-energy radiation, post-exposure baking, and developing the first resist film with an alkaline developer to form a first positive resist pattern including a large area pattern feature having a short side of at least 200 nm, (2) applying a resist-modifying composition comprising a basic nitrogen-containing compound having a conjugate acid pKa of at least 4 onto the first resist pattern and heating to modify the first resist pattern, and (3) coating a second positive resist composition thereon and baking to form a second resist film, exposing the second resist film to high-energy radiation, post-exposure baking, and developing the second resist film with an alkaline developer to form a second resist pattern, wherein the large area pattern feature in the first resist pattern has a film retentivity of at least 50% after the formation of the second resist pattern.

In a preferred embodiment, the polymer in the first positive resist composition further comprises recurring units having a carboxyl group.

In a preferred embodiment, the resist-modifying composition comprises an aminosilanol compound as the basic nitrogen-containing compound. The aminosilanol compound is preferably selected from the following general formulae (S0), (S1) and (S2).

(S0)

Herein $A^{S1}$ is a straight, branched or cyclic $C_2$-$C_{20}$ alkylene group, $C_6$-$C_{15}$ arylene group, or $C_7$-$C_{16}$ aralkylene group, which may contain a hydroxyl, ether or amino group, $R^{S1}$ is each independently a $C_1$-$C_4$ alkyl group or $OR^{S2}$, $R^{S2}$ is hydrogen or a $C_1$-$C_6$ alkyl group, $R^{S3}$ is each independently hydrogen, or a $C_1$-$C_4$ alkyl group which may contain a hydroxyl or ether group, $R^{S3}$ may bond together to form a ring with the nitrogen atom to which they are attached.

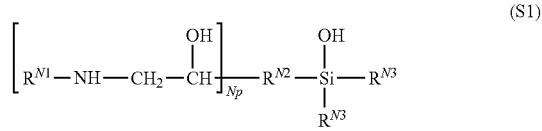
(S1)

Herein $R^{N1}$ is hydrogen or a straight, branched or cyclic $C_1$-$C_{20}$ alkyl group, $C_6$-$C_{10}$ aryl group, or $C_2$-$C_{12}$ alkenyl group, which may contain a hydroxyl, ether, ester or amino group, Np is 1 or 2, in the case of Np=1, $R^{N2}$ is a straight, branched or cyclic $C_1$-$C_{20}$ alkylene group which may contain an ether, ester or phenylene group, in the case of Np=2, $R^{N2}$ is the foregoing alkylene group with one carbon-bonded hydrogen atom eliminated, $R^{N3}$ is each independently hydrogen, a $C_1$-$C_6$ alkyl, $C_6$-$C_{10}$ aryl, $C_2$-$C_{12}$ alkenyl, $C_1$-$C_6$ alkoxy, $C_6$-$C_{10}$ aryloxy, $C_2$-$C_{12}$ alkenyloxy, $C_7$-$C_{12}$ aralkyloxy, or hydroxyl group, at least one of $R^{N3}$ is alkoxy or hydroxyl.

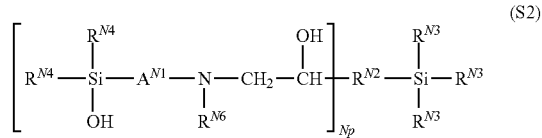
(S2)

Herein $A^{N1}$ is a straight, branched or cyclic $C_2$-$C_{20}$ alkylene group, $C_6$-$C_{15}$ arylene or $C_7$-$C_{16}$, aralkylene group, which may contain a hydroxyl, ether or amino group, $R^{N4}$ is each independently a $C_1$-$C_4$ alkyl group or $OR^{N5}$, $R^{N5}$ is hydrogen or $C_1$-$C_6$ alkyl, $R^{N6}$ is each independently hydrogen or a $C_1$-$C_4$ alkyl group which may contain hydroxyl or ether group, Np, $R^{N2}$ and $R^{N3}$ are as defined above.

In a preferred embodiment, the resist-modifying composition further comprises an oxazoline compound. The preferred oxazoline compound has the general formula (Ox):

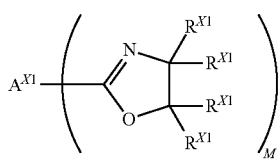
(Ox)

wherein M is an integer of 1 to 6, $A^{X1}$ is hydrogen, a single bond, a M-valent acyclic or cyclic $C_1$-$C_{20}$ hydrocarbon group or a M-valent $C_6$-$C_{15}$ aromatic group, and $R^{X1}$ is each independently hydrogen or methyl.

In a preferred embodiment, the resist-modifying composition further comprises a base resin comprising recurring units having a basic functional group.

In a preferred embodiment, the base resin in the resist-modifying composition comprises recurring units of the following general formula (1):

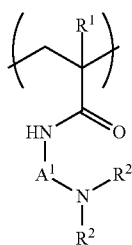
(1)

wherein $A^1$ is a straight, branched or cyclic $C_2$-$C_8$ alkylene group which may contain an ether group, $R^1$ is hydrogen or methyl, and $R^2$ is each independently a $C_1$-$C_4$ alkyl group or $R^2$ may bond together to form a heterocyclic ring with the nitrogen atom to which they are attached. The base resin may further comprise recurring units of the following general formula (6):

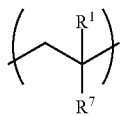
(6)

wherein $R^1$ is hydrogen or methyl, and $R^7$ is a $C_6$-$C_{15}$ aryl, $C_3$-$C_{10}$ hetero-aryl or $C_4$-$C_6$ lactam group.

In a preferred embodiment, the polymer in the first positive resist composition comprises at least recurring units having formulae (2) to (4):

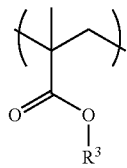
(2)

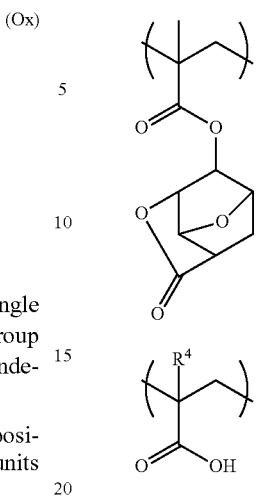
(3)

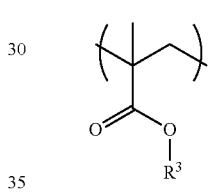
(4)

wherein $R^3$ is a branched or cyclic, tertiary $C_4$-$C_{20}$ alkyl group which may contain an ether group, and $R^4$ is hydrogen or methyl.

In a further preferred embodiment, the polymer in the first positive resist composition comprises at least recurring units having formulae (2) to (5):

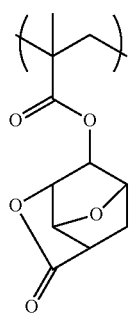
(2)

(3)

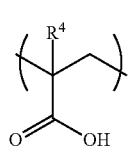
(4)

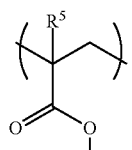
(5)

wherein $R^3$ is a branched or cyclic, tertiary $C_4$-$C_{20}$ alkyl group which may contain an ether group, $R^4$ and $R^5$ are each independently hydrogen or methyl, and $R^6$ is hydrogen or hydroxyl.

In a second aspect, the invention provides a chemically amplified positive resist composition for forming the first resist pattern in the multiple pattern-forming process defined above. The resist composition comprises a base resin comprising at least recurring units having formulae (2) to (4):

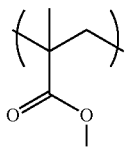

(2)

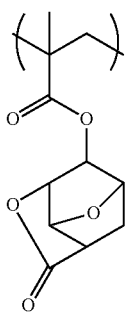

(3)

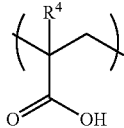

(4)

wherein $R^3$ is a branched or cyclic, tertiary $C_4$-$C_{20}$ alkyl group which may contain an ether group, and $R^4$ is hydrogen or methyl, or a base resin comprising at least recurring units having formulae (2) to (5):

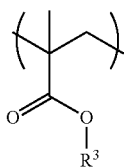

(2)

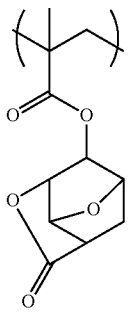

(3)

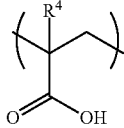

(4)

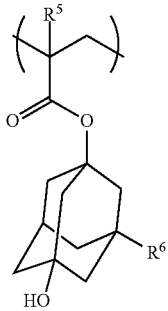

(5)

wherein $R^3$ is a branched or cyclic, tertiary $C_4$-$C_{20}$ alkyl group which may contain an ether group, $R^4$ and $R^5$ are each independently hydrogen or methyl, and $R^6$ is hydrogen or hydroxyl.

In a third aspect, the invention provides a resist-modifying composition comprising an aminosilanol compound having the general formula (S0), (S1) or (S2) as defined above, water, and an alcohol solvent.

ADVANTAGEOUS EFFECTS OF INVENTION

In the double patterning process including the use of a resist pattern-insolubilizing or resist-modifying composition, an effective alignment mark can be formed. The pattern forming process, the first pattern-forming chemically amplified positive resist composition, and the resist-modifying composition of the invention make it possible to implement a double patterning process of processing a substrate by two exposures and a single dry etching.

BRIEF DESCRIPTION OF DRAWINGS

FIG. 1 is a cross-sectional view of a double patterning process according to one embodiment of the invention. FIG. 1A shows a laminate of substrate, processable layer, hard mask and first resist film, FIG. 1B shows the first resist film being exposed and developed, FIG. 1O shows the first resist film being modified for inactivation, FIG. 1D shows a second resist film being formed, exposed and developed, FIG. 1E shows the hard mask being etched, and FIG. 1F shows the processable layer being etched.

FIG. 2 is a schematic view of a double patterning process according to another embodiment of the invention.

FIG. 3 is a schematic view of a double patterning process according to a further embodiment of the invention.

FIG. 4 is a cross-sectional view of an exemplary prior art double patterning process.

FIG. 5 is a cross-sectional view of another exemplary prior art double patterning process.

FIG. 6 is a cross-sectional view of a further exemplary prior art double patterning process.

DESCRIPTION OF THE PREFERRED EMBODIMENT

Figure 2A:
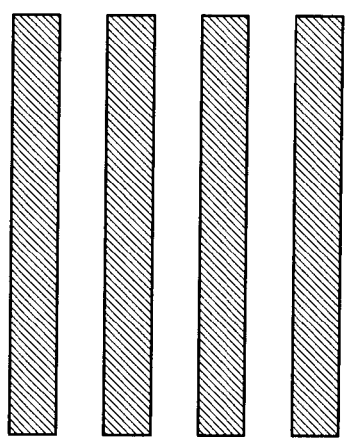
FIG. 2A shows a first resist pattern being formed.

The singular forms "a," "an" and "the" include plural referents unless the context clearly dictates otherwise. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group. As used herein, the term "film" is used interchangeably with "coating" or "layer." The term "processable layer" is interchangeable with patternable layer and refers to a target layer that can be processed such as by etching to form a pattern therein.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure baking
TMAH: tetramethylammonium hydroxide
PGMEA: propylene glycol monomethyl ether acetate In connection with the double patterning lithography involving double exposures and developments to form a fine feature pattern, the inventors made efforts to develop a resist-insolubilizing or modifying composition and a first pattern-forming chemically amplified positive resist composition which enable to form an effective alignment pattern feature.

The inventors have found that a double patterning process can be practiced by coating a first positive resist composition comprising a polymer comprising recurring units adapted to increase alkali solubility under the action of acid and recurring units having lactone structure onto a substrate and baking to form a first resist film, exposing the first resist film to high-energy radiation, post-exposure baking, developing the first resist film with an alkaline developer to form a first positive resist pattern including a large area pattern feature having a short side of at least 200 nm, applying a resist-modifying composition comprising a basic nitrogen-containing compound having a conjugate acid pKa of at least 4 to the first resist pattern and heating to modify the first resist pattern, then implementing the second resist process. The large area pattern feature in the first resist pattern is retained at a film retentivity of at least 50% after the formation of the second resist pattern. Then a fine feature pattern of satisfactory profile having a reduced distance between pattern features is formed while the pattern feature effective for alignment is formed. This makes it possible to implement a double patterning process of processing a substrate by two exposures and a single dry etching.

In the double patterning processes using resist pattern-insolubilizing compositions proposed thus far, a large area pattern feature in a first resist pattern is insufficiently retained until the second resist process. Thus no effective alignment pattern feature can be formed. According to the invention, a first pattern-forming chemically amplified positive resist composition comprising a base resin having recurring units of specific structure is used to form a first resist pattern including a large area pattern feature, and a resist-modifying composition comprising a specific basic nitrogen-containing compound is used to effect modifying treatment of the first resist pattern. Both the fine feature size pattern section and the large area feature are satisfactorily retained. That is, the effective alignment pattern feature is formed.

The pattern forming process of the invention is defined as comprising the steps of:

(1) coating a first positive resist composition comprising as a base resin a polymer comprising recurring units adapted to increase alkali solubility under the action of acid and recurring units having lactone structure onto a substrate and baking to form a first resist film, exposing the first resist film to high-energy radiation, post-exposure baking, and developing the first resist film with an alkaline developer to form a first positive resist pattern including a large area pattern feature having a short side of at least 200 nm, (2) applying a resist-modifying composition comprising a basic nitrogen-containing compound having a conjugate acid pKa of at least 4 onto the first resist pattern and heating to modify the first resist pattern, and (3) coating a second positive resist composition thereon and baking to form a second resist film, exposing the second resist film to high-energy radiation, post-exposure baking, and developing the second resist film with an alkaline developer to form a second resist pattern, wherein the large area pattern feature in the first resist pattern has a film retentivity of at least 50% after the formation of the second resist pattern.

In the pattern forming process, the first positive resist pattern includes a large area positive pattern feature having a short side of at least 200 nm, the term "positive" indicating that the feature is raised over the space. To form an effective alignment pattern feature, a positive pattern feature having a large area must be included in the first positive resist pattern. The large area is desirably sized to have a short side of at least 200 nm, more desirably at least 1 µm. The first resist pattern is treated with a resist-modifying composition comprising a basic nitrogen-containing compound having a conjugate acid pKa of at least 4. By this modifying treatment, the first resist pattern is inactivated to the second resist process. Thereafter, a second positive resist composition is coated, and the second resist process is implemented to form a second resist pattern. To form an effective alignment pattern feature, the large area pattern feature in the first resist pattern should have a film retentivity of at least 50%, more preferably at least 70% after the formation of the second resist pattern. That is, the height of the large area feature after the formation of the second resist pattern is at least 50%, more preferably at least 70% of the height of the large area feature after the formation of the first resist pattern.

Resist Composition

The pattern forming process of the invention uses a chemically amplified positive resist composition for forming a first resist pattern. The first positive resist composition preferably comprises a polymer comprising recurring units adapted to undergo deprotection reaction to increase alkali solubility under the action of acid and recurring units having lactone structure as a base resin. A polymer comprising recurring units adapted to increase alkali solubility under the action of acid is essential to formulate a chemically amplified positive resist composition. On the other hand, when the base resin in the first positive resist composition contains lactone units as predominant adhesive groups, the dissolution of the first resist composition in the resist-modifying composition is minimized and therefore, the coating of the resist-modifying composition causes least damage to the first resist pattern. As compared with lactone-free base resins, the first resist pattern after modification treatment according to the invention has a lower solubility in ordinary resist solvents, typically PGMEA, and is thus difficulty soluble in the second positive resist composition. This leads to the advantage that the coating of the second resist composition causes least damage to the first resist pattern.

In a preferred embodiment, the first resist composition comprises a polymer comprising recurring units having the general formula (a) and recurring units having the general formula (b).

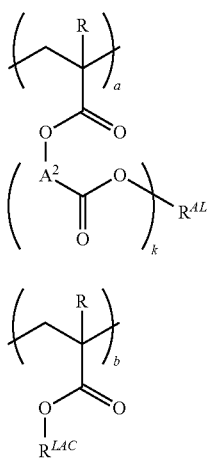

Herein R is each independently hydrogen or methyl, $A^2$ is each independently a divalent organic group, $R^{AL}$ is an acid labile group, $R^{LAC}$ is a monovalent organic group having lactone structure, k is 0, 1 or 2, "a" and "b" indicative of molar fractions of recurring units (a) and (b) in the polymer, respectively, are numbers in the range: $0<a<1.0$, $0<b<1.0$, and $0<a+b\leq1.0$.

In formula (a), $A^2$ is each independently a divalent organic group, typically alkylene. Examples include, but are not limited to, methylene, ethylene, trimethylene, propylene, tetramethylene, 2,6-norbornanelactone-3,5-diyl, and 7-oxa-2,6-norbornanelactone-3,5-diyl. R is each independently hydrogen or methyl, and k is 0, 1 or 2. The case wherein R=methyl and k=0 is preferred in that the first pattern undergoes little deformation during the modifying treatment and little damage during the second resist process. This is probably because the polymer wherein R=methyl and k=0 has a higher glass transition temperature (Tg) than other polymers, the polymer film undergoes less deformation upon heating, and the acid diffusion during the second resist process is controlled.

The acid labile group represented by $R^{AL}$ may be selected from a variety of such groups to be deprotected with the acid generated from the photoacid generator to be described later. It may be any of well-known acid labile groups commonly used in prior art resist compositions, especially chemically amplified resist compositions. Examples of the acid labile group are groups of the following general formulae (L1) to (L4), and tertiary alkyl groups of 4 to 20 carbon atoms, preferably 4 to 15 carbon atoms.

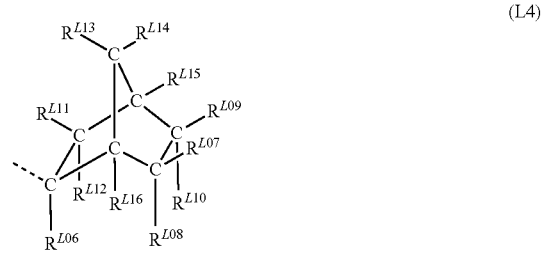

Herein, the broken line denotes a valence bond. In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, adamantyl, and adamantylmethyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

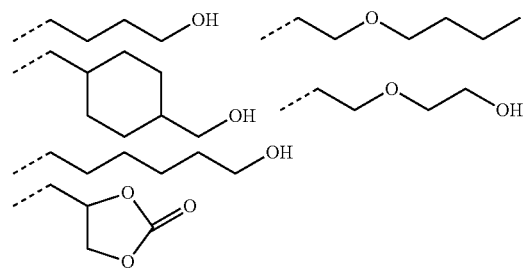

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 2-(tricyclo[5.2.1.0$^{2,6}$]decan-8-yl)propan-2-yl, 2-(tetracyclo[4.4.0.1$^{2,5}$.1$^{7,10}$]dodecan-3-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_{10}$ alkyl group or an optionally substituted $C_6$-$C_{20}$ aryl group. Examples of the optionally substituted alkyl groups include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which some methylene moieties are replaced by oxygen or sulfur atoms. Examples of optionally substituted aryl groups include phenyl, methylphenyl, naphthyl, anthryl, phenanthryl, and pyrenyl. Letter m is equal to 0 or 1, n is equal to 0, 1, 2 or 3, and 2m+n is equal to 2 or 3.

In formula (L4), $R^{L06}$ is an optionally substituted, straight, branched or cyclic $C_6$-$C_{10}$ alkyl group or an optionally substituted $C_6$-$C_{20}$ aryl group. Examples of these groups are the same as exemplified for $R^{L05}$. $R^{L07}$ to $R^{L16}$ independently represent hydrogen or monovalent hydrocarbon groups of 1 to 15 carbon atoms. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$, and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

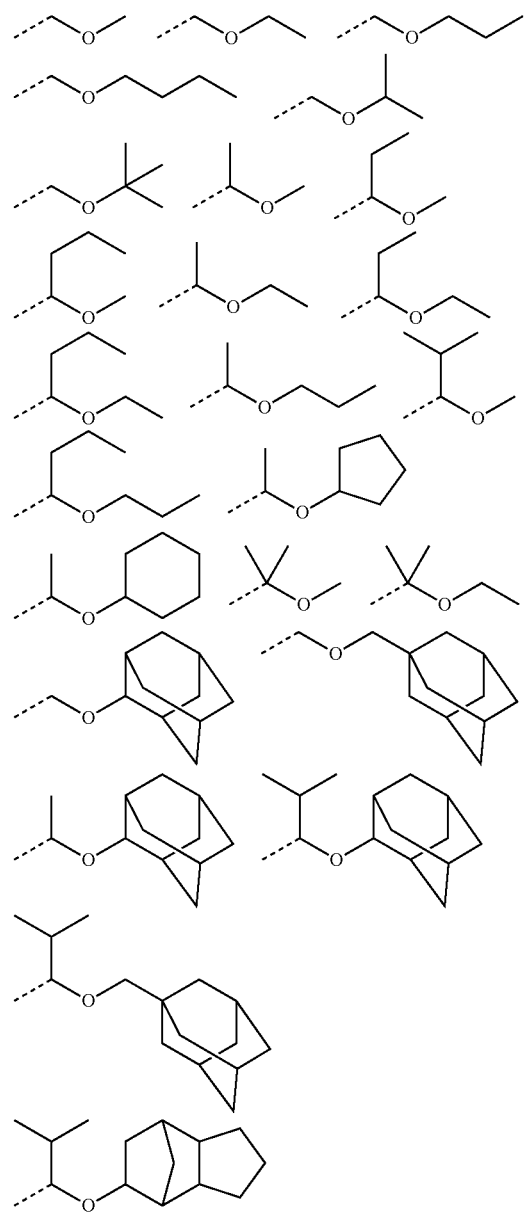

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-propylcyclopentyl, 1-isopropylcyclopentyl, 1-butylcyclopentyl, 1-sec-butylcyclopentyl, 1-cyclohexylcyclopentyl, 1-(4-methoxybutyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 1-methyl-2-cyclopentenyl, 1-ethyl-2-cyclopentenyl, 1-methyl-2-cyclohexenyl, and 1-ethyl-2-cyclohexenyl groups.

Of the acid labile groups of formula (L4), those groups of the following formulae (L4-1) to (L4-4) are preferred.

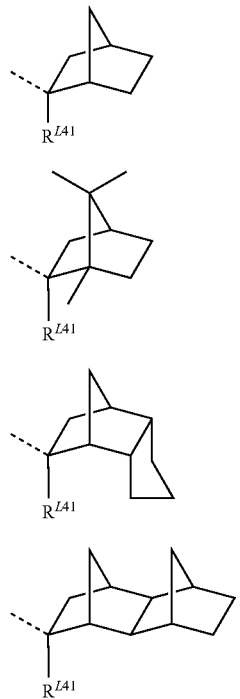

(L4-1)

(L4-2)

(L4-3)

(L4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

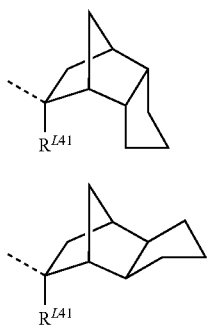

(L4-3-1)

(L4-3-2)

Similarly, the general formula (L4-4) represents one or a mixture of two or more selected from groups having the following general formulas (L4-4-1) to (L4-4-4).

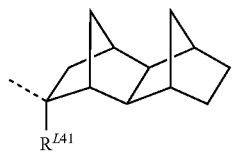

(L4-4-1)

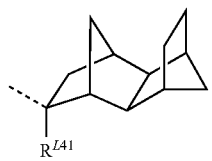

(L4-4-2)

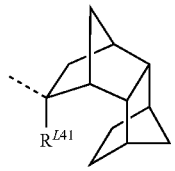

(L4-4-3)

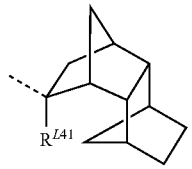

(L4-4-4)

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

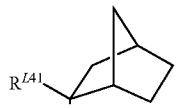

(L4-1-endo)

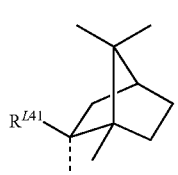

(L4-2-endo)

-continued

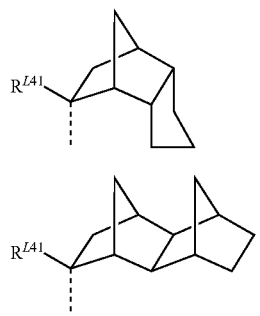
(L4-3-endo)

(L4-4-endo)

Illustrative examples of the acid labile group of formula (L4) are given below.

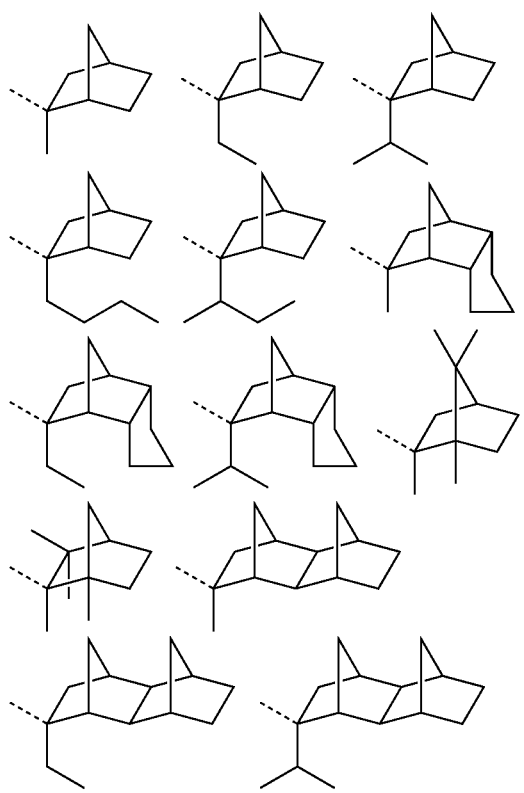

Examples of the tertiary $C_4$-$C_{20}$ alkyl groups are as exemplified for $R^{L04}$.

Preferred examples of the recurring units (a) are recurring units of the general formula (2):

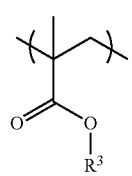

(2)

wherein $R^3$ is a branched or cyclic $C_4$-$C_{20}$ tertiary alkyl group which may have an ether group.

Illustrative examples of the recurring units of formula (2) are given below, but not limited thereto.

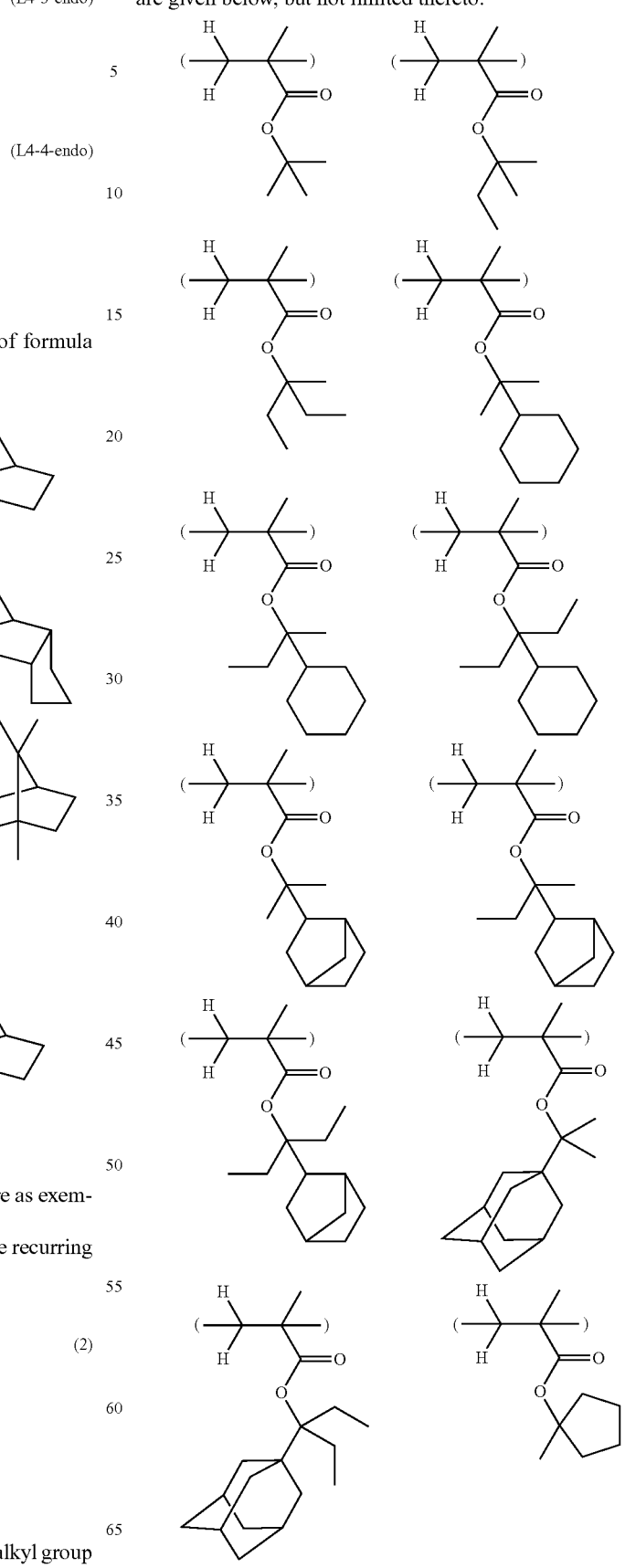

-continued
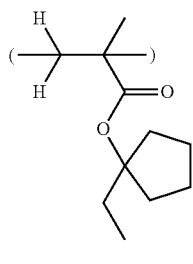 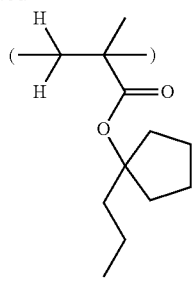
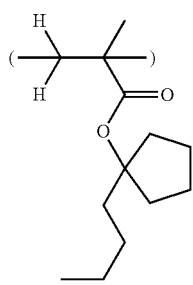 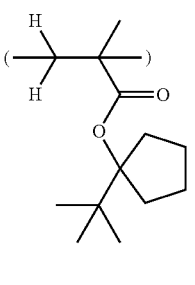
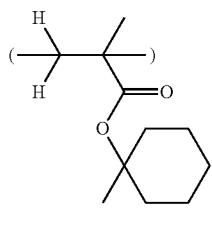 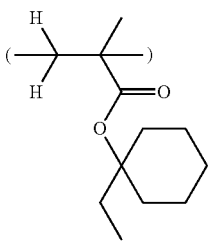
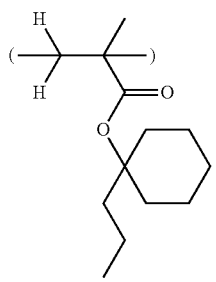 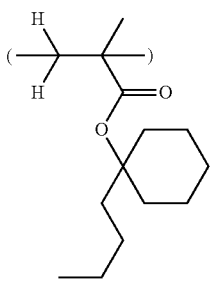
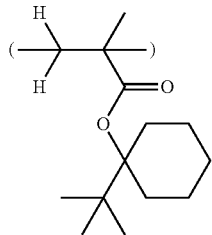 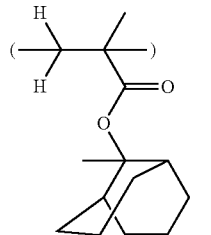
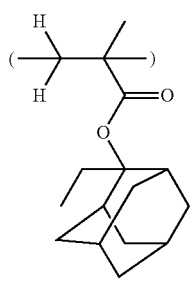 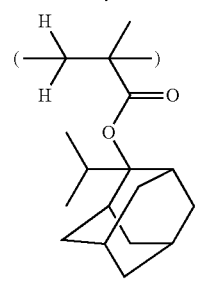
-continued
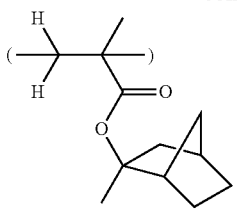 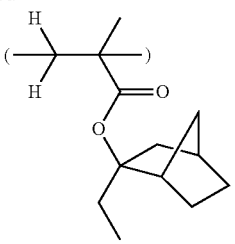
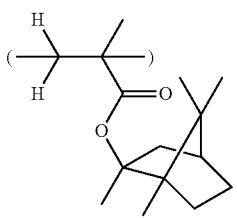 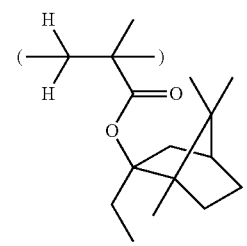
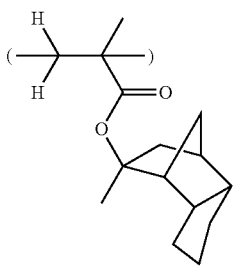 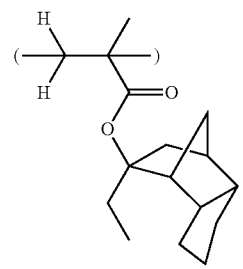
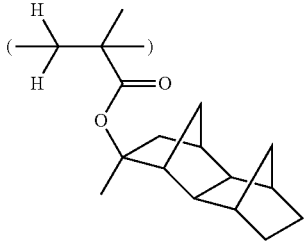
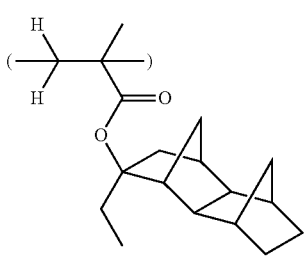 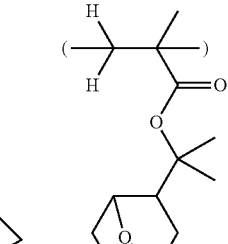
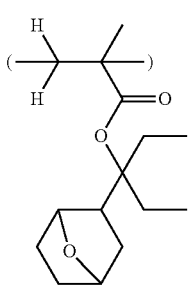 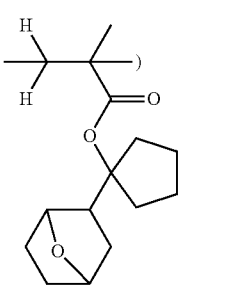

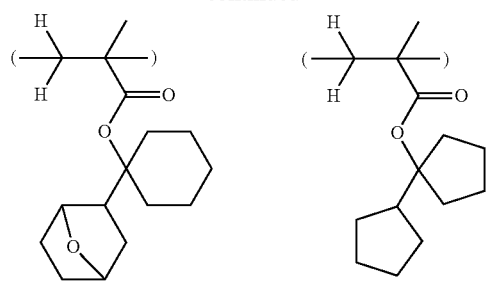
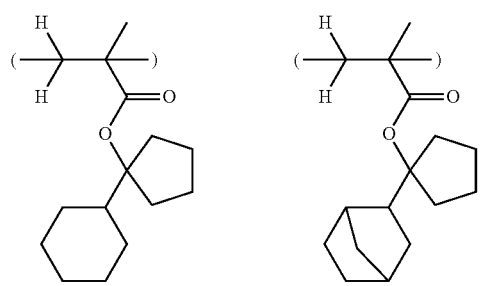
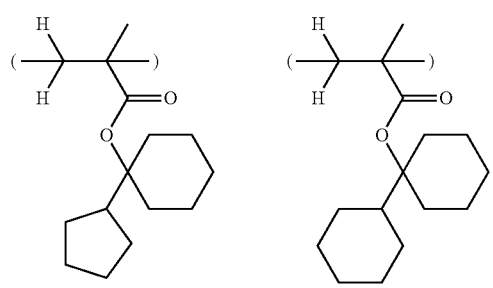
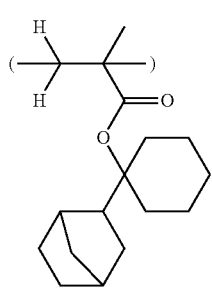 [SMILES: CCC(C)(C)C(=O)OC1(C2CC3CCC2C3)CCCCC1]
Other examples of the recurring units (a) are given below, but not limited thereto.
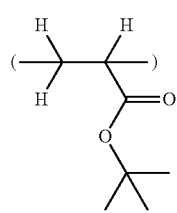
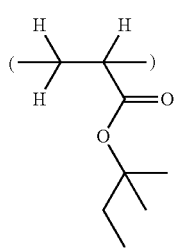
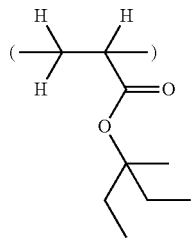
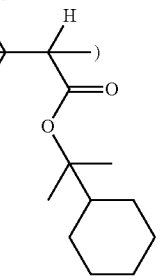
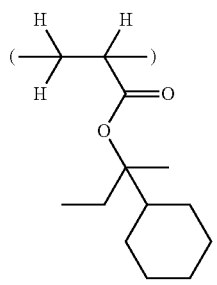
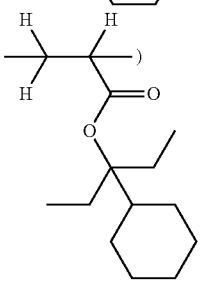
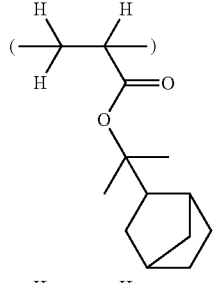
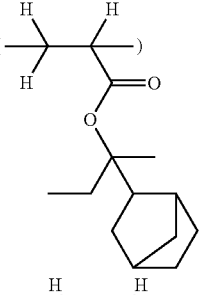
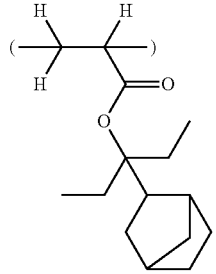
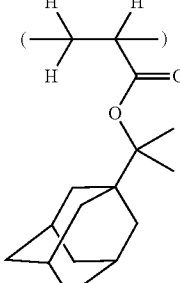
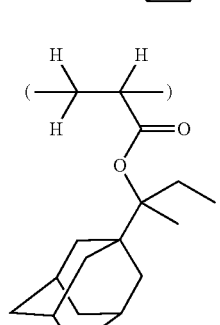
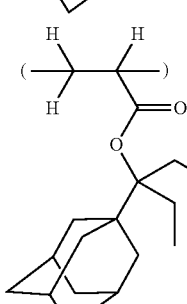
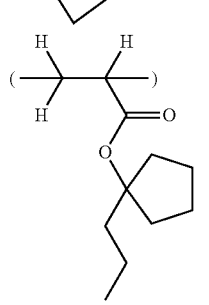
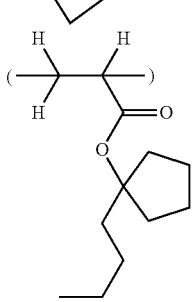

-continued
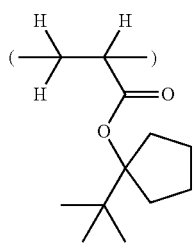 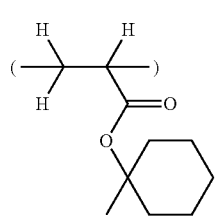 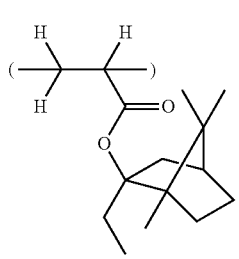 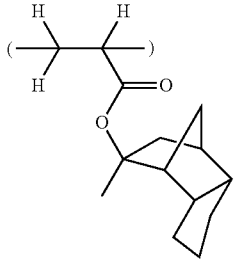
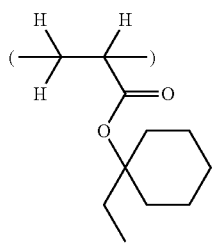 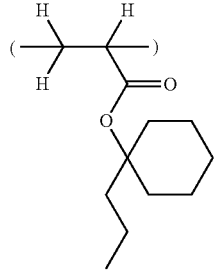 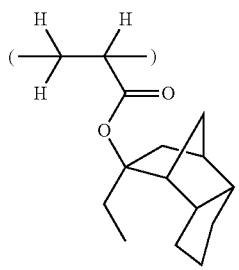 
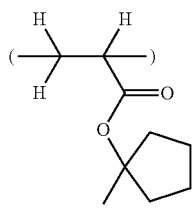 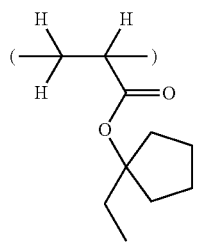 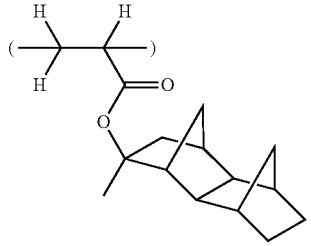
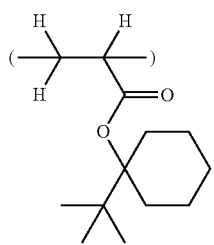 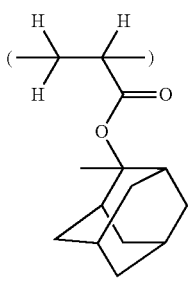 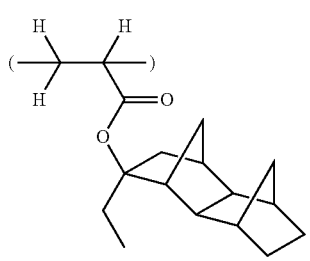 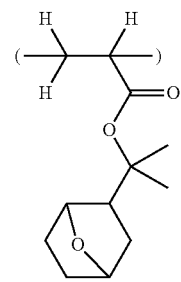
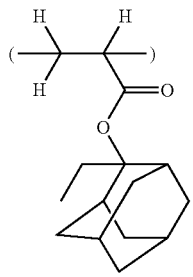 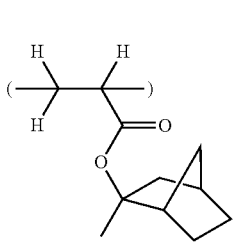 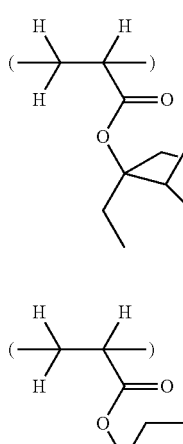
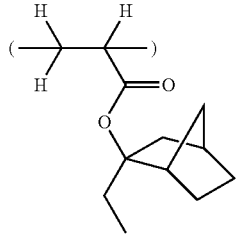 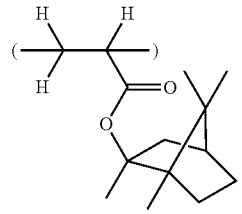 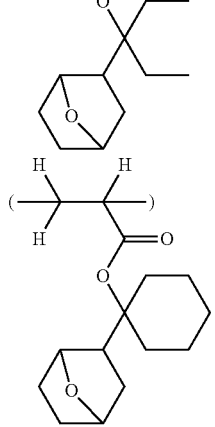 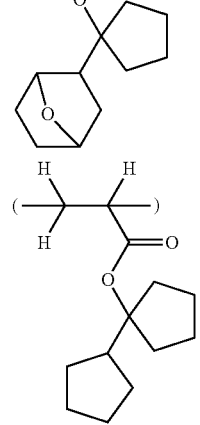

-continued
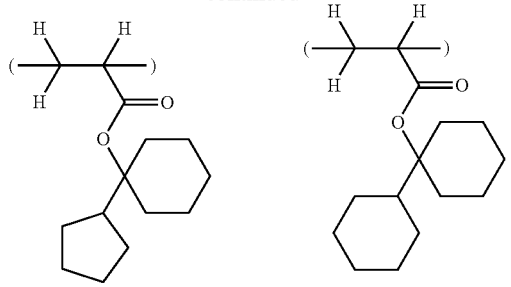
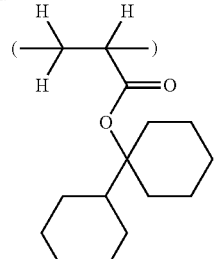
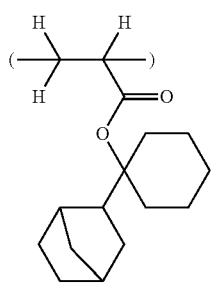
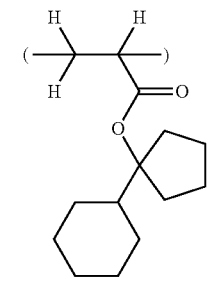
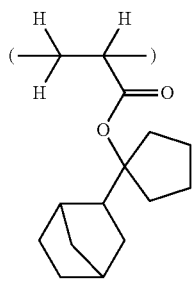
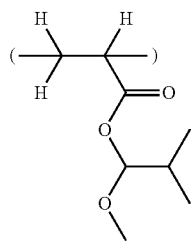
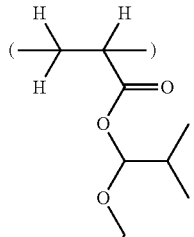
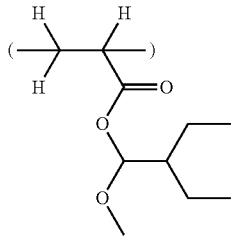
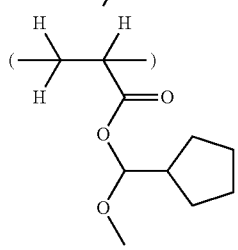
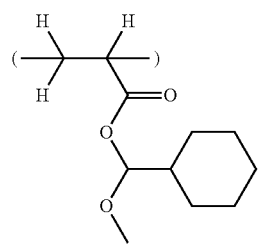
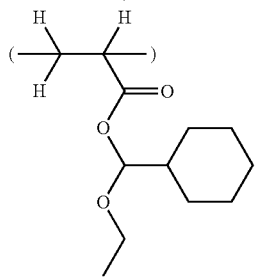
-continued
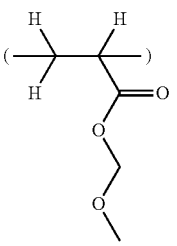
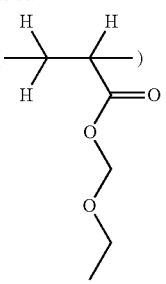
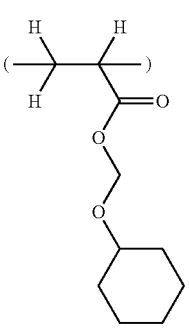
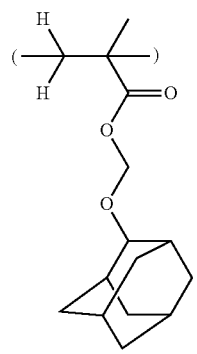
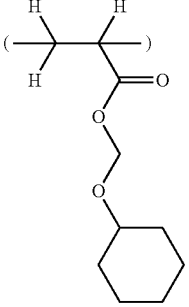
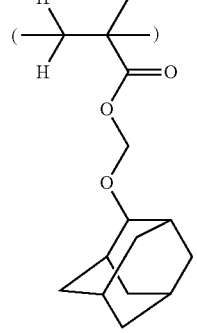
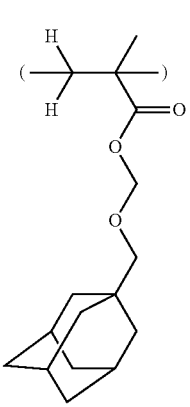
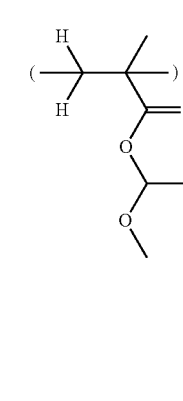
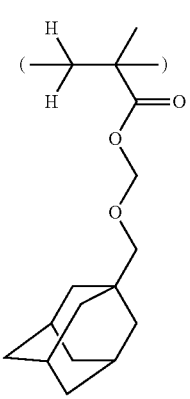
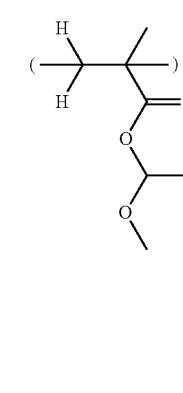
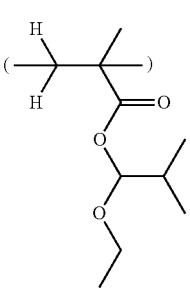
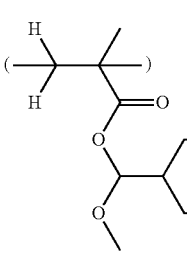
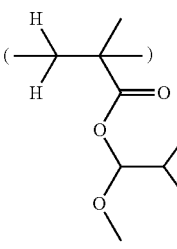
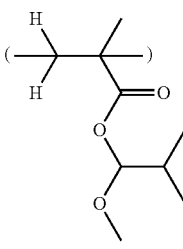

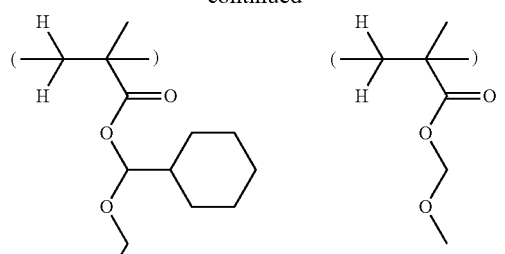
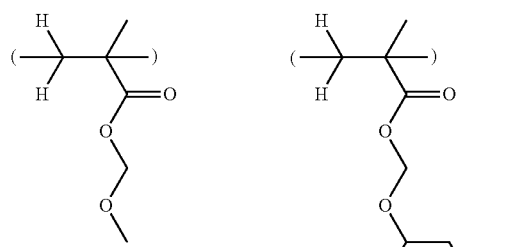
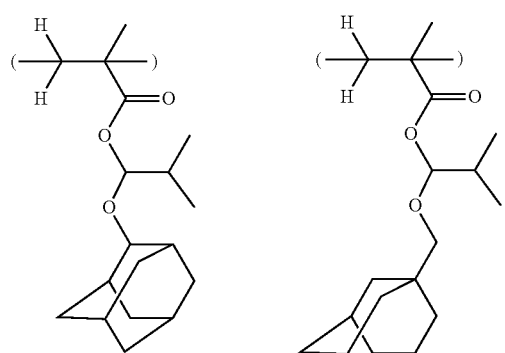
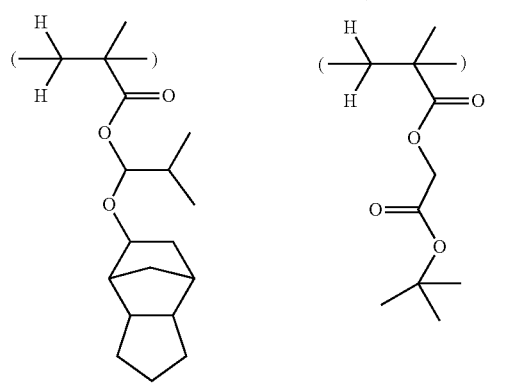
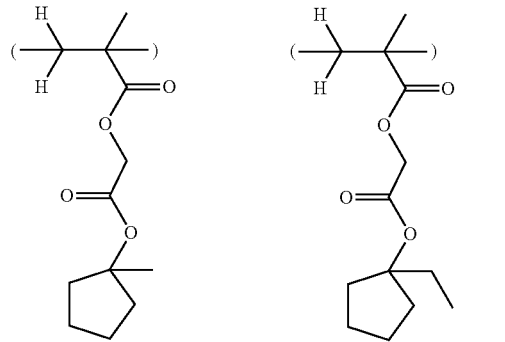
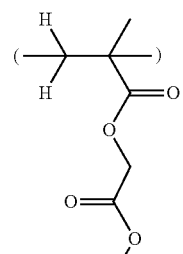
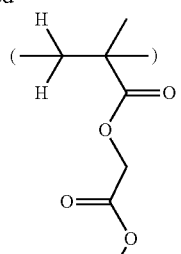
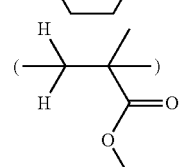
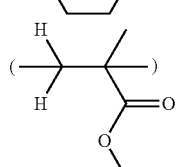
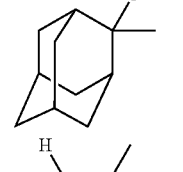
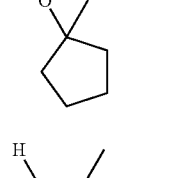
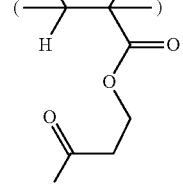
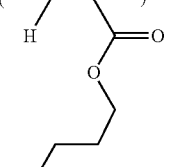
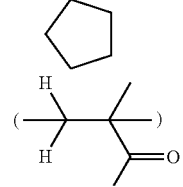
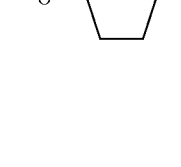
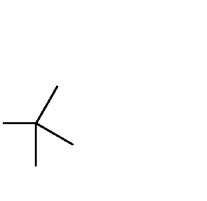

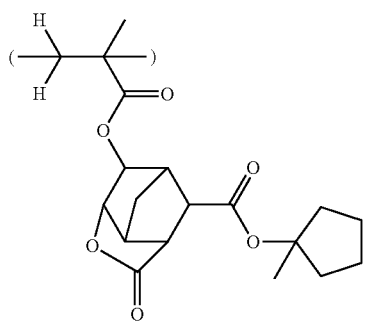
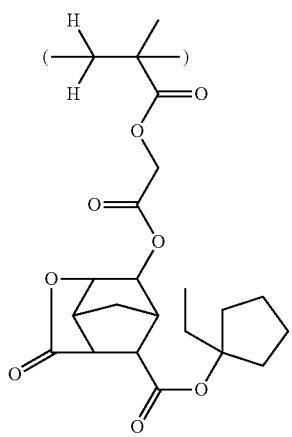
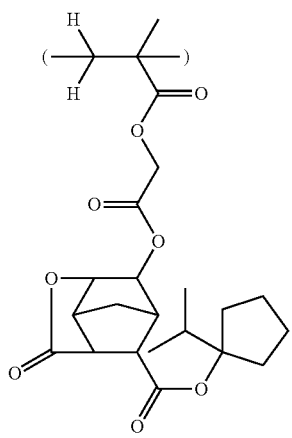
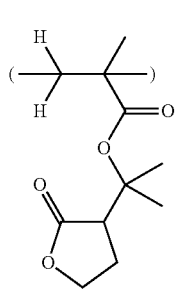
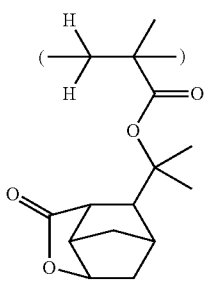
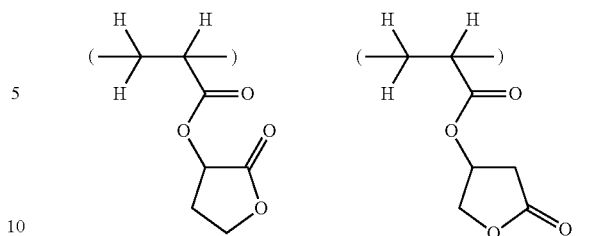
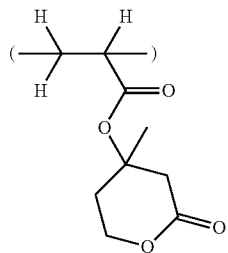
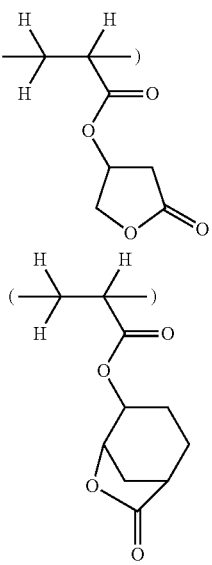
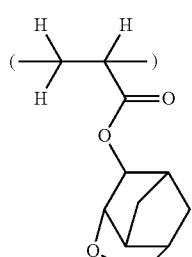
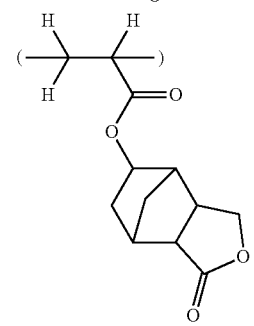
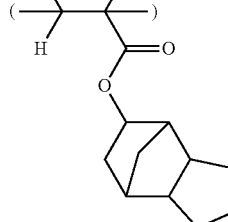
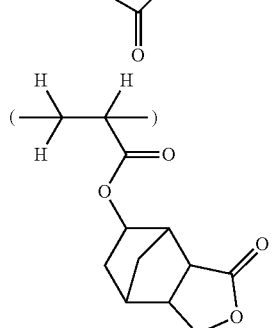
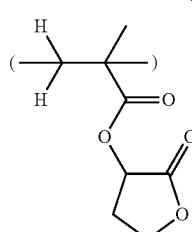
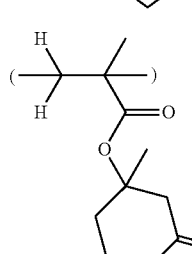
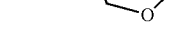
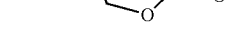
Examples of the recurring units (b) are given below, but not limited thereto.

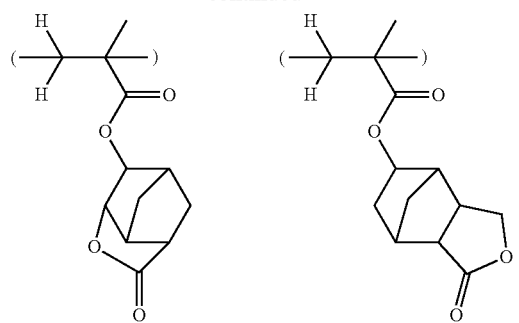
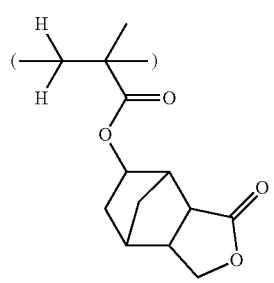
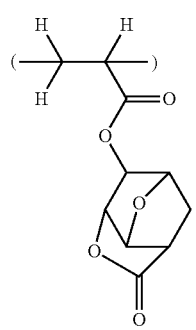
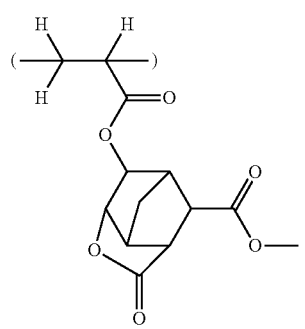
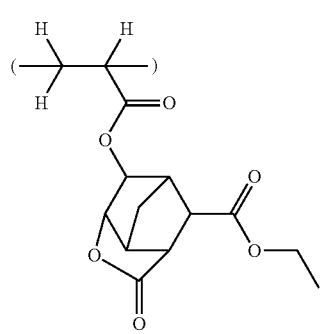
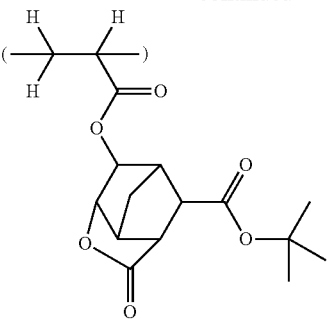
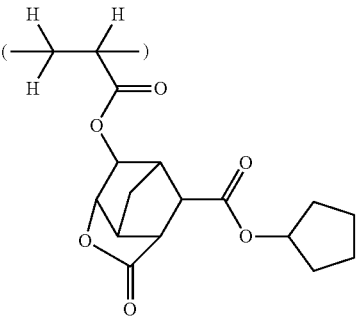
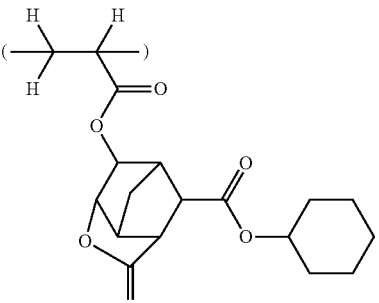
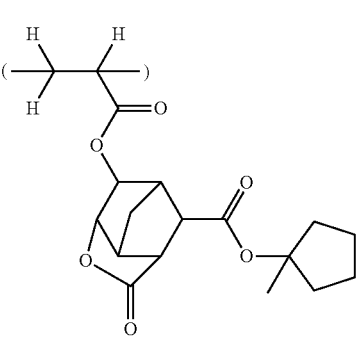
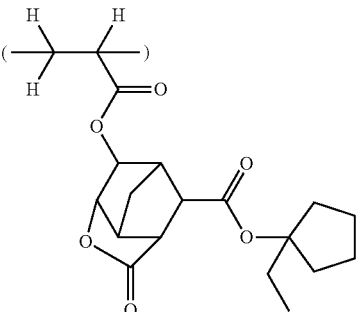

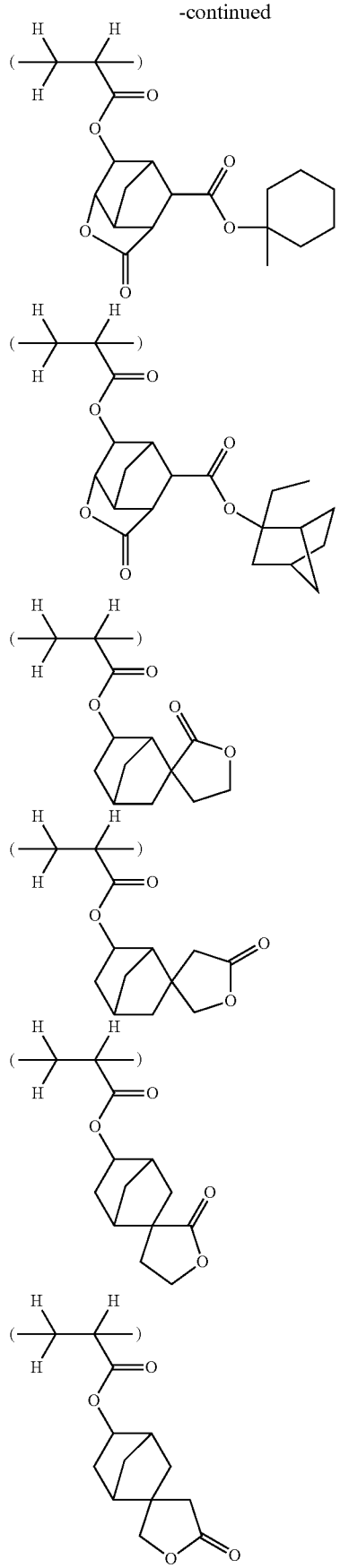
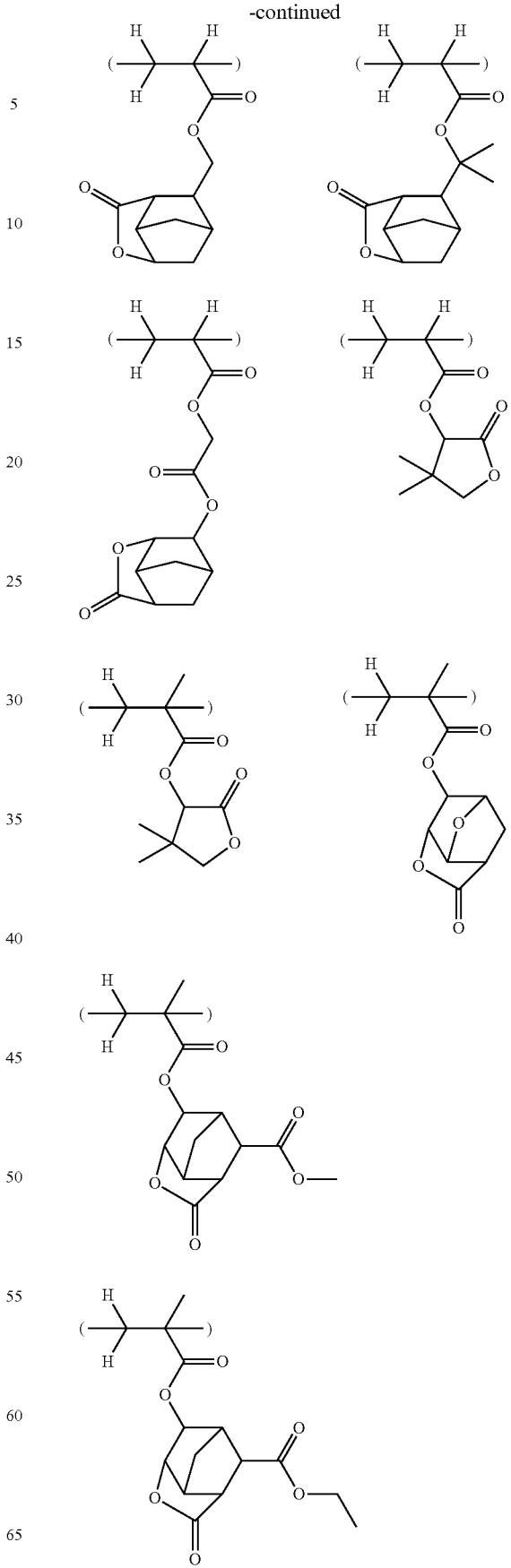

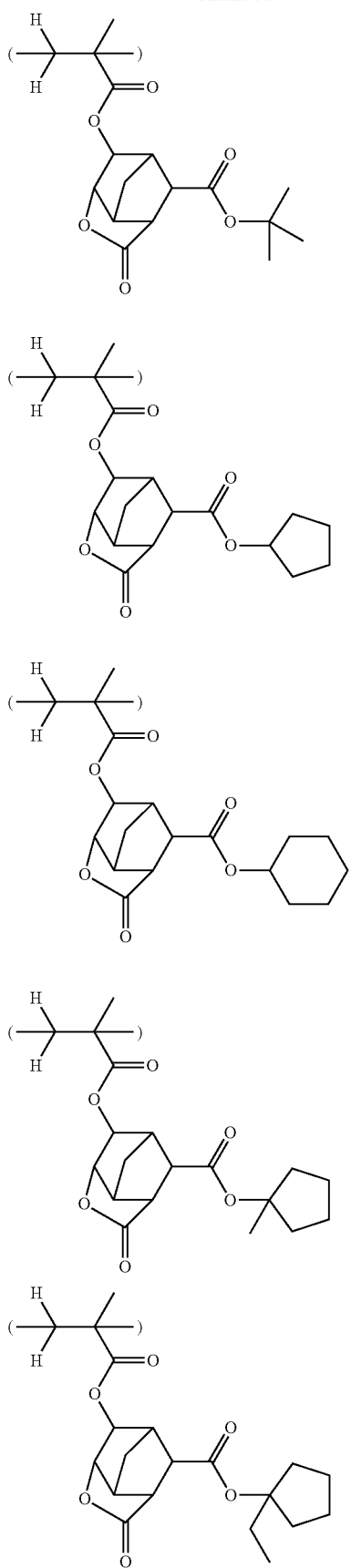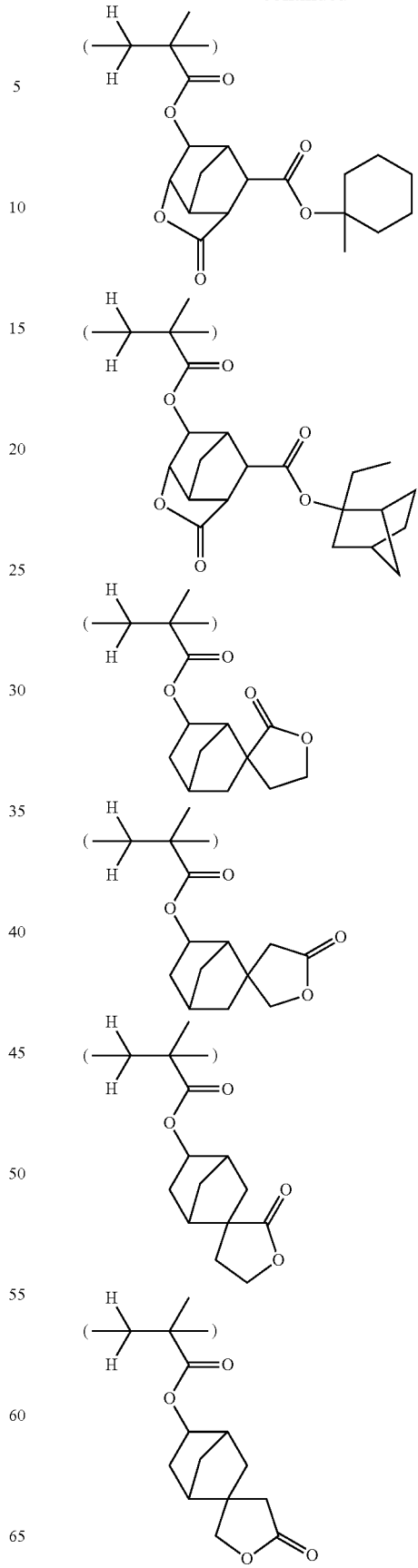

-continued

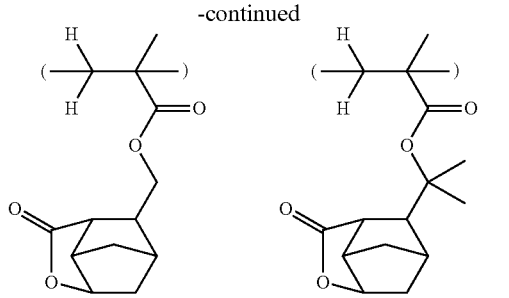

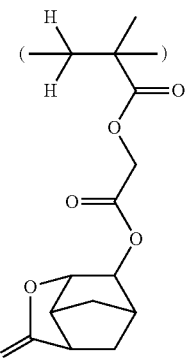

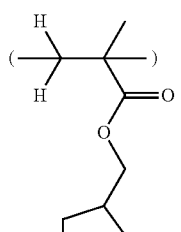

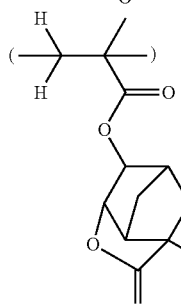

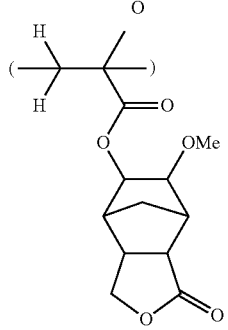

-continued

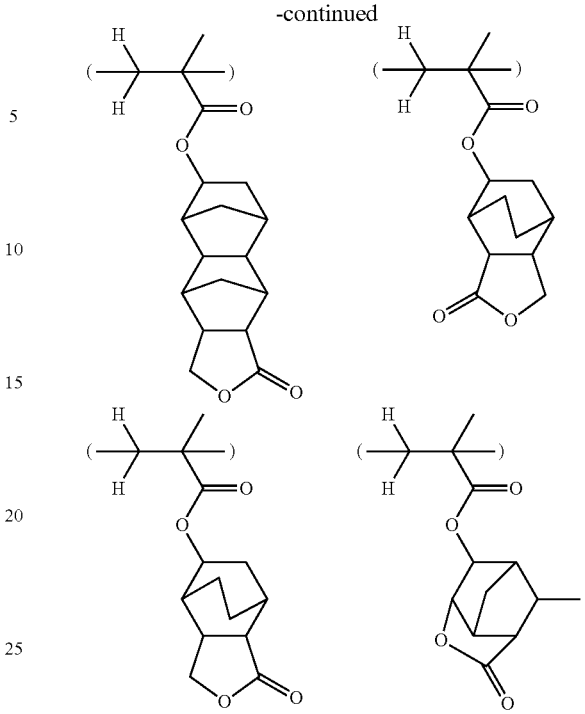

Note that Me stands for methyl.

Preferred examples of the recurring units (b) are recurring units of the general formula (3).

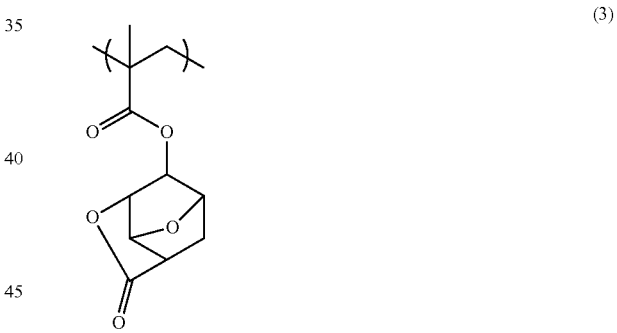

(3)

The incorporation of recurring units of formula (3) as predominant adhesive groups in the base resin in the first resist composition is very advantageous in that the first resist pattern is improved in adhesion and resolution, and the first resist pattern undergoes little deformation or damage during the modifying treatment and little damage during the second resist process.

The recurring units (a) and (b) each may be of one type or a combination of two or more types. In the polymer, the recurring units (a) and (b) are incorporated at molar fractions "a" and "b," which satisfy the range: $0<a<1.0$, $0<b<1.0$, and $0<a+b\leq1.0$, preferably $0.15<a<0.70$, $0.05<b<0.60$, and $0.2<a+b\leq1.0$. It is meant by $a+b<1.0$ that the polymer comprises other recurring units in addition to the recurring units (a) and (b). Suitable other recurring units will be described later.

The base resin used in the first positive resist composition preferably comprises recurring units having a carboxyl group in addition to the recurring units (a) and (b). If the base resin used in the first positive resist composition has carboxyl groups, this means the presence of acidic groups at the surface and in the interior of the first pattern, which promotes adsorption/mixing of the resist-modifying composition (comprising the basic nitrogen-containing compound) into the surface layer and/or the interior of the first pattern, and hence, modification of the first pattern, ensuring full retention of the first pattern. In contrast, if the base resin is free of carboxyl groups, there is a possibility in the fine size pattern section that the acid generated from the acid generator upon first exposure and the acidic functional group formed with the progress of deprotection in the base resin with the aid of the generated acid are present in the surface layer of the first pattern, and their influence extends over the neighboring fine size pattern section to promote adsorption/mixing of the resist-modifying composition; in the large area pattern feature, however, a central wide region thereof receives little light upon first exposure, so that the generation and presence of acid within the resist pattern is minimized, leading to insufficient adsorption/mixing of the resist-modifying composition. It is then often the case that the retention of the large area pattern feature in the first pattern becomes insufficient. When the base resin used in the first positive resist composition has carboxyl groups, recurring units having a carboxyl group are preferably incorporated in a proportion of 1 to 25 mol %, more preferably 3 to 15 mol % based on the entire recurring units in the base resin. Less than 1 mol % of carboxyl-containing units may achieve no incorporation effect whereas more than 25 mol % may lead to a substantial film slimming during development.

Although the recurring unit having a carboxyl group is not particularly limited in structure, recurring units of the following general formula (c) are preferred from the standpoint of availability of starting reactants.

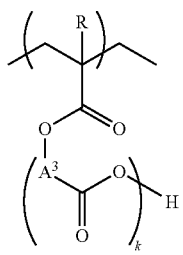

(c)

Herein $A^3$ is each independently a divalent organic group, R is hydrogen or methyl, and k is 0, 1 or 2.

In formula (c), $A^3$ is each independently a divalent organic group, typically alkylene. Examples include, but are not limited to, methylene, ethylene, trimethylene, propylene, tetramethylene, 2,6-norbornanelactone-3,5-diyl, 7-oxa-2,6-norbornanelactone-3,5-diyl, 3-oxa-4-oxohexane-1,6-diyl, and ethoxycarbonylcyclohexane-2,2'-diyl. R is hydrogen or methyl, and k is 0, 1 or 2. The recurring units of formula (c) wherein k=0 are expressed by the following formula (4) and preferred in that the first pattern tends to undergo little deformation during the modifying treatment and little damage during the second resist process. This is probably because the polymer wherein k=0 has a higher Tg than other polymers, the polymer film undergoes less deformation upon heating, and the acid diffusion during the second resist process is controlled.

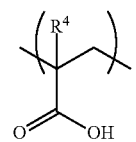

(4)

Note that $R^4$ is hydrogen or methyl.

In addition to the recurring units (a) and (b) and carboxyl-containing recurring units (c) mentioned above, the base resin used in the first positive resist composition may preferably further comprise recurring units of the general formula (5):

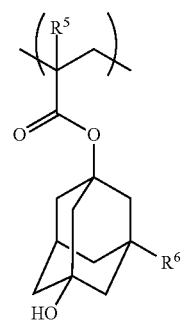

(5)

wherein $R^5$ is hydrogen or methyl and $R^6$ is hydrogen or hydroxyl.

Illustrative examples of recurring units of formula (5) are given below.

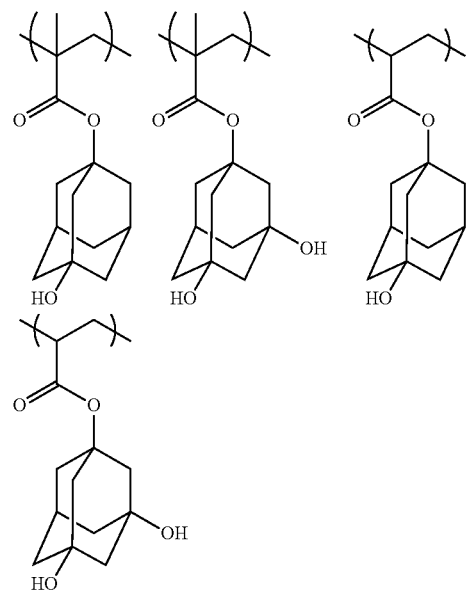

The incorporation of recurring units of formula (5) in the base resin in the first resist composition is advantageous in that the first resist pattern tends to undergo little deformation during the modifying treatment and little damage during the second resist process. Since the recurring units of formula (5) have a rigid adamantane structure having a low degree of structural freedom as a mother nucleus and a hydroxyl group capable of contributing to hydrogen bond formation between polymer molecules, the base resin having these units incorporated therein generally has an elevated Tg. Thus the polymer film undergoes less deformation upon heating, and the acid diffusion during the second resist process is controlled. As a result, the first pattern is retained satisfactorily. When the base resin in the first positive resist composition comprises recurring units of formula (5), these units are preferably incorporated in a proportion of 2 to 40 mol %, more preferably 4 to 30 mol % based on the entire recurring units in the base resin. Less than 2 mol % of units of formula (5) may achieve no incorporation effect whereas more than 40 mol % may lead to a poor resolution during the first patterning process.

The base resin in the first positive resist composition may comprise recurring units other than the foregoing. Examples of such additional units include recurring units derived from the monomers shown below, but are not limited thereto. The additional units are preferably incorporated in a proportion of 0 to 50 mol %, more preferably 0 to 40 mol % based on the entire recurring units in the base resin. When incorporated, the proportion of additional units is preferably at least 3 mol %. In the following formulae, R is hydrogen or methyl.

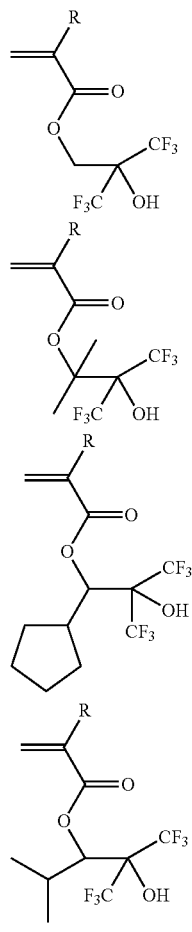
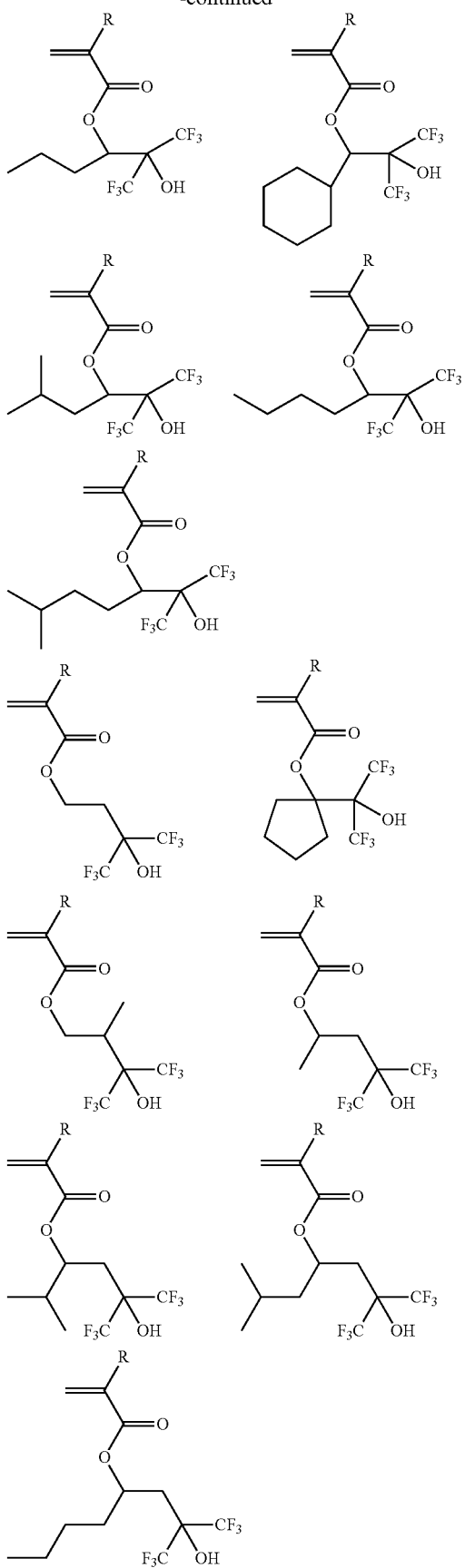

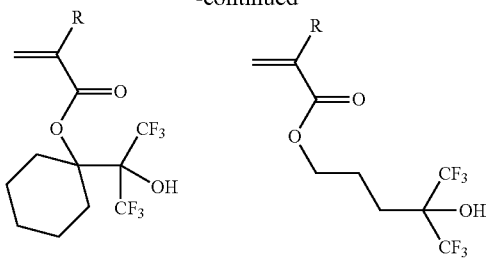
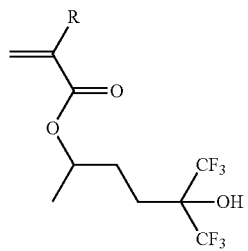
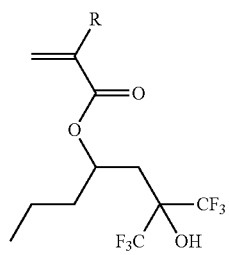
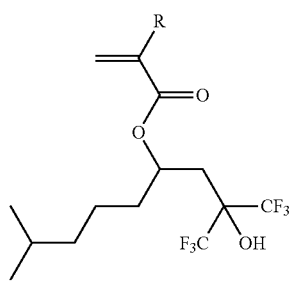
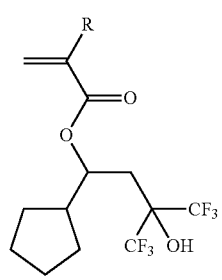
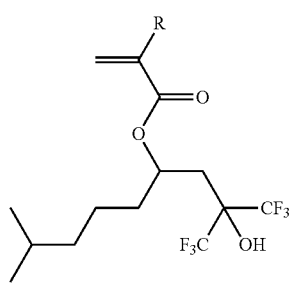
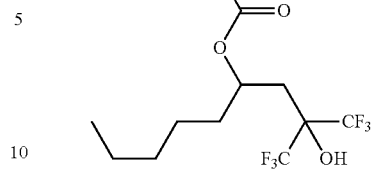
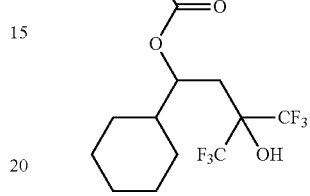
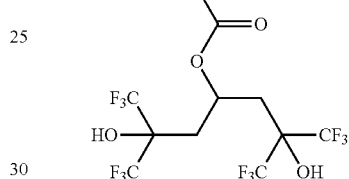
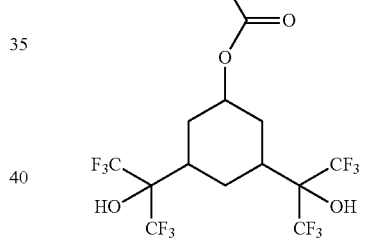
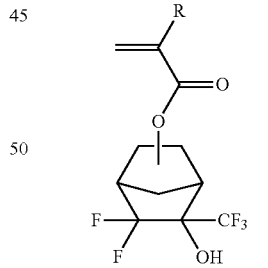
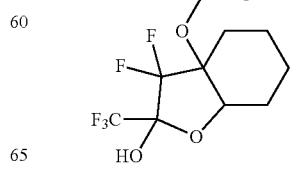
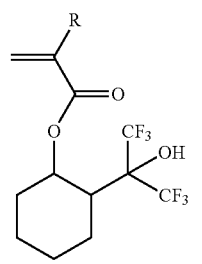
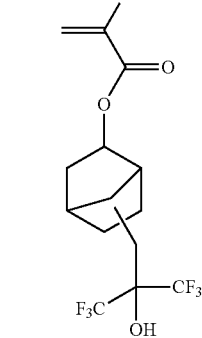
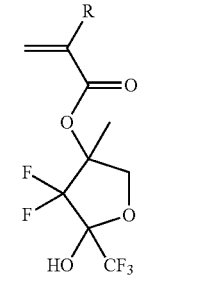
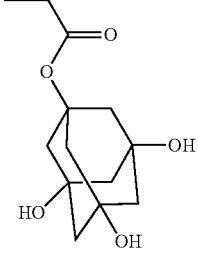

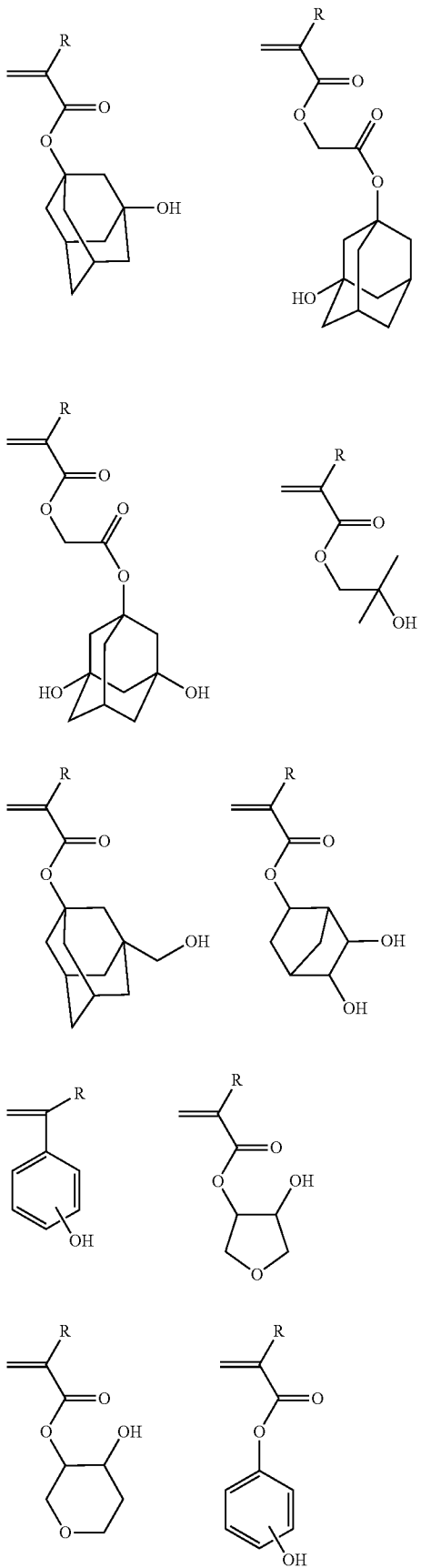
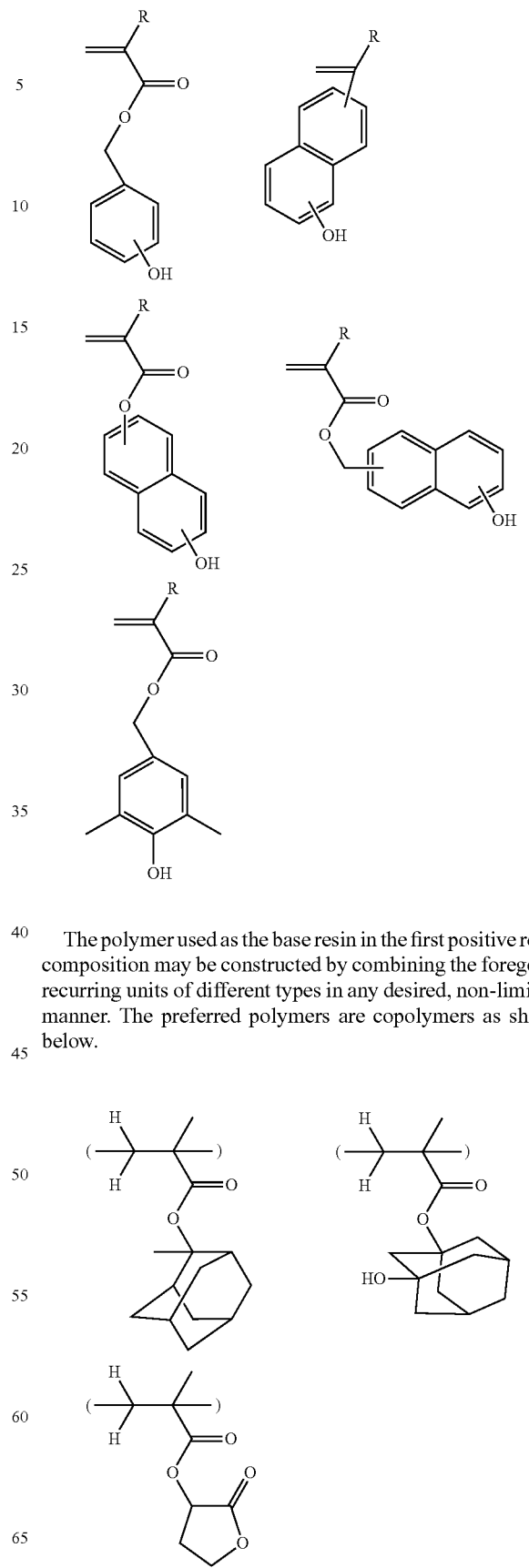
The polymer used as the base resin in the first positive resist composition may be constructed by combining the foregoing recurring units of different types in any desired, non-limiting manner. The preferred polymers are copolymers as shown below.
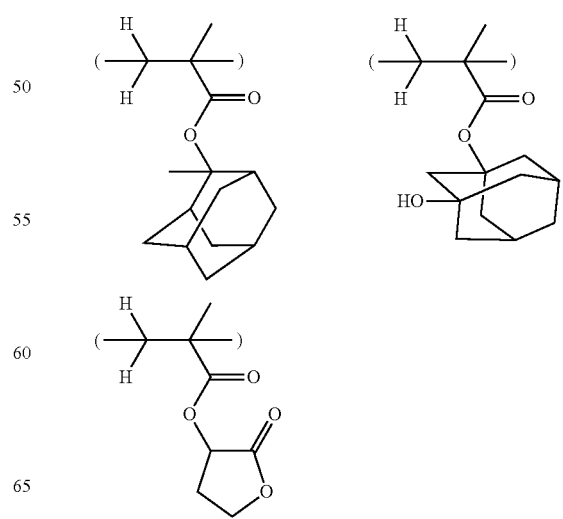

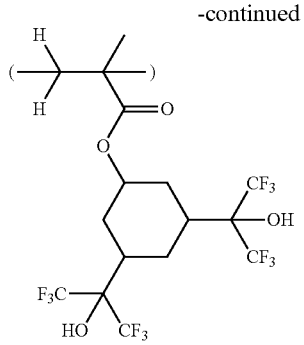
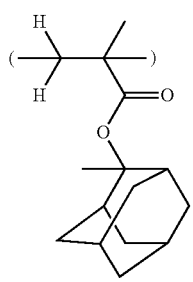
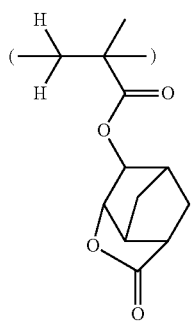
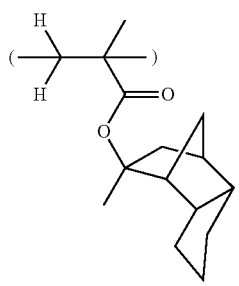
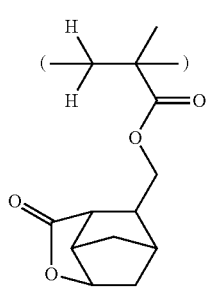
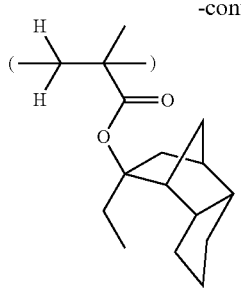
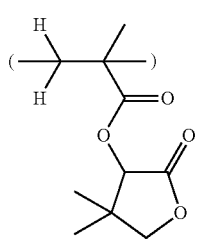
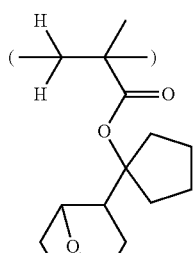
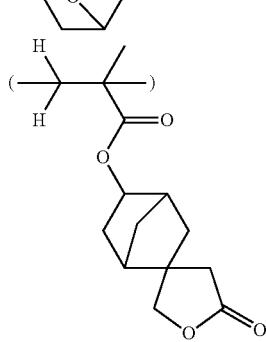
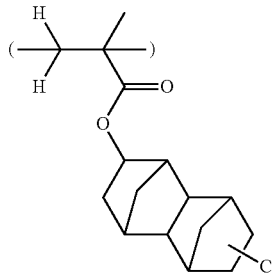
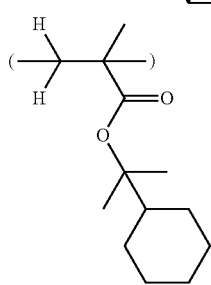
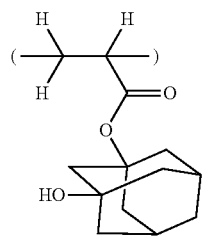

-continued

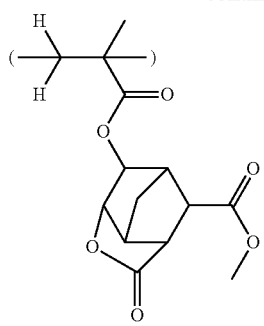

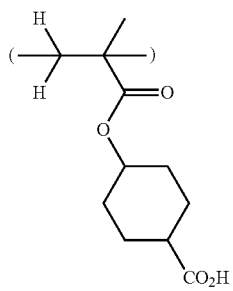

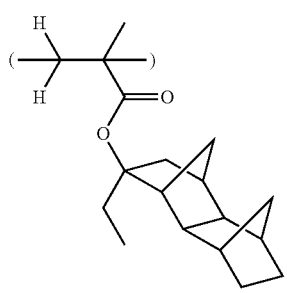

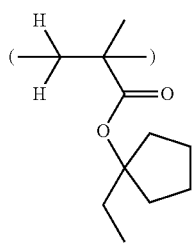

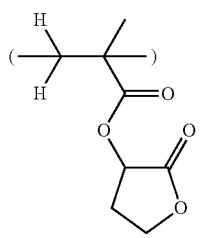

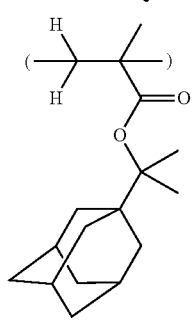

-continued

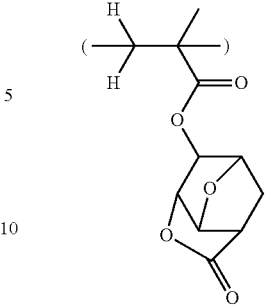 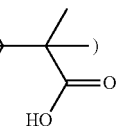

The second resist composition used in second exposure may be selected from a wide variety of well-known chemically amplified positive resist compositions as long as they have the desired lithography performance. Resist compositions meeting the following requirement are advantageously applicable. With respect to the PEB temperature, a PEB temperature of the second resist process which is lower than that of the first resist process is preferred for minimizing the damage to the first resist pattern by the second exposure and development. More preferably the difference in PEB temperature between the first and second resist processes is at least 10° C.

Specifically, the second resist composition may use the same base resin or polymer as described for the first resist composition. Acid generators and various additives may also be the same as used in the first resist composition. In accordance with the type of a particular first resist composition used, a second resist composition meeting the PEB temperature difference defined above may be selected. Although the design of the second resist composition to meet the PEB temperature difference is not particularly limited, a second resist film having a lower PEB temperature than the first resist film may be formed in accordance with the design guidelines given in comparison with the first resist composition as exemplified below. The guidelines are (1) to increase the proportion of acid labile groups in the base resin, (2) to change some or all acid labile groups in the base resin to more reactive ones, (3) to lower the glass transition temperature (Tg) of the base resin, specifically by introducing recurring units having a chain structure, by reducing or eliminating hydrogen-bondable recurring units (alcohol, carboxylic acid or the like), by introducing and increasing acrylate units, or by reducing or eliminating polycyclic recurring units, (4) to increase the amount of acid generator added, and (5) to use an acid generator having a lower molecular weight. The PEB temperature may be adjusted to optimum by a proper combination of some of these guidelines.

The polymers serving as the base resin in the first and second resist compositions used in the pattern forming process should preferably have a Mw in the range of 1,000 to 500,000, and more preferably 2,000 to 30,000, as measured by GPC using polystyrene standards. With too low a Mw, there may result a loss of resolution and insufficient retention of resist pattern due to an increased solubility of the resin in solvent. A polymer with too high a Mw may lose alkali solubility and give rise to a footing phenomenon after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 3.0, especially 1.0 to 2.0, in order to provide a resist composition suitable for micropatterning to a fine feature size. It is understood that a blend of two or more polymers which differ in compositional ratio, molecular weight or dispersity is acceptable.

The polymer used herein may be synthesized by any desired method, for example, by dissolving unsaturated bond-containing monomers from which the respective units are derived in an organic solvent, adding a polymerization initiator, typically radical polymerization initiator thereto, and effecting polymerization. Examples of the organic solvent which can be used for polymerization include toluene, benzene, tetrahydrofuran, diethyl ether, dioxane, isopropyl alcohol, 2-butanone, γ-butyrolactone, 1-methoxy-2-propyl acetate, and mixtures thereof. Examples of the radical polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 40° C. to the boiling point of the solvent for polymerization to take place. The reaction time is 1 to 100 hours, preferably 3 to 20 hours. The acid labile group that has been incorporated in the monomer may be kept as such, or the acid labile group may be once removed with an acid catalyst and thereafter protected or partially protected. The polymer serving as the base resin is not limited to one type and a mixture of two or more polymers may be added. The use of plural polymers allows for adjustment of resist properties.

The first or second positive resist composition used herein may include an acid generator in order for the composition to function as a chemically amplified positive resist composition. Typical of the acid generator used herein is a photoacid generator (PAG) capable of generating an acid in response to actinic light or radiation. It is any compound capable of generating an acid upon exposure to high-energy radiation. Suitable photoacid generators include sulfonium salts, iodonium salts, sulfonyldiazomethane, N-sulfonyloxyimide, and oxime-O-sulfonate acid generators. The acid generators may be used alone or in admixture of two or more.

Exemplary acid generators are described in U.S. Pat. No. 7,537,880 (JP-A 2008-111103, paragraphs [0122] to [0142]). The preferred acid generators include the structure of the general formula (PAG-A).

(PAG-A)

Herein Ar is a substituted or unsubstituted $C_6$-$C_{20}$ aryl group which may contain a halogen, oxygen, nitrogen or sulfur atom. $R^{PC}$ is Ar, or a straight, branched or cyclic $C_1$-$C_{20}$ alkyl group which may contain a halogen, oxygen, nitrogen or sulfur atom, or two $R^{PC}$ may bond together to form a ring of 5 to 8 carbon atoms with the sulfur atom to which they are attached at their terminus. $R^{PA}$ is a straight, branched or cyclic $C_1$-$C_{50}$ alkyl group which may contain a halogen, oxygen, nitrogen or sulfur atom, a substituted or unsubstituted $C_6$-$C_{30}$ aryl group which may contain a halogen, oxygen, nitrogen or sulfur atom, a substituted or unsubstituted $C_7$-$C_{30}$ aralkyl group which may contain a halogen, oxygen, nitrogen or sulfur atom, $C_nF_{(2n+1)}$, $R^{PA1}CO_2CH(R^{PA2})CF_2$, or $R^{PA1}OC(O)CH_2CF_2$ wherein n is an integer of 0 to 10. $R^{PA1}$ is a straight, branched or cyclic $C_1$-$C_{50}$ alkyl group which may contain a halogen, oxygen, nitrogen or sulfur atom, a substituted or unsubstituted $C_6$-$C_{30}$ aryl group which may contain a halogen, oxygen, nitrogen or sulfur atom, or a substituted or unsubstituted $C_7$-$C_{30}$ aralkyl group which may contain a halogen, oxygen, nitrogen or sulfur atom. $R^{PA2}$ is hydrogen or trifluoromethyl.

The acid generator is typically used in an amount of 0.1 to 40 parts, and preferably 1 to 30 parts by weight relative to 100 parts by weight of the base resin.

The resist composition may further comprise an organic solvent, basic compound, dissolution regulator, surfactant, and acetylene alcohol, alone or in combination.

Examples of the organic solvent added to the first and second resist compositions are described in U.S. Pat. No. 7,537,880 (JP-A 2008-111103, paragraphs [0144] to [0145]). The organic solvent used herein may be any organic solvent in which the base resin, acid generator, and other components are soluble. Illustrative, non-limiting, examples of the organic solvent include ketones such as cyclohexanone, 2-heptanone, and methyl isobutyl ketone; alcohols such as 3-methoxybutanol, 3-methyl-3-methoxybutanol, 1-methoxy-2-propanol, 1-ethoxy-2-propanol, butanol, isobutyl alcohol, 2-methylbutanol, and 3-methylbutanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use 1-ethoxy-2-propanol, PGMEA, cyclohexanone, and mixtures thereof because the acid generator is most soluble therein.

An appropriate amount of the organic solvent used is 400 to 10,000 parts, especially 500 to 8,000 parts by weight relative to 100 parts by weight of the base resin.

In the second resist composition, the organic solvents mentioned above are useful although those solvents which do not dissolve or do not substantially dissolve the first resist pattern prior to the modifying treatment are preferred in some cases in preventing the first resist pattern from being damaged upon coating of the second resist composition. Such preferred solvents are alcohols of 3 to 8 carbon atoms and ethers of 6 to 12 carbon atoms. Examples of $C_3$-$C_8$ alcohol include n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol. Examples of $C_6$-$C_{12}$ ether include methyl cyclopentyl ether, methyl cyclohexyl ether, anisole, diisopropyl ether, diisobutyl ether, diisopentyl ether, di-n-pentyl ether, methyl cyclopentyl ether, methyl cyclohexyl ether, di-n-butyl ether, di-sec-butyl ether, diisopentyl ether, di-sec-pentyl ether, di-tert-amyl ether, and di-n-hexyl ether.

For use in the first and second resist compositions, exemplary basic compounds are described in JP-A 2008-111103 (U.S. Pat. No. 7,537,880), paragraphs [0146] to [0164]. Preferred basic compounds include trialkylamines, alkanolamines, pyridines, anilines, imidazoles, benzimidazoles, and morpholines. The basic compound may be used in an amount of 0.01 to 10 parts by weight relative to 100 parts by weight of the base resin.

Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. These components may be blended in standard amounts.

Modifying Composition

The resist-modifying composition used in the pattern forming process of the invention is defined as comprising a basic nitrogen-containing compound having a conjugate acid pKa of at least 4 and a solvent. Upon patternwise exposure of the second resist film to radiation, the first resist pattern is also exposed to radiation. Even in a situation where the first resist pattern is not dissolved in the second resist composition and intermixing with the first resist pattern or dissolution of the first resist pattern during coating of the second resist composition is prevented, the acid generated in the first resist pattern upon exposure of the second resist film acts to promote deprotection reaction in the first resist pattern, resulting in the first resist pattern being dissolved away after development of the second resist film. If a basic compound is present in the first resist pattern and in excess relative to the acid generated upon second exposure, then it neutralizes the acid generated upon exposure of the second resist film, restraining deprotection reaction in the first resist pattern and eventually preventing the first resist pattern from being dissolved away during development of the second resist film. Usually, a quencher in the form of a basic compound is added to photoresist material for the purposes of increasing contrast and suppressing acid diffusion, but in a smaller amount than the acid generator. In order that a basic compound be available in a larger amount than the amount of the acid generated by the acid generator in the first resist pattern upon second exposure, it is contemplated to supply a basic compound after the first resist pattern is formed by development.

The basic nitrogen-containing compound in the resist-modifying composition is selectively adsorbed to the first resist pattern through acid-base reaction with carboxyl groups in the first resist pattern during the modifying treatment, and it acts to inactivate the acid generated from the photoacid generator present in the first pattern upon exposure of the first pattern after modification during the second patterning process, making a great contribution to the prevention of exposure damage to the first pattern during the second patterning process. Particularly when the base resin in the first resist composition has carboxyl groups, adsorption of the basic nitrogen-containing compound via acid-base reaction with carboxyl groups occurs even in the unexposed area. It is thus believed that the above-mentioned inactivation fully proceeds even in the large area pattern feature.

In the resist-modifying composition, the basic nitrogen-containing compound is preferably blended in an amount of 0.01 to 10% by weight and more preferably 0.05 to 5% by weight. Less than 0.01 wt % of the basic compound may achieve no addition effect whereas more than 10 wt % may adversely affect the applicability of the resist-modifying composition, increase pattern defects, or cause deformation of the first and second resist patterns.

Examples of the basic nitrogen-containing compound which can be used herein include primary, secondary, and tertiary aliphatic amines, mixed amines, aromatic amines, heterocyclic amines, imines, nitrogen-containing compounds with carboxyl group, nitrogen-containing compounds with sulfonyl group, nitrogen-containing compounds with hydroxyl group, nitrogen-containing compounds with hydroxyphenyl group, and alcoholic nitrogen-containing compounds. Besides, a base resin itself having nitrogen-containing basic groups may serve as a basic nitrogen-containing compound. The preferred basic compounds for inactivating acid are high basicity compounds. Since a dissociation constant (pKa) of a conjugate acid is often used as an index of basicity, the basic compounds should desirably have a pKa value of at least 4.0, more preferably at least 4.5. A basic compound with a pKa value of less than 4.0 is undesired because the large area pattern feature may be insufficiently retained.

In a more preferred embodiment, the resist-modifying composition may comprise an aminosilanol compound as the basic nitrogen-containing compound. Especially preferred is an aminosilanol compound having the general formula (S0) shown below. The aminosilanol compound of formula (S0) is believed to contribute to inactivation in that in addition to the neutralization effect of the generated acid described above, it adsorbs to or mixes with the surface of the first resist pattern upon coating of the modifying composition, and forms siloxane bonds by itself upon heating or the like, to form crosslinks, thereby modifying the first resist pattern subsurface layer to improve its solvent resistance. Particularly when the base resin in the first resist composition has carboxyl groups, adsorption of the aminosilanol via acid-base reaction with carboxyl groups occurs even in the unexposed area. It is thus believed that the above-mentioned inactivation and solvent resistance improvement due to crosslinking fully proceed even in the large area pattern feature.

(S0)

Herein $A^{S1}$ is a straight, branched or cyclic $C_2$-$C_{20}$ alkylene group, $C_6$-$C_{15}$ arylene group or $C_7$-$C_{16}$ aralkylene group which may contain a hydroxyl, ether (—O—) or amino group. $R^{S1}$ is each independently $C_1$-$C_4$ alkyl or $OR^{S2}$, wherein $R^{S2}$ is hydrogen or $C_1$-$C_6$ alkyl. $R^{S3}$ is each independently hydrogen, or a $C_1$-$C_4$ alkyl group which may contain a hydroxyl or ether group, or two $R^{S3}$ may bond together to form a ring with the nitrogen atom to which they are attached.

In formula (S0), $A^{S1}$ is a straight, branched or cyclic $C_2$-$C_{20}$ alkylene, $C_6$-$C_{15}$ arylene or $C_7$-$C_{16}$ aralkylene group optionally containing a hydroxyl, ether or amino group, examples of which include ethylene, propylene, butylene, trimethylene, tetramethylene, pentamethylene, undecamethylene, pentadecamethylene, eicosamethylene, 1,2-cyclopentylene, 1,3-cyclopentylene, 1,2-cyclohexylene, 1,3-cyclohexylene, 1,4-cyclohexylene, norbornanediyl, 2,3'-iminoethylpropyl, 4-azaundecane-1,11-diyl, 4,7-diazanonane-1,9-diyl, 2-methylpropane-1,3-diyl, 7-azaoctadecane-1,18-diyl, 1,4-phenylene, 1,3-phenylene, trimethyleneoxyphenyl, 1,2-xylylene, 1,3-xylylene, 1,4-xylylene, 2-hydroxypropane-1,3-diyl, and 3-oxapentane-1,5-diyl. $R^{S1}$ is each independently $C_1$-$C_4$ alkyl or $OR^{S2}$, examples of which include methyl, ethyl, propyl, isopropyl, butyl, s-butyl, t-butyl, isobutyl and $OR^{S2}$. $R^{S2}$ is hydrogen or $C_1$-$C_6$ alkyl, for example, hydrogen, methyl, ethyl, propyl, isopropyl, butyl, s-butyl, t-butyl, isobutyl, amyl, isoamyl, hexyl, cyclopentyl or cyclohexyl. $R^{S3}$ is each independently hydrogen, or a $C_1$-$C_4$ alkyl group which may contain a hydroxyl or ether group, for example, hydrogen, methyl, ethyl, propyl, isopropyl, butyl, s-butyl, t-butyl, isobutyl, 2-hydroxyethyl, or 2-methoxyethyl. When two $R^{s3}$ bond together to form a ring, exemplary rings include pyrrolidine, piperidine, piperazine, N-methylpiperazine, and morpholine.

Illustrative non-limiting examples of the aminosilane compound having formula (S0) are (partial) hydrolyzates of aminosilane compounds including 3-aminopropyltrimethoxysilane, 3-aminopropyltriethoxysilane, 3-aminopropyltripropoxysilane, 3-aminopropyltriisopropoxysilane, 3-aminopropyltrihydroxysilane, 2-aminoethylaminomethyltrimethoxysilane, 2-aminoethylaminomethyltriethoxysilane, 2-aminoethylaminomethyltripropoxysilane, 2-aminoethylaminomethyltrihydroxysilane, isopropylaminomethyltrimethoxysilane, 2-(2-aminoethylthio)ethyltrimethoxysilane, allyloxy-2-aminoethylaminomethyldimethylsilane, butylaminomethyltrimethoxysilane, 3-aminopropyldiethoxymethylsilane, 3-(2-aminoethylamino)propyldimethoxymethylsilane, 3-(2-aminoethylamino)propyltrimethoxysilane, 3-(2-aminoethylamino)propyltriethoxysilane, 3-(2-aminoethylamino) propyltriisopropoxysilane, piperidinomethyltrimethoxysilane, 3-(allylamino)propyltrimethoxysilane, 4-methylpiperazinomethyltrimethoxysilane, 2-(2-aminoethylthio)ethyldiethoxymethylsilane, morpholinomethyltrimethoxysilane, 4-acetylpiperazinomethyltrimethoxysilane, cyclohexylaminotrimethoxysilane, 2-piperidinoethyltrimethoxysilane, 2-morpholinoethylthiomethyltrimethoxysilane, dimethoxymethyl-2-piperidinoethylsilane, 3-morpholinopropyltrimethoxysilane, dimethoxymethyl-3-piperazinopropylsilane, 3-piperazinopropyltrimethoxysilane, 3-butylaminopropyltrimethoxysilane, 3-dimethylaminopropyldiethoxymethylsilane, 2-(2-aminoethylthio)ethyltriethoxysilane, 3-[2-(2-aminoethylamino)ethylamino]propyltrimethoxysilane, 3-phenylaminopropyltrimethoxysilane, 2-aminoethylaminomethylbenzyloxydimethylsilane, 3-(4-acetylpiperazinopropyl)trimethoxysilane, 3-(3-methylpiperidinopropyl)trimethoxysilane, 3-(4-methylpiperidinopropyl)trimethoxysilane, 3-(2-methylpiperidinopropyl) trimethoxysilane, 3-(2-morpholinoethylthiopropyl) trimethoxysilane, dimethoxymethyl-3-(4-methylpiperidinopropyl)silane, 3-cyclohexylaminopropyltrimethoxysilane, 3-benzylaminopropyltrimethoxysilane, 3-(2-piperidinoethylthiopropyl)trimethoxysilane, 3-hexamethyleneiminopropyltrimethoxysilane, 3-pyrrolidinopropyltrimethoxysilane, 3-(6-aminohexylamino)propyltrimethoxysilane, 3-(methylamino)propyltrimethoxysilane, 3-(ethylamino)-2-methylpropyltrimethoxysilane, 3-(butylamino)propyltrimethoxysilane, 3-(t-butylamino)propyltrimethoxysilane, 3-(diethylamino)propyltrimethoxysilane, 3-(cyclohexylamino)propyltrimethoxysilane, 3-anilinopropyltrimethoxysilane, 4-aminobutyltrimethoxysilane, 11-aminoundecyltrimethoxysilane, 11-aminoundecyltriethoxysilane, 11-(2-aminoethylamino)undecyltrimethoxysilane, p-aminophenyltrimethoxysilane, m-aminophenyltrimethoxysilane, 3-(m-aminophenoxy)propyltrimethoxysilane, 2-(2-pyridyl)ethyltrimethoxysilane, 2-[(2-aminoethylamino)methylphenyl]ethyltrimethoxysilane, diethylaminomethyltriethoxysilane, 3-[(3-acryloyloxy-2-hydroxypropyl)amino]propyltriethoxysilane, 3-(ethylamino)-2-methylpropyl(methyldiethoxysilane), and 3-[bis(hydroxyethyl)amino]propyltriethoxysilane. If (partial) hydrolysis of an aminosilane compound is carried out by premixing the aminosilane compound with water, then the aminosilanol compound may be prepared as aqueous solution. Alternatively, hydrolysis may be carried out by adding an aminosilane compound and water during preparation of the resist-modifying composition. From the standpoints of storage stability and defects, it is sometimes advantageous to previously prepare an aminosilanol compound in aqueous solution. It is noted that if an aminosilane compound is used without (partial) hydrolysis, that is, in the substantial absence of silanol, this is inadequate to the pattern forming process of the invention because no crosslinking by siloxane bond formation between silanol groups is expectable, and inactivation and solvent resistance improvement by modification of the first resist pattern subsurface layer are insufficient.

The aminosilanol compounds of formula (S0) may be used alone or in admixture of two or more. They may also be used in the form of (partial) hydrolytic condensates.

Suitable aminosilanol compounds of formula (S0) further include reaction products of an oxirane-containing silane compound with an amine compound, as represented by the general formula (S1).

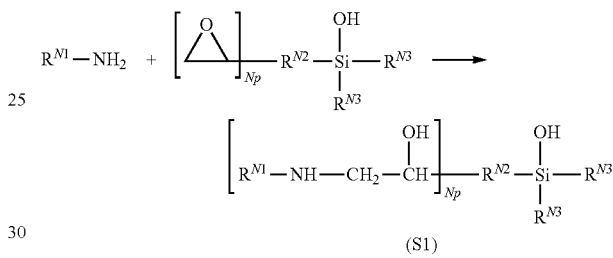

(S1)

Herein $R^{N1}$ is hydrogen, or a straight, branched or cyclic $C_1$-$C_{20}$ alkyl, $C_6$-$C_{10}$ aryl or $C_2$-$C_{12}$ alkenyl group which may have a hydroxyl, ether (—O—), ester (—COO—) or amino group. The subscript Np is 1 or 2. When Np is 1, $R^{N2}$ is a straight, branched or cyclic $C_1$-$C_{20}$ alkylene group which may have an ether, ester or phenylene group. When Np is 2, $R^{N2}$ is the alkylene group with one carbon-bonded hydrogen atom being eliminated. $R^{N3}$ is each independently hydrogen, or a $C_1$-$C_6$ alkyl, $C_6$-$C_{10}$ aryl, $C_2$-$C_{12}$ alkenyl, $C_1$-$C_6$ alkoxy, $C_6$-$C_{10}$ aryloxy, $C_2$-$C_{12}$ alkenyloxy, $C_7$-$C_{12}$ aralkyloxy or hydroxyl group, at least one of $R^{N3}$ being alkoxy or hydroxyl.

Desired among the amine compounds are primary and secondary amine compounds. Suitable primary amine compounds include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, ethanolamine, N-hydroxyethylethylamine, and N-hydroxypropylethylamine. Suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

On use, the aminosilanol compound may be blended with another silane compound. For example, blending of an aminosilanol with an oxirane-containing silane is possible. When an aminosilanol of formula (S0') wherein one $R^{N6}$ is hydrogen (i.e., aminosilane having a secondary amino group) or wherein two $R^{N6}$ are hydrogen atoms (i.e., aminosilane having a primary amino group) is mixed with an oxirane-containing silane, a silane compound having the general formula (S2) forms according to the following reaction scheme and adsorbs to the resist surface.

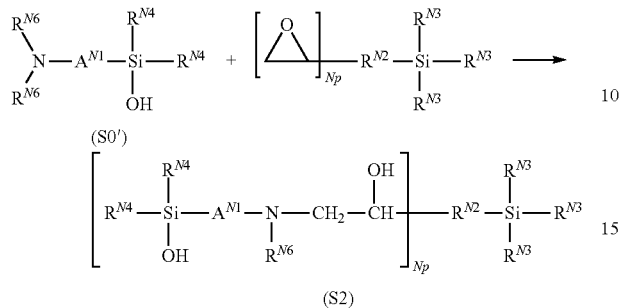

(S0')

(S2)

Herein $A^{N1}$ is a straight, branched or cyclic $C_2$-$C_{20}$ alkylene group, $C_6$-$C_{15}$ arylene group or $C_7$-$C_{16}$ aralkylene group which may contain a hydroxyl, ether or amino group. $R^{N4}$ is each independently $C_1$-$C_4$ alkyl or $OR^{N5}$, wherein $R^{N5}$ is hydrogen or $C_1$-$C_6$ alkyl. $R^{N6}$ is each independently hydrogen, or a $C_1$-$C_4$ alkyl group which may contain a hydroxyl or ether group. The subscript Np is 1 or 2. When Np is 1, $R^{N2}$ is a straight, branched or cyclic $C_1$-$C_{20}$ alkylene group which may have an ether, ester or phenylene group. When Np is 2, $R^{N2}$ is the alkylene group with one carbon-bonded hydrogen atom being eliminated. $R^{N3}$ is each independently hydrogen, or a $C_1$-$C_6$ alkyl, $C_6$-$C_{10}$ aryl, $C_2$-$C_{12}$ alkenyl, $C_1$-$C_6$ alkoxy, $C_6$-$C_{10}$ aryloxy, $C_2$-$C_{12}$ alkenyloxy, $C_7$-$C_{12}$ aralkyloxy or hydroxyl group, at least one of $R^{N3}$ being alkoxy or hydroxyl.

An oxetane-containing silane compound may be used instead of the oxirane-containing silane compound. Examples of suitable oxirane and oxetane-containing silane compounds used herein are shown below.

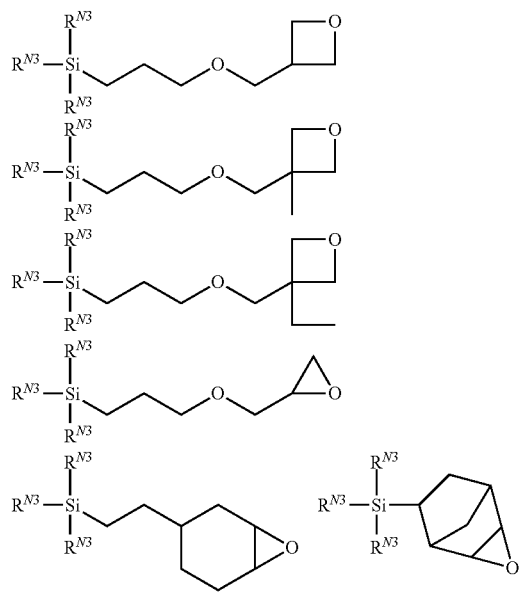

Herein $R^{N3}$ is as defined above.

In the resist-modifying composition, the aminosilanol compound is preferably blended in an amount of 0.01 to 10% by weight and more preferably 0.05 to 5% by weight. Less than 0.01 wt % of the aminosilanol compound may achieve no addition effect whereas more than 10 wt % may adversely affect the applicability of the resist-modifying composition or increase pattern defects.

In another preferred embodiment, the resist-modifying composition may comprise an oxazoline compound as the basic nitrogen-containing compound. The preferred oxazoline compound has the general formula (Ox):

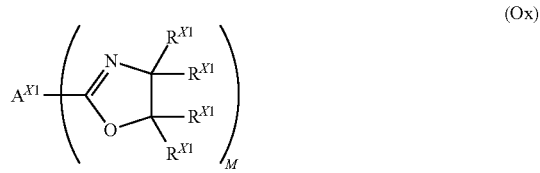

(Ox)

wherein M is an integer of 1 to 6, $A^{X1}$ is hydrogen, a single bond, an M-valent acyclic or cyclic $C_1$-$C_{20}$ hydrocarbon group or an M-valent $C_6$-$C_{15}$ aromatic group, and $R^{X1}$ is each independently hydrogen or methyl.

In formula (Ox), M is an integer of 1 to 6, with M=2 being most preferred. $A^{X1}$ is hydrogen, a single bond, an M-valent $C_1$-$C_{20}$ hydrocarbon group or an M-valent $C_6$-$C_{15}$ aromatic group. Examples of the M-valent $C_1$-$C_{20}$ hydrocarbon group include such hydrocarbons with M hydrogen atoms being eliminated, as methane, ethane, propane, butane, isobutane, pentane, isopentane, neopentane, cyclopentane, hexane, cyclohexane, methylcyclohexane, dimethylcyclohexane, norbornane, methylnorbornane, decalin, adamantane, decane, pentadecane, and dimethanodecahydronaphthalene. Examples of the M-valent $C_6$-$C_{15}$ aromatic group include such hydrocarbons with M hydrogen atoms being eliminated, as benzene, toluene, xylene, mesitylene, cumene, naphthalene, biphenyl, anthracene, and phenanthrene. Preferably $A^{X1}$ is a single bond, ethylene, 1,3-phenylene or 1,4-phenylene. $R^{X1}$ is each independently hydrogen or methyl, and preferably hydrogen.

Illustrative non-limiting examples of the oxazoline compound of formula (Ox) include oxazoline, 2-methyloxazoline, 2,2'-bis(2-oxazoline), 2,2'-ethylenebis(2-oxazoline), 2,2'-(1,3-phenylene)bis(2-oxazoline), and 2,2'-(1,4-phenylene)bis(2-oxazoline).

The oxazoline compound of formula (Ox) is a basic compound which is effective for neutralizing the acid generated upon exposure of the second resist film. Also the oxazoline compound of formula (Ox) can bond with a carboxyl group irreversibly under the action of heat or acid, as shown in the scheme below.

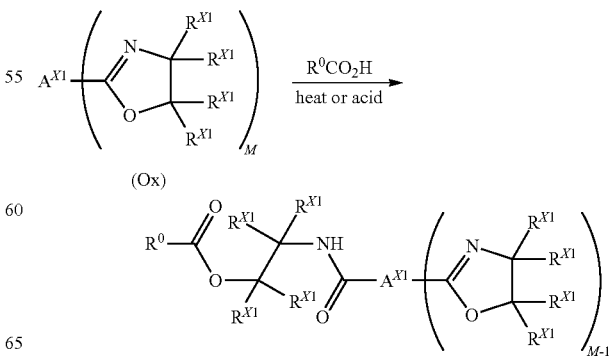

(Herein R⁰ stands for the backbone of the base resin in the first resist composition, M, $A^{X1}$ and $R^{X1}$ are as defined above.) Where M is equal to or greater than 2, the oxazoline compound can bond with a plurality of carboxyl groups in the first resist pattern to form crosslinks between polymer molecules, whereby the polymer may be converted into a higher molecular weight one and hence, improved in solvent resistance. In this way, advantageously the oxazoline compound makes a more contribution to sufficient inactivation of the first resist pattern. Particularly when the base resin in the first resist composition has carboxyl groups, not only bond formation, but also adsorption of the oxazoline via acid-base reaction with carboxyl groups occur even in the unexposed area. It is thus believed that the above-mentioned inactivation and solvent resistance improvement due to crosslinking fully proceed even in the large area pattern feature.

In the resist-modifying composition, the oxazoline compound is preferably blended in an amount of 0.01 to 10% by weight and more preferably 0.05 to 5% by weight. Less than 0.01 wt % of the oxazoline compound may achieve no addition effect whereas more than 10 wt % may adversely affect the applicability of the resist-modifying composition or increase pattern defects.

In a further preferred embodiment, the resist-modifying composition may comprise a basic base resin comprising recurring units having a basic functional group as the basic nitrogen-containing compound. A choice of an appropriate base resin often facilitates uniform coating of the resist-modifying composition onto the first resist pattern, and subsequent removal of the excess resist-modifying composition. In particular, the basic base resin is effective for neutralizing the acid generated upon second exposure, contributing to inactivation of the first pattern. The preferred base resin used herein is a polymer comprising recurring units of the general formula (1).

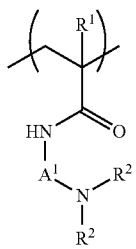
(1)

Herein $A^1$ is a straight, branched or cyclic $C_2$-$C_8$ alkylene group which may contain an ether group, $R^1$ is hydrogen or methyl, and $R^2$ is each independently a $C_1$-$C_4$ alkyl group or two $R^2$ may bond together to form a heterocyclic ring of 4 or 5 carbon atoms with the nitrogen atom to which they are attached.

The tertiary amine structure in the recurring unit of formula (1), which has a high basicity, is believed to contribute to selective adsorption of the base resin (in the resist-modifying composition) to the first resist pattern through acid-base reaction with acidic groups (typically carboxyl groups) present in the first resist pattern subsurface layer. Additionally, the tertiary amine structure acts to inactivate the acid generated from the photoacid generator present in the first pattern upon exposure of the first pattern after modification, during the second patterning process, making a great contribution to the prevention of exposure damage to the first pattern during the second patterning process. On the other hand, the recurring unit of formula (1) also contains a highly polar, highly hydrophilic secondary amide structure, which reduces the affinity of the base resin in the resist-modifying composition and the first resist pattern as modified to ordinary resist solvents such as PGMEA, and is thus effective for preventing solvent damages during coating of the second resist composition. In addition, it is desired from the standpoints of controlling deformation and reducing defects of the first pattern that the excess resist-modifying composition left after the modifying treatment of the first resist pattern be completely removed by washing with water or developer. In this regard, the inclusion of a highly hydrophilic secondary amide structure is believed to improve the water solubility of the base resin to facilitate its removal by washing. Particularly when the base resin in the first resist composition has carboxyl groups, adsorption of the basic base resin via acid-base reaction with carboxyl groups occurs even in the unexposed area. It is thus believed that inactivation and solvent resistance improvement fully proceed even in the large area pattern feature in accordance with the mechanism contemplated above.

Examples of the recurring unit of formula (1) include the recurring units shown below, but are not limited thereto. Herein $R^1$ is hydrogen or methyl.

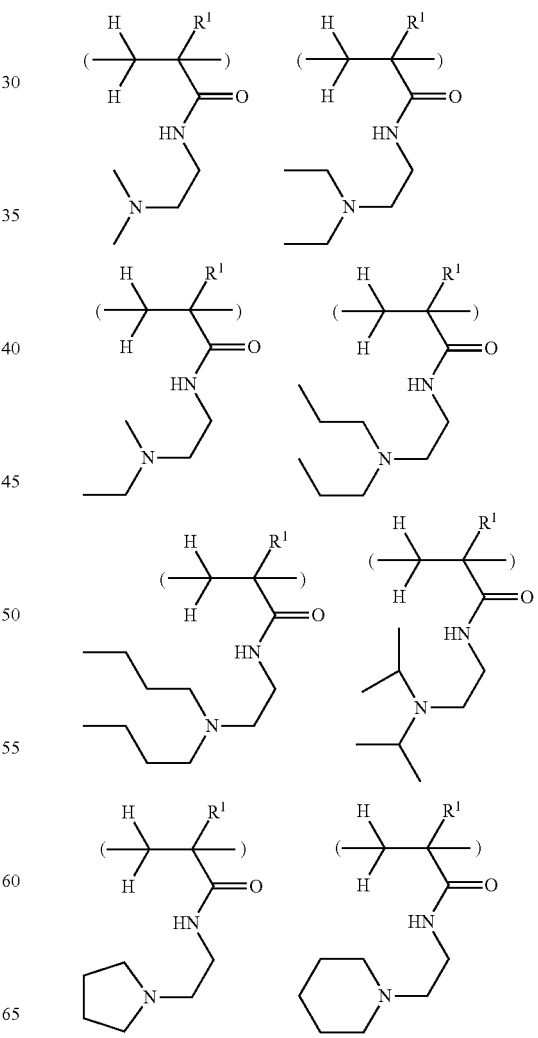

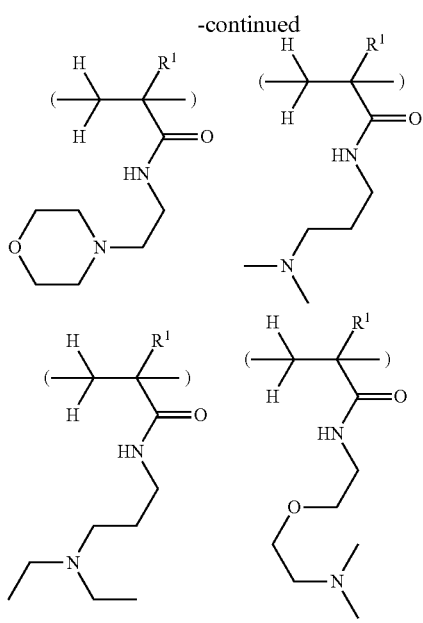

In the resist-modifying composition, the base resin having a basic functional group preferably comprises recurring units of the general formula (6) in addition to the recurring units of formula (1).

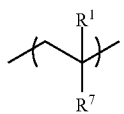

(6)

Herein $R^1$ is hydrogen or methyl, and $R^7$ is a $C_6$-$C_{15}$ aryl group, $C_3$-$C_{10}$ heteroaryl group or $C_4$-$C_6$ lactam group.

In formula (6), $R^1$ is hydrogen or methyl. $R^7$ is a $C_6$-$C_{15}$ aryl group, $C_3$-$C_{10}$ heteroaryl group or $C_4$-$C_6$ lactam group. Examples of the $C_6$-$C_{15}$ aryl group include phenyl, tolyl, xylyl, naphthyl, anthranyl, 3-hydroxyphenyl, 4-hydroxyphenyl, 4-methoxyphenyl, 4-acetoxyphenyl, 4-t-butoxyphenyl, 4-carboxyphenyl, 4-sulfophenyl, 2-[2,2,2-trifluoro-1-hydroxy-1-(trifluoromethyl)ethyl]phenyl, 3-[2,2,2-trifluoro-1-hydroxy-1-(trifluoromethyl)ethyl]phenyl, 4-[2,2,2-trifluoro-1-hydroxy-1-(trifluoromethyl)ethyl]phenyl, and 3,5-bis[2,2,2-trifluoro-1-hydroxy-1-(trifluoromethyl)-ethyl]phenyl. Examples of the $C_3$-$C_{10}$ heteroaryl group include 1-imidazolyl, 2-oxazolinyl, 2-furyl, 2-thienyl, 1-pyrrolyl, 2-pyridyl, 4-pyridyl, and 2-quinolyl. Examples of the $C_4$-$C_6$ lactam group include 2-oxo-1-piperidinyl, 2-oxopiperidino, and 2-oxo-1-azacycloheptyl. Most preferably $R^7$ is a $C_4$-$C_6$ lactam group.

Advantageously the incorporation of recurring units of formula (6) as well as recurring units of formula (1) into the base resin having a basic functional group in the resist-modifying composition permits the base resin to be adjusted as appropriate for a particular application with respect to such properties as organic solvent solubility, hydrophilicity, water solubility, basicity, affinity to first resist pattern, and coating efficiency. Preferably the recurring units of formula (1) are incorporated in a molar fraction of 10 to 100%, more preferably 30 to 90%, and the recurring units of formula (6) are incorporated in a molar fraction of 0 to 90%, more preferably 10 to 70%, based on the entire recurring units of the base resin in the resist-modifying composition.

In addition to the recurring units of formulae (1) and (6), the base resin having a basic functional group in the resist-modifying composition may comprise other recurring units. The other recurring units which can be incorporated into the base resin are not particularly limited as long as they are copolymerizable with the recurring units of formulae (1) and (6). Inter alia, vinyl monomers, acrylic monomers and methacrylic monomers are readily polymerizable and preferred. Illustrative examples of the other recurring units are shown below wherein $R^1$ is hydrogen or methyl.

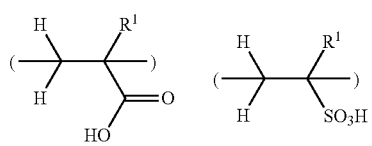

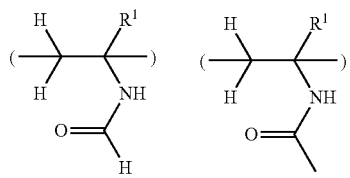

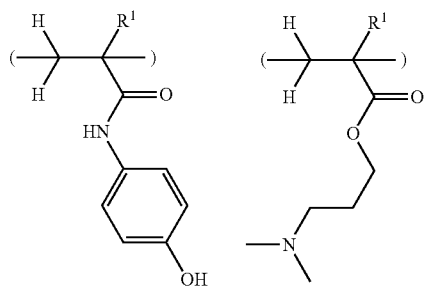

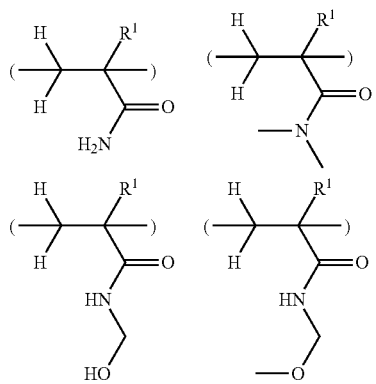

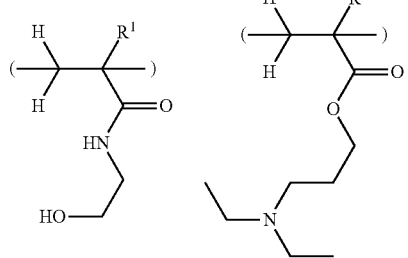

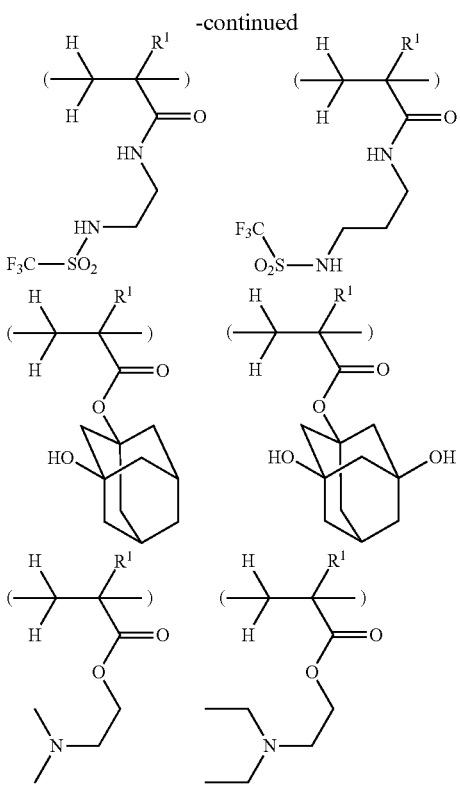

Preferably the other recurring units are incorporated in a molar fraction of 0 to 90%, more preferably 0 to 60%, based on the entire recurring units of the base resin in the resist-modifying composition.

The base resin in the resist-modifying composition should preferably have a Mw in the range of 1,000 to 500,000, and more preferably 2,000 to 100,000, as measured by GPC using polymethyl methacrylate standards. With too low a Mw, the first pattern may be dissolved or deformed during coating of the resist-modifying composition, resulting in insufficient retention of the first pattern. If Mw is too high, the excess base resin may be left after the modifying treatment, leading to deformation and defect formation in the first pattern.

In the embodiment wherein the resist-modifying composition contains a basic nitrogen-containing compound such as a compound of formula (S0) or (Ox), a base resin free of recurring units having a basic functional group such as formula (1) may be used. The base resin used herein includes the above-mentioned examples of the base resin comprising recurring units of formula (1), with the recurring units of formula (1) being excluded.

The polymer used as the base resin in the resist-modifying composition may be synthesized by any standard methods. For example, a polymer may be obtained by dissolving unsaturated bond-containing monomers from which the respective units are derived in an organic solvent, adding a polymerization initiator, typically radical polymerization initiator thereto, and effecting polymerization. Polymerization in a solventless system is also possible. Examples of the organic solvent which can be used for polymerization include toluene, benzene, tetrahydrofuran, diethyl ether, dioxane, 2-butanone, γ-butyrolactone, 1-methoxy-2-propyl acetate, water, $C_1$-$C_8$ alkanols, and mixtures thereof. Examples of the radical polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, lauroyl peroxide, and hydrogen peroxide. Preferably the system is heated at 40° C. to the boiling point of the solvent for polymerization to take place. The reaction time is 1 to 100 hours, preferably 3 to 20 hours. Instead of the polymerization initiator, polymerization may be triggered by light irradiation. The polymer serving as the base resin is not limited to one type and a mixture of two or more polymers may be added. The use of plural polymers allows for adjustment of properties of the resist-modifying composition.

The solvent used in the resist-modifying composition is preferably an aqueous alcohol solvent. As used herein, the "aqueous alcohol solvent" encompasses alkanols of 3 to 8 carbon atoms and solvent mixtures containing the majority (specifically, at least 50 wt %) of alkanols of 3 to 8 carbon atoms. The solvent used in the resist-modifying composition should have the nature that it does not substantially dissolve the first resist pattern. From this aspect, the solvent is preferably selected from alkanols of 1 to 8 carbon atoms, ethers of 6 to 12 carbon atoms, alkanes, alkenes and aromatic hydrocarbons of 6 to 16 carbon atoms, and water. The solvent used in the resist-modifying composition should also have the nature that the base resin is fully dissolvable therein to form a resist-modifying solution suited for uniform coating. From this aspect, $C_3$-$C_8$ alkanols are preferred among others. The $C_3$-$C_8$ alkanols may be used alone or as a solvent mixture containing the majority of such alkanol. When a solvent mixture is used, the solvents which can be mixed with the $C_3$-$C_8$ alkanols include $C_1$-$C_2$ alkanols, $C_6$-$C_{12}$ ethers, $C_6$-$C_{16}$ alkanes, alkenes, and aromatic hydrocarbons, and water. Notably the use of water as a main solvent is sometimes undesirable from problems of coating and storage stability (e.g., growth of bacteria).

Suitable alkanols of 3 to 8 carbon atoms include n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol. Exemplary $C_1$-$C_2$ alkanols are methanol and ethanol. Suitable ethers of 6 to 12 carbon atoms include methyl cyclopentyl ether, methyl cyclohexyl ether, anisole, diisopropyl ether, diisobutyl ether, diisopentyl ether, di-n-pentyl ether, methyl cyclopentyl ether, methyl cyclohexyl ether, di-n-butyl ether, di-sec-butyl ether, diisopentyl ether, di-sec-pentyl ether, di-tert-amyl ether, and di-n-hexyl ether. Suitable alkanes of 6 to 16 carbon atoms include hexane, octane, decane, cyclohexane, cycloheptane, cyclooctane, cyclodecane, methylcyclohexane, dimethylcyclohexane, methyladamantane, dimethyladamantane, decahydronaphthalene. Suitable aromatic hydrocarbons include benzene, toluene and xylene. Of these, preferred are isobutyl alcohol, 2-methyl-1-butanol, 3-methyl-1-butanol, butanol, and solvent mixtures based on any of the foregoing.

The solvent may be preferably used in an amount of 1,000 to 100,000 parts, and more preferably 2,000 to 50,000 parts by weight relative to 100 parts by weight of the solids in the resist-modifying composition.

In a more preferred embodiment, the resist-modifying composition may comprise a crosslinker as well as the aforementioned components. The addition of a crosslinker may improve solvent resistance or the like. When the crosslinker is added to the resist-modifying composition, the crosslinker contributes to the retention of the first resist pattern in that it adsorbs to or mixes with the first resist pattern during the modifying treatment and undergoes crosslinking reaction mainly with the base resin in the first resist film upon heating or the like, thereby converting the first resist pattern subsurface layer to a higher molecular weight to improve its solvent resistance.

The crosslinker used herein is preferably a nitrogen-containing crosslinker. The nitrogen-containing crosslinker is not particularly limited and may be selected from a wide variety of well-known crosslinkers. Suitable crosslinkers include melamine, glycoluril, benzoguanamine, urea, β-hydroxyalkylamide, isocyanurate, aziridine, amine, and carbamate crosslinkers.

Suitable melamine crosslinkers include hexamethoxymethylated melamine, hexabutoxymethylated melamine, and alkoxy and/or hydroxy-substituted derivatives thereof, and partial self-condensates thereof. Suitable glycoluril crosslinkers include tetramethoxymethylated glycoluril, tetrabutoxymethylated glycoluril, and alkoxy and/or hydroxy-substituted derivatives thereof, and partial self-condensates thereof. Suitable benzoguanamine crosslinkers include tetramethoxymethylated benzoguanamine, tetrabutoxymethylated benzoguanamine, and alkoxy and/or hydroxy-substituted derivatives thereof, and partial self-condensates thereof. Suitable urea crosslinkers include dimethoxymethylated dimethoxyethyleneurea, and alkoxy and/or hydroxy-substituted derivatives thereof, and partial self-condensates thereof. A typical β-hydroxyalkylamide crosslinker is N,N,N',N'-tetra(2-hydroxyethyl)adipic acid amide. Suitable isocyanurate crosslinkers include triglycidyl isocyanurate and triallyl isocyanurate. Suitable aziridine crosslinkers include 4,4'-bis(ethyleneiminocarbonylamino)diphenylmethane and 2,2-bishydroxymethylbutanol-tris[3-(1-aziridinyl)propionate].

Suitable amine crosslinkers include compounds having a plurality of amino groups such as ethylenediamines. Examples of ethylenediamines include, but are not limited to, ethylenediamine, 1,2-diaminopropane, 1,2-diamino-2-methylpropane, N-methylethylenediamine, N-ethylethylenediamine, N-isopropylethylenediamine, N-hexylethylenediamine, N-cyclohexylethylenediamine, N-octylethylenediamine, N-decylethylenediamine, N-dodecylethylenediamine, N,N-dimethylethylenediamine, N,N-diethylethylenediamine, N,N'-diethylethylenediamine, N,N'-diisopropylethylenediamine, N,N,N'-trimethylethylenediamine, diethylenetriamine, N-isopropyldiethylenetriamine, N-(2-aminoethyl)-1,3-propanediamine, triethylenetetramine, N,N'-bis(3-aminopropyl)ethylenediamine, N,N'-bis(2-aminoethyl)-1,3-propanediamine, tris(2-aminoethyl)amine, tetraethylenepentamine, pentaethylenehexamine, 2-(2-aminoethylamino)ethanol, N,N'-bis(hydroxyethyl)ethylenediamine, N-(hydroxyethyl)diethylenetriamine, N-(hydroxyethyl)triethylenetetramine, piperazine, 1-(2-aminoethyl)piperazine, 4-(2-aminoethyl)morpholine, and polyethyleneimine. Diamines other than the ethylenediamines and polyamines are also useful. Exemplary other diamines and polyamines include, but are not limited to, 1,3-diaminopropane, 1,4-diaminobutane, 1,3-diaminopentane, 1,5-diaminopentane, 2,2-dimethyl-1,3-propanediamine, hexamethylenediamine, 2-methyl-1,5-diaminopropane, 1,7-diaminoheptane, 1,8-diaminooctane, 2,2,4-trimethyl-1,6-hexanediamine, 2,4,4-trimethyl-1,6-hexanediamine, 1,9-diaminononane, 1,10-diaminodecane, 1,12-diaminododecane, N-methyl-1,3-propanediamine, N-ethyl-1,3-propanediamine, N-isopropyl-1,3-propanediamine, N,N-dimethyl-1,3-propanediamine, N,N'-dimethyl-1,3-propanediamine, N,N'-diethyl-1,3-propanediamine, N,N'-diisopropyl-1,3-propanediamine, N,N,N'-trimethyl-1,3-propanediamine, 2-butyl-2-ethyl-1,5-pentanediamine, N,N'-dimethyl-1,6-hexanediamine, 3,3'-diamino-N-methyldipropylamine, N-(3-aminopropyl)-1,3-propanediamine, spermidine, bis(hexamethylene)triamine, N,N',N''-trimethylbis(hexamethylene)triamine, 4-aminomethyl-1,8-octanediamine, N,N'-bis(3-aminopropyl)-1,3-propanediamine, spermine, 4,4'-methylenebis(cyclohexylamine), 1,2-diaminocyclohexane, 1,4-diaminocyclohexane, 1,3-cyclohexanebis(methylamine), 1,4-cyclohexanebis(methylamine), 1,2-bis(aminoethoxy)ethane, 4,9-dioxa-1,12-dodecanediamine, 4,7,10-trioxa-1,13-tridecanediamine, 1,3-diaminohydroxypropane, 4,4'-methylenedipiperidine, 4-(aminomethyl)piperidine, 3-(4-aminobutyl)piperidine, and polyallylamine.

The other preferred crosslinkers are carbamate compounds having the general formula (7):

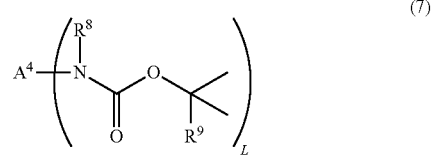

wherein L is an integer of 2 to 6, $A^4$ is an L-valent $C_2$-$C_{20}$ hydrocarbon group which may contain a hydroxyl or ether group, $R^8$ is hydrogen or a $C_1$-$C_4$ alkyl group, and $R^9$ is methyl or ethyl.

In formula (7), L is an integer of 2 to 6, with L=2 or 3 being most preferred. $A^4$ is an L-valent $C_2$-$C_{20}$ hydrocarbon group which may contain a hydroxyl or ether group, examples of which include ethane, propane, butane, isobutane, pentane, isopentane, neopentane, cyclopentane, hexane, cyclohexane, methylcyclohexane, dimethylcyclohexane, norbornane, methylnorbornane, decalin, adamantane, decane, pentadecane, dimethanodecahydronaphthalene, eicosan, 2-propanol, and diethyl ether, with L hydrogen atoms being eliminated. Inter alia, ethylene, propylene, butylene, trimethylene, tetramethylene, pentamethylene, hexamethylene, octamethylene, and 1,2,3-propanetriyl are preferred. $R^8$ is hydrogen or a $C_1$-$C_4$ alkyl group. Examples of the $C_1$-$C_4$ alkyl group of $R^8$ include methyl, ethyl, propyl, isopropyl, butyl, s-butyl, t-butyl, and isobutyl. Most preferably $R^8$ is hydrogen or methyl. $R^9$ is methyl or ethyl, with methyl being preferred.

Illustrative examples of the crosslinker of formula (7) are given below wherein Boc is t-butoxycarbonyl.

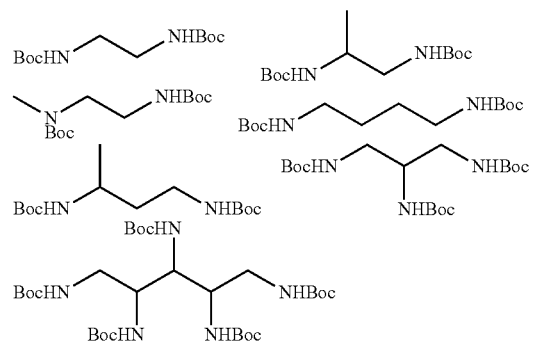

-continued

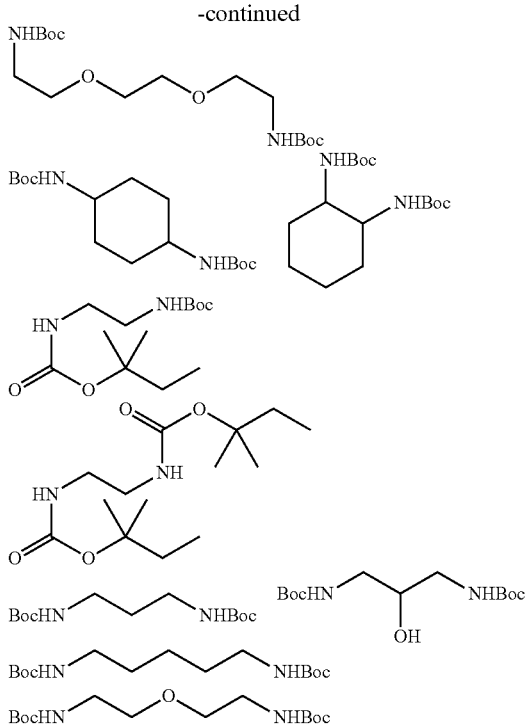

The crosslinkers may be used alone or in admixture of two or more. When added, the crosslinker is preferably blended in an amount of 0.01 to 8% by weight and more preferably 0.05 to 4% by weight of the resist-modifying composition. Less than 0.01 wt % of the crosslinker may achieve no addition effect whereas more than 8 wt % may adversely affect the applicability of the resist-modifying composition or increase pattern defects.

Once the resist-modifying composition is coated onto the first resist pattern-bearing substrate, it is preferably baked if necessary. Thereafter, an excess of the resist-modifying composition must be removed in order to regenerate space portions. Effective removal may be performed by rinsing with a solvent that does not attack the resist pattern, as used in coating of the resist-modifying composition, or water, alkaline developer or a mixture thereof. Rinsing may be followed by baking to ensure that the rinse liquid is evaporated off and the first resist pattern is modified. For each of the baking after coating of the resist-modifying composition and the baking after rinsing, the baking temperature is preferably in a range of 50 to 170° C., more preferably up to 160° C. For minimizing deformation of the first resist pattern, the baking temperature is more preferably up to 150° C. It is noted that one or both of these baking steps may be omitted in some cases.

Although it is not theoretically bound how the resist-modifying composition acts, the composition is believed to act according to the following mechanism, for example. In the first resist pattern surface layer, some acid labile groups on the resist polymer are deprotected to provide acidic groups (typically carboxyl groups) during the first resist process. When the resist-modifying composition is coated onto the first resist pattern and baked, the basic nitrogen-containing compound may be adsorbed to and mixed with the first resist pattern surface layer having acidic groups via acid-base reaction. Subsequently, the basic nitrogen-containing compound having crosslinking ability acts to form crosslinks, or mixing of a highly polar base resin increases hydrophilicity, thereby modifying the first resist pattern surface layer for insolubilizing it against ordinary resist solvents such as PGMEA, thus preventing the first pattern from being dissolved during coating of the second resist composition. The excess resist-modifying composition may be removed by washing with water, alkaline developer or aqueous alcohol solvent, thus preventing the first pattern from thickening. On the other hand, the adsorption and mixing of the basic nitrogen-containing compound in the resist-modifying composition endows the first resist pattern with basicity at the end of modifying treatment. During the second resist process, the acid generated by second exposure is neutralized with the basic endowment so that decomposition of acid labile groups in the first resist pattern is inhibited. As a result, the first resist pattern has been fully inactivated against the second exposure and development so that the first resist pattern is effectively retained. Particularly when the base resin in the first resist composition has carboxyl groups, adsorption of the basic nitrogen-containing compound via acid-base reaction with carboxyl groups occurs even in the utterly unexposed area, for example, at the central region of the large area pattern feature. It is thus believed that inactivation and solvent resistance improvement fully proceed in accordance with the mechanism contemplated above.

Process

Now, the double patterning process is described. FIGS. 4 to 6 illustrate prior art double patterning processes.

Referring to FIG. 4, one exemplary double patterning process I is illustrated. A photoresist film 30 is coated and formed on a processable layer 20 on a substrate 10. To prevent the resist pattern from collapsing, the technology intends to reduce the thickness of resist film. One approach taken to compensate for a lowering of etch resistance of thinner film is to process the processable layer using a hard mask. The double patterning process illustrated in FIG. 4 uses a multi-layer coating in which a hard mask 40 is laid between the resist film 30 and the processable layer 20 as shown in FIG. 4A. In the double patterning process, the hard mask is not always necessary, and an underlayer film in the form of a carbon film and a silicon-containing intermediate film may be laid instead of the hard mask, or an organic antireflective coating may be laid between the hard mask and the resist film. The hard mask used herein may be of $SiO_2$, SiN, SiON, p-Si or TiN, for example. The resist material used in double patterning process I is a positive resist composition. In the process, the resist film 30 is exposed and developed (FIG. 4B), the hard mask 40 is then dry etched (FIG. 4C), the resist film is stripped, and a second resist film 50 is coated, formed, exposed, and developed (FIG. 4D). Then the processable layer 20 is dry etched (FIG. 4E). Since this etching is performed using the hard mask pattern and the second resist pattern as a mask, variations occur in the pattern size after etching of the processable layer due to a difference in etch resistance between hard mask 40 and resist film 50.

To solve the above problem, a double patterning process II illustrated in FIG. 5 involves laying two layers of hard mask 41 and 42. The upper layer of hard mask 42 is processed using a first resist pattern, the lower layer of hard mask 41 is processed using a second resist pattern, and the processable layer is dry etched using the two hard mask patterns. It is essential to establish a high etching selectivity between first hard mask 41 and second hard mask 42. Thus the process is rather complex.

FIG. 6 illustrates a double patterning process III using a trench pattern. This process requires only one layer of hard mask. However, since the trench pattern is lower in optical contrast than the line pattern, the process has the drawbacks of difficult resolution of the pattern after development and a narrow margin. It is possible to form a wide trench pattern and induce shrinkage by the thermal flow or RELACS method, but this process is more intricate. Using negative resist materials enables exposure at a high optical contrast, but the negative resist materials generally have the drawbacks of low contrast and low resolution capability as compared with positive resist materials. The trench process requires a very high accuracy of alignment because any misalignment between the first and second trenches leads to a variation in the width of the finally remaining lines.

The double patterning processes I to III described above have the drawback that two hard mask etchings are involved. Due to a concomitant drop of throughput, the processes are uneconomical.

FIG. 1 illustrates the double patterning process of the invention. FIG. 1A shows a structure wherein a first resist film 30 of the first positive resist composition is formed on a processable layer 20 on a substrate 10 via a hard mask 40 as in FIG. 4A. The first resist film 30 is exposed patternwise and developed to form a first resist pattern (FIG. 1B). The resist film 30 is then treated with the resist-modifying composition for modification into a first resist pattern 30a which is inactivated to the second resist process (FIG. 10). The excess resist-modifying composition is desirably stripped off using water or alkaline developer. The structure may then be baked in order to promote modification of the first resist pattern. The preferred baking is at 50 to 170° C. for 5 to 600 seconds. A temperature higher than 170° C. is undesired because the resist pattern may be deformed due to thermal flow or shrunk as a result of deprotection of acid labile groups. The baking temperature is preferably up to 150° C., more preferably up to 140° C., and even more preferably up to 130° C. The pattern is little deformed if baking is at or below 130° C.

Next, the second resist composition is coated on the first pattern-bearing substrate to form a second resist film. Through patternwise exposure and development of the second resist film, a second resist pattern 50 is formed in an area where features of the inactivated first resist pattern 30a have not been formed (FIG. 1D). Thereafter, the hard mask 40 is etched (FIG. 1E). The processable layer 20 is dry etched, and finally, the inactivated first resist pattern 30a and second resist pattern 50 are removed (FIG. 1F). Single etching of the hard mask leads to a high throughput, making the process economical.

Figure 2B:
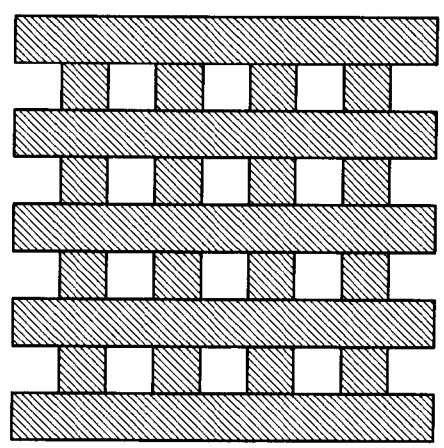
FIG. 2B shows a second resist pattern being formed.
Figure 3A:
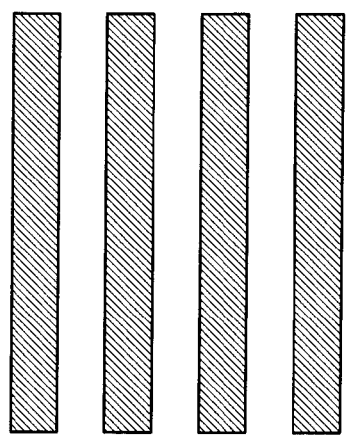
FIG. 3A shows a first resist pattern being formed.
Figure 3B:
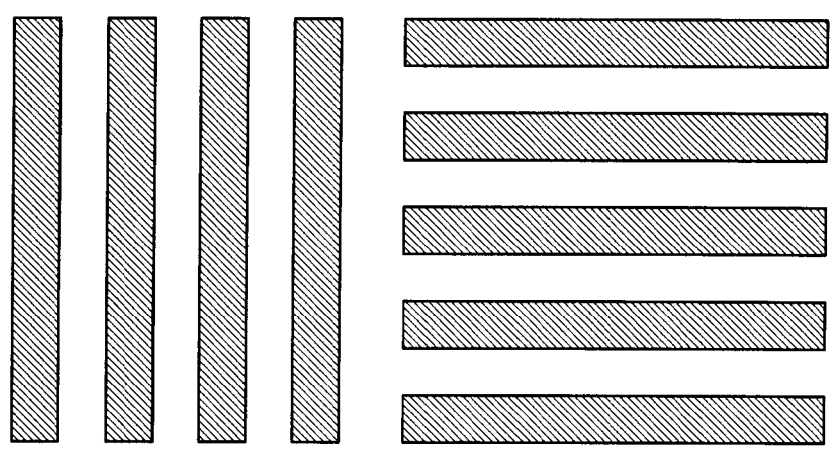
FIG. 3B shows a second resist pattern being formed.
Figure 4A:
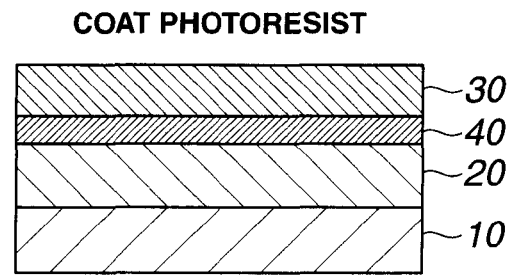
FIG. 4A shows a laminate of substrate, processable layer, hard mask and resist film.
Figure 4B:
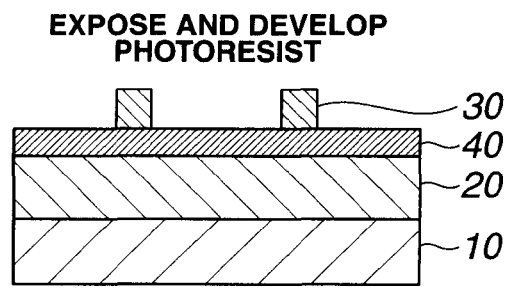
FIG. 4B shows the resist film being exposed and developed.
Figure 4C:
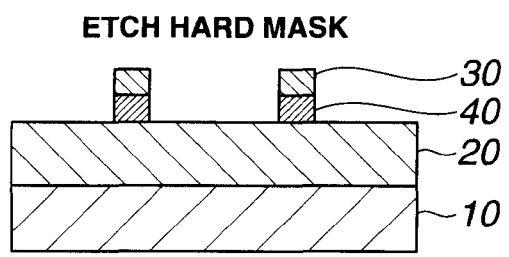
FIG. 4C shows the hard mask being etched.
Figure 4D:
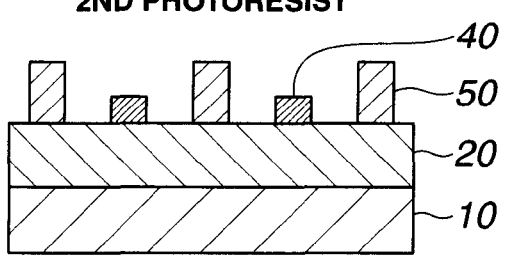
FIG. 4D shows a second resist film being formed, exposed and developed.
Figure 4E:
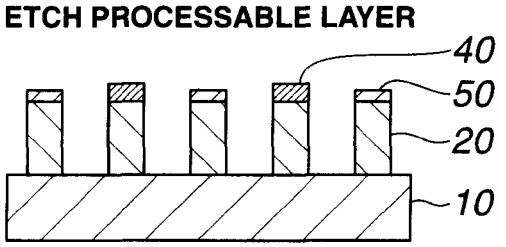
FIG. 4E shows the processable layer being etched.
Figure 5A:
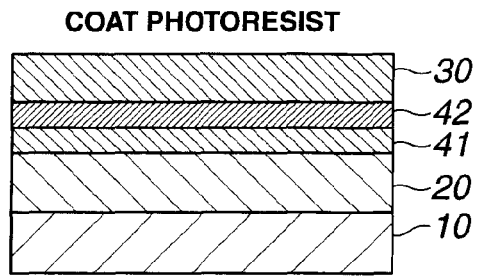
FIG. 5A shows a laminate of substrate, processable layer, 1st and 2nd hard masks and resist film.
Figure 5B:
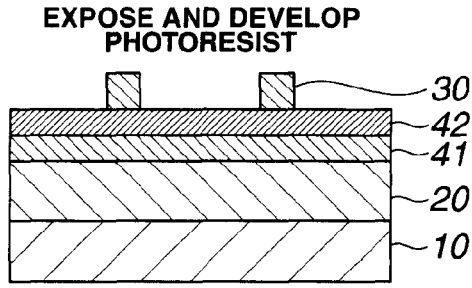
FIG. 5B shows the resist film being exposed and developed.
Figure 5C:
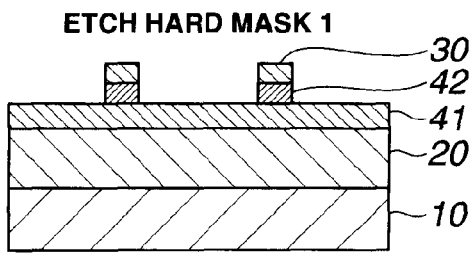
FIG. 5C shows the 2nd hard mask being etched.
Figure 5D:
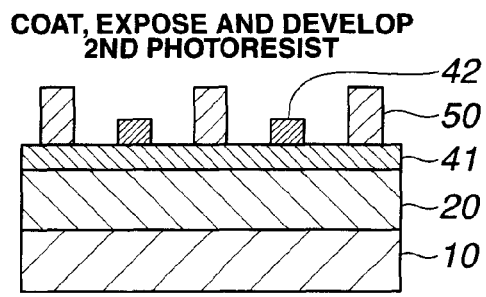
FIG. 5D shows, after removal of the first resist film, a second resist film being formed, exposed and developed.
Figure 5E:
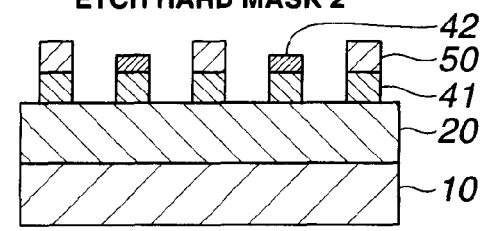
FIG. 5E shows the 1st hard mask being etched.
Figure 5F:
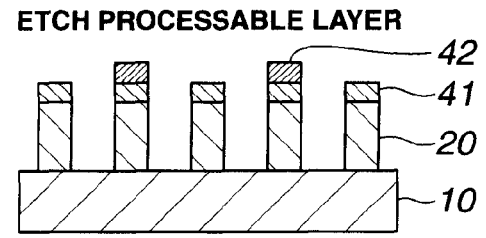
FIG. 5F shows the processable layer being etched.
Figure 6A:
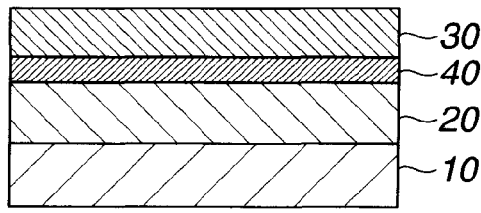
FIG. 6A shows a laminate of substrate, processable layer, hard mask and resist film.
Figure 6B:
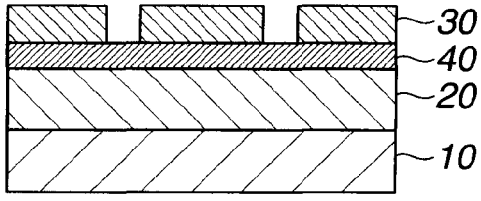
FIG. 6B shows the resist film being exposed and developed.
Figure 6C:
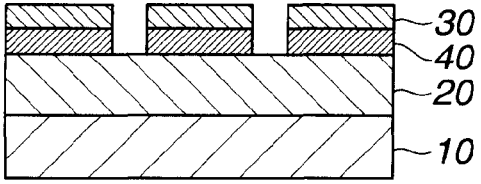
FIG. 6C shows the hard mask being etched.
Figure 6D:
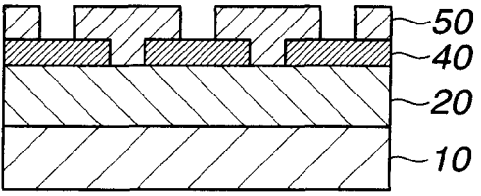
FIG. 6D shows, after removal of the first resist film, a second resist film being formed, exposed and developed.
Figure 6E:
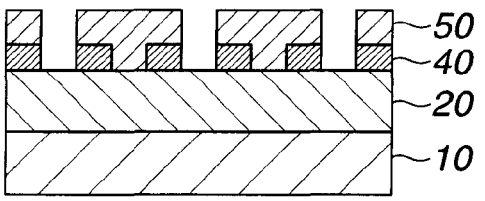
FIG. 6E shows the hard mask being etched.
Figure 6F:
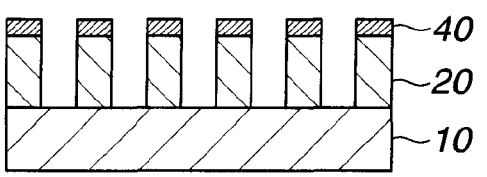
FIG. 6F shows the processable layer being etched.

The process illustrated in FIG. 1 forms the second pattern in spaces of the first pattern for reducing the distance between features of the final resist pattern. It is also acceptable to form the second pattern so as to cross the first pattern orthogonally as shown in FIG. 2. Although such a pattern may be formed through a single exposure step, an orthogonal line pattern may be formed at a very high contrast by a combination of dipolar illumination with polarized illumination. Specifically, pattern lines in Y-direction are formed as shown in FIG. 2A and then inactivated by the process of the invention. Thereafter, a second resist is coated and processed to form pattern lines in X-direction as shown in FIG. 2B. Combining X and Y lines defines a lattice pattern while empty areas become holes. The pattern that can be formed by such a process is not limited to the orthogonal pattern, and may include a T-shaped pattern (not shown) or a separated pattern as shown in FIG. 3B.

The substrate 10 used herein is generally a silicon substrate. The processable layer 20 used herein includes $SiO_2$, SiN, SiON, SiOC, p-Si, α-Si, TiN, WSi, BPSG, SOG, Cr, CrO, CrON, MoSi, low dielectric film, and etch stopper film. The hard mask 40 is as described above. Understandably, an underlayer film in the form of a carbon film and an intermediate intervening layer in the form of a silicon-containing intermediate film or organic antireflective coating may be formed instead of the hard mask.

In the process of the invention, a first resist film of a first positive resist composition is formed on the processable layer directly or via an intermediate intervening layer such as the hard mask. The first resist film preferably has a thickness of 10 to 1,000 nm, and more preferably 20 to 500 nm. The first resist film is heated or pre-baked prior to exposure, with the preferred pre-baking conditions including a temperature of 60 to 180° C., especially 70 to 150° C. and a time of 10 to 300 seconds, especially 15 to 200 seconds.

This is followed by patternwise exposure. For the exposure, preference is given to high-energy radiation having a wavelength of 140 to 250 nm, and especially ArF excimer laser radiation of 193 nm. The exposure may be done either in air or in a dry atmosphere with a nitrogen stream, or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with deionized water or liquid introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective coating may be applied onto the resist film after pre-baking for preventing any leach-outs from the resist film and improving water slip on the film surface. The resist protective coating used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. After formation of the resist film, deionized water rinsing (or post-soaking) may be carried out for extracting the acid generator and the like from the film surface or washing away particles, or after exposure, rinsing (or post-soaking) may be carried out for removing water droplets left on the resist film.

To the first resist composition, an additive for rendering the resist surface water repellent may be added. A typical additive is a polymer having fluorinated groups such as fluoroalcohol groups. After spin coating, the polymer segregates toward the resist surface to reduce the surface energy, thereby improving water slip. Such additives are described in JP-A 2007-297590 and JP-A 2008-122932.

Exposure is preferably carried out so as to provide an exposure dose of about 1 to 200 $mJ/cm^2$, more preferably about 10 to 100 $mJ/cm^2$. This is followed by PEB on a hot plate at 60 to 150° C. for 1 to 5 minutes, preferably at 80 to 120° C. for 1 to 3 minutes.

Thereafter the resist film is developed with a developer in the form of an aqueous alkaline solution, for example, an aqueous solution of 0.1 to 5 wt %, preferably 2 to 3 wt % TMAH for 0.1 to 3 minutes, preferably 0.5 to 2 minutes by conventional techniques such as dip, puddle and spray techniques. In this way, a desired resist pattern is formed on the substrate.

Like the first resist composition, the second resist composition is coated, exposed and developed in a standard way. In one preferred embodiment, the second resist pattern is formed in an area where features of the first resist pattern have not been formed, thereby reducing the distance between pattern features. The conditions of exposure and development and the thickness of the second resist film may be the same as described above.

Next, using the inactivated first resist film and the second resist film as a mask, the intermediate intervening layer of hard mask or the like is etched, and the processable layer further etched. For etching of the intermediate intervening layer of hard mask or the like, dry etching with fluorocarbon or halogen gases may be used. For etching of the processable layer, the etching gas and conditions may be properly chosen so as to establish an etching selectivity relative to the hard mask, and specifically, dry etching with fluorocarbon, halogen, oxygen, hydrogen or similar gases may be used. Thereafter, the first and second resist films are removed. Removal of these films may be carried out after etching of the intermediate intervening layer of hard mask or the like. It is noted that removal of the resist films may be achieved by dry etching with oxygen or groups or using strippers such as amines, sulfuric acid/aqueous hydrogen peroxide or organic solvents.

EXAMPLE

Examples of the invention are given below by way of illustration and not by way of limitation. The amount "pbw" is parts by weight. Me stands for methyl, and Boc stands for t-butoxycarbonyl.
Preparation of Base Resin for Resist Polymers to be used as the base resin in resist compositions were prepared by combining various monomers in 2-butanone medium, effecting copolymerization reaction in the presence of dimethyl 2,2-azobis(2-methylpropionate) as a radical polymerization initiator, crystallization in hexane, repeated washing, and vacuum drying. The resulting polymers (Polymers 1 to 7) had the composition shown below. The composition of each polymer was analyzed by $^1$H-NMR and $^{13}$C-NMR, and the Mw and Mw/Mn determined by GPC versus polystyrene standards.

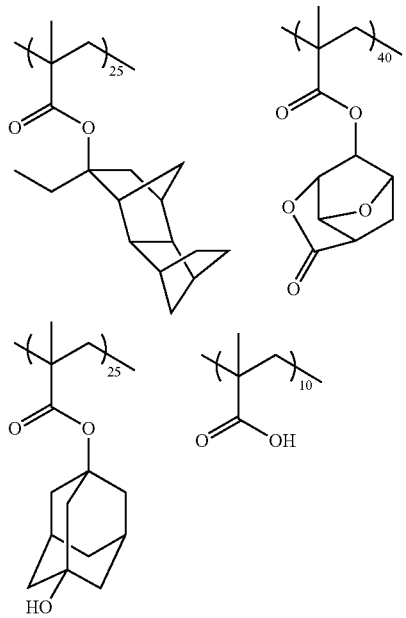

Polymer 1
Mw: 8,000
Mw/Mn: 1.95

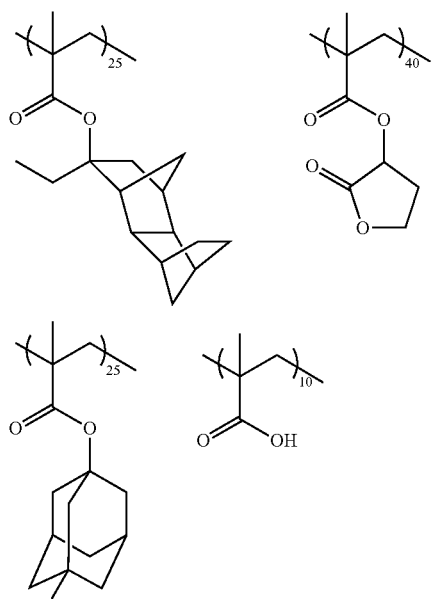

Polymer 2
Mw: 7,500
Mw/Mn: 1.91

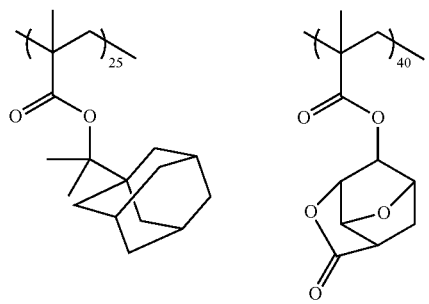

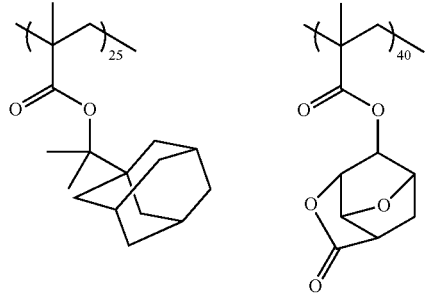

Polymer 3
Mw: 8,100
Mw/Mn: 1.96

-continued

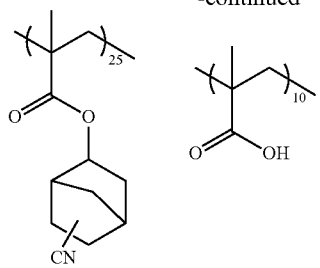

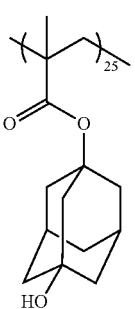

Polymer 4
Mw: 7,600
Mw/Mn: 1.89

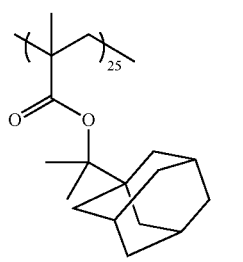

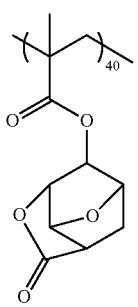

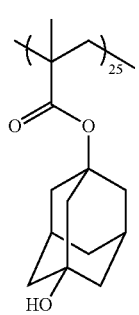

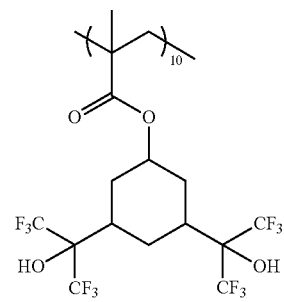

Polymer 5
Mw: 7,700
Mw/Mn: 1.89

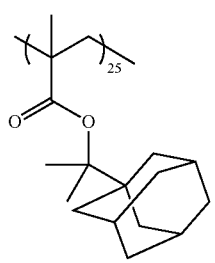

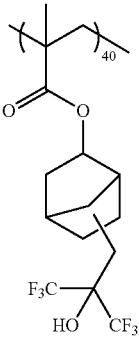

-continued

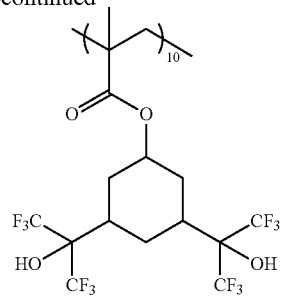

Polymer 6
Mw: 8,800
Mw/Mn: 1.99

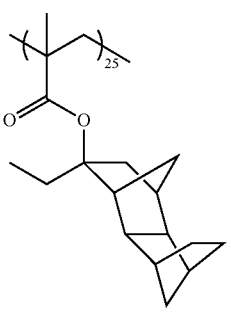

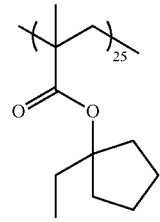

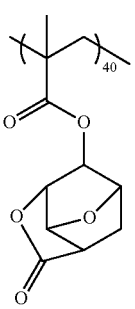

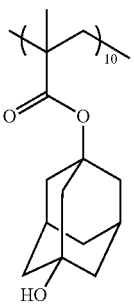

Polymer 7
Mw: 7,600
Mw/Mn: 1.57

Examples 1-1 to 1-4 and Reference Example 1-1 to 1-3

Preparation of First and Second Resist Compositions

A resist solution was prepared by dissolving each polymer (Polymers 1 to 7) as a base resin, an acid generator, a basic compound, and a repellent (for rendering the resist film surface water repellent) in a solvent in accordance with the recipe shown in Table 1, and filtering through a Teflon® filter with a pore size of 0.2 μm. The solvent contained 50 ppm of surfactant FC-4430 (3M-Sumitomo Co., Ltd.).

The components in Table 1 are identified below.

TABLE 1

| | | Resist composition | Base resin (pbw) | Acid generator (pbw) | Basic compound (pbw) | Repellent (pbw) | Organic solvent (pbw) |
|---|---|---|---|---|---|---|---|
| Example | 1-1 | Resist 1 | Polymer 1 (80) | PAG 1 (12.7) | Quencher 1 (2.0) | Repellent Polymer 1 (3.0) | PGMEA (2,160) cyclohexanone (240) |
| | 1-2 | Resist 2 | Polymer 2 (80) | PAG 1 (12.7) | Quencher 1 (2.0) | Repellent Polymer 1 (3.0) | PGMEA (2,160) cyclohexanone (240) |
| | 1-3 | Resist 3 | Polymer 3 (80) | PAG 1 (12.7) | Quencher 1 (2.0) | Repellent Polymer 1 (3.0) | PGMEA (2,160) cyclohexanone (240) |
| | 1-4 | Resist 4 | Polymer 4 (80) | PAG 1 (12.7) | Quencher 1 (2.0) | Repellent Polymer 1 (3.0) | PGMEA (2,160) cyclohexanone (240) |
| Reference Example | 1-1 | Resist 5 | Polymer 5 (80) | PAG 1 (12.7) | Quencher 1 (2.0) | Repellent Polymer 1 (3.0) | PGMEA (2,160) cyclohexanone (240) |
| | 1-2 | Resist 6 | Polymer 6 (80) | PAG 1 (12.7) | Quencher 1 (2.0) | Repellent Polymer 1 (3.0) | PGMEA (2,160) cyclohexanone (240) |
| | 1-3 | Resist 7 | Polymer 7 (80) | PAG 1 (7.6) | Quencher 1 (1.2) | Repellent Polymer 1 (3.0) | PGMEA (2,160) cyclohexanone (240) |

Acid generator: PAG1

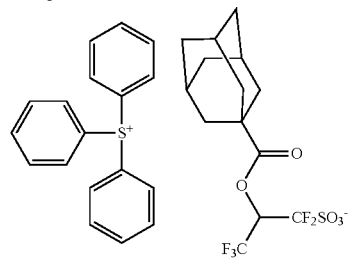

PAG 1

Basic compound: Quencher 1

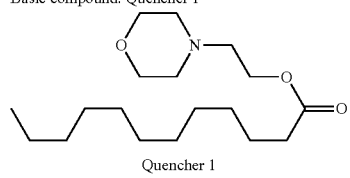

Quencher 1

Repellent:

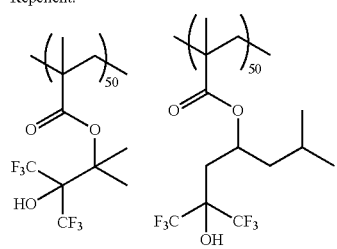

Repellent polymer 1
Mw: 8,900
Mw/Mn: 1.96

Organic solvent: PGMEA (propylene glycol monomethyl ether acetate)

Examples 2-1 to 2-6 and Reference Examples 2-1 to 2-4

Preparation of Resist-Modifying Composition

Resist-modifying compositions A to J were prepared by mixing a basic nitrogen-containing compound (N1 to N5), aqueous alcohol solvent, a polymer (Polymers 8, 9, shown below), a crosslinker (C1, C2), and a solvent in accordance with the recipe shown in Table 2, and filtering through a Teflon® filter with a pore size of 0.2 μm.

Polymer 8 is polyvinyl pyrrolidone with Mw=~10,000 commercially available from Aldrich. N5 and Polymer 9 were prepared by combining various monomers in ethanol solvent, effecting copolymerization reaction in the presence of dimethyl 2,2-azobis(2-methylpropionate) as a radical polymerization initiator, and distilling off the solvent. The composition of each polymer was analyzed by $^1$H-NMR and $^{13}$C-

NMR, and the Mw and Mw/Mn determined by GPC versus poly(methyl methacrylate) standards.

The components in Table 2 are identified below. For reference, a pKa value is reported as the index of basicity of a nitrogen-containing compound. The pKa value is a dissociation constant (pKa) of a conjugate acid corresponding to the nitrogen functional group having the highest basicity among nitrogen-containing compounds (based on pKa dB9.0 by ACD/Labs), with a larger value indicating a higher basicity.

TABLE 2

|  |  | Resist-modifying composition | Basic N-containing compound (pbw) | Polymer (pbw) | Crosslinker (pbw) | Solvent (pbw) |
|---|---|---|---|---|---|---|
| Example | 2-1 | A | N1 (195) | Polymer 8 (80) | — | SL1 (3,705) |
|  | 2-2 | B | N2 (195) | Polymer 8 (80) | — | SL1 (3,705) |
|  | 2-3 | C | N1/N3 (95/95) | Polymer 8 (80) | — | SL1 (3,705) |
|  | 2-4 | D | N1/N2 (95/95) | Polymer 8 (80) | — | SL1 (3,705) |
|  | 2-5 | E | N1 (100) | — | — | SL1 (9,500) H$_2$O (500) |
|  | 2-6 | F | N3 (100) | — | — | SL1 (9,500) H$_2$O (500) |
| Reference Example | 2-1 | G | N4/N5 (20/80) | — | — | SL1 (3,900) |
|  | 2-2 | H | N5 (80) | — | C1 (20) | SL2 (2,620) |
|  | 2-3 | I | — | Polymer 8 (100) | C2 (20) | SL1 (3,900) |
|  | 2-4 | J | — | Polymer 9 (100) | C1 (20) | SL2 (2,620) |

Basic nitrogen-containing compounds:
N1: 10.3 wt % aqueous solution of 3-[(2-aminoethyl)amino]-propyltrihydroxysilane, pKa = 10.1
N2: 10.3 wt % aqueous solution of 3-aminopropyltrihydroxy-silane, pKa = 10.6
N3: 10.3 wt % aqueous solution of 3-[(2-aminoethyl)amino]-propyldihydroxymethylsilane, pKa = 10.1
N4: 1,3-phenylenebisoxazoline, pKa = 4.8
N5:

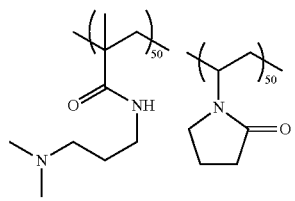

pKa: 9.5
Mw: 19,000
Mw/Mn: 2.58

Solvents:
SL1 isobutyl alcohol
SL2 1-butanol
H$_2$O deionized water
Polymers:

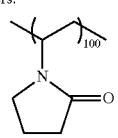

Polymer 8 (polyvinyl pyrrolidone)
pKa: −0.4
Mw: 11,500
Mw/Mn: 2.63

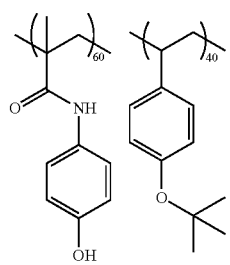

Polymer 9
pKa: 1.7
Mw: 5,200
Mw/Mn: 1.56

TABLE 2-continued

| Resist-modifying composition | Basic N-containing compound (pbw) | Polymer (pbw) | Crosslinker (pbw) | Solvent (pbw) |
|---|---|---|---|---|

Crosslinkers:

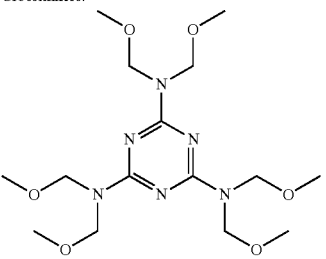

C1
pKa: 2.2

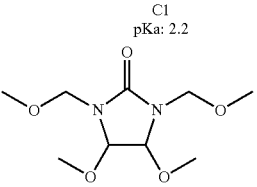

C2
pKa: -4.3

Example 3-1

Film Retention after Double Patterning Process

On a substrate (silicon wafer) having an antireflective coating (ARC-29A, Nissan Chemical Industries Ltd.) of 95 nm thick, Resist 1 in Table 1 as the first resist composition was spin coated, then baked on a hot plate at 100° C. for 60 seconds to form a resist film of 100 nm thick. Using an ArF excimer laser scanner model NSR-S610C (Nikon Corp., NA 1.30, σ0.98/0.78, 35° cross-pole illumination, azimuthally polarized illumination, 6% halftone phase shift mask), the resist film was exposed to a pattern including a 50-nm line/100-nm pitch pattern section and a large area pattern feature. Immediately after exposure, the resist film was baked (PEB) at 100° C. for 60 seconds and then developed for 30 seconds with a 2.38 wt % TMAH aqueous solution, obtaining a first pattern including a line-and-space pattern section having a line width of 50 nm and a large area pattern feature of rectangular shape of 10 μm width by 300 μm length for measuring SEM alignment.

The resist-modifying composition A shown in Table 2 was coated on the first resist pattern and baked at 120° C. for 60 seconds. It was developed for 30 seconds with a 2.38 wt % TMAH aqueous solution, rinsed with deionized water, and baked at 140° C. for 60 seconds, completing modification treatment of the first pattern.

Next, Resist 7 in Table 1 as the second resist composition was coated onto the first resist pattern-bearing substrate and baked at 95° C. for 60 seconds to form a second resist film. Using an ArF excimer laser scanner model NSR-S610C (Nikon Corp., NA 1.30, normal illumination, blank mask (pattern-less)), the wafer was flood exposed in a dose just enough to render the second resist film completely dissolvable. Immediately after exposure, the second resist film was baked (PEB) at 90° C. for 60 seconds and then developed for 30 seconds with a 2.38 wt % TMAH aqueous solution, completing a pseudo-double patterning process.

The final size of the line-and-space pattern was measured by a measuring SEM (CG-4000, Hitachi, Ltd.), finding a line width of 51 nm. The height of the large area pattern feature at its center region was measured by a cross-sectional SEM, finding a height of 79 nm. Separately, at the time when the wafer was processed until the first resist pattern was formed, the height of the large area pattern feature was measured by a cross-sectional SEM, finding a height of 90 nm. The film retentivity was 88%, calculated as final feature height divided by feature height after first pattern formation ×100%.

Examples 3-2 to 3-12 and Comparative Examples 1-1 to 1-3

Film Retention after Double Patterning Process

Another double patterning test was carried out as in Example 3-1 using the first resist composition and resist-modifying composition in the combination shown in Table 3. The test results are also shown in Table 3.

TABLE 3

| | | 1st resist composition | 1st resist PEB temp. | Modifying composition | 2nd resist composition | Size of L/S pattern (nm) | Retentivity (%) |
|---|---|---|---|---|---|---|---|
| Example | 3-1 | Resist 1 | 100° C. | A | Resist 7 | 51 | 88 |
| | 3-2 | Resist 2 | 90° C. | A | Resist 7 | 50 | 75 |
| | 3-3 | Resist 3 | 115° C. | A | Resist 7 | 52 | 90 |
| | 3-4 | Resist 4 | 115° C. | A | Resist 7 | 53 | 82 |

TABLE 3-continued

|  |  | 1st resist composition | 1st resist PEB temp. | Modifying composition | 2nd resist composition | Size of L/S pattern (nm) | Retentivity (%) |
|---|---|---|---|---|---|---|---|
|  | 3-5 | Resist 5 | 115° C. | A | Resist 7 | 47 | 61 |
|  | 3-6 | Resist 1 | 100° C. | B | Resist 7 | 52 | 89 |
|  | 3-7 | Resist 1 | 100° C. | C | Resist 7 | 50 | 88 |
|  | 3-8 | Resist 1 | 100° C. | D | Resist 7 | 51 | 88 |
|  | 3-9 | Resist 3 | 115° C. | E | Resist 7 | 54 | 90 |
|  | 3-10 | Resist 3 | 115° C. | F | Resist 7 | 53 | 90 |
|  | 3-11 | Resist 1 | 100° C. | G | Resist 7 | 54 | 85 |
|  | 3-12 | Resist 1 | 100° C. | H | Resist 7 | 54 | 79 |
|  | 1-1 | Resist 6 | 105° C. | A | Resist 7 | UM | 0 |
| Comparative | 1-2 | Resist 1 | 100° C. | I | Resist 7 | UM | 0 |
| Example | 1-3 | Resist 1 | 100° C. | J | Resist 7 | UM | 0 |

*UM: unmeasurable

It is seen from Table 3 that in Examples, the first pattern including the large area feature was retained at the end of the second resist process. In Comparative Examples, the large area feature was lost, indicating insufficient film retention. In Examples, the large area pattern feature for alignment on measurement by measuring SEM was retained, and measurement by measuring SEM was possible at the end of double patterning process. In Comparative Examples, the large area pattern feature for alignment was lost, and measurement by measuring SEM was impossible.

Example 4-1

Double Patterning Test by L/S Pattern Formation

On a substrate (silicon wafer) having an antireflective coating (ARC-29A, Nissan Chemical Industries Ltd.) of 95 nm thick, Resist 1 in Table 1 as the first resist composition was spin coated, then baked on a hot plate at 100° C. for 60 seconds to form a resist film of 100 nm thick. Using an ArF excimer laser scanner model NSR-S610C (Nikon Corp., NA 1.30, σ0.98/0.78, 35° cross-pole illumination, azimuthally polarized illumination, 6% halftone phase shift mask), the resist film was exposed to a Y-direction 50-nm line/200-nm pitch pattern. Immediately after exposure, the resist film was baked (PEB) at 100° C. for 60 seconds and then developed for 30 seconds with a 2.38 wt % TMAH aqueous solution, obtaining a first line-and-space pattern having a line width of 50 nm.

The resist-modifying composition A shown in Table 2 was coated on the first resist pattern and baked at 120° C. for 60 seconds. It was developed for 30 seconds with a 2.38 wt % TMAH aqueous solution, rinsed with deionized water, and baked at 140° C. for 60 seconds, completing modification treatment of the first pattern.

Figure 7:
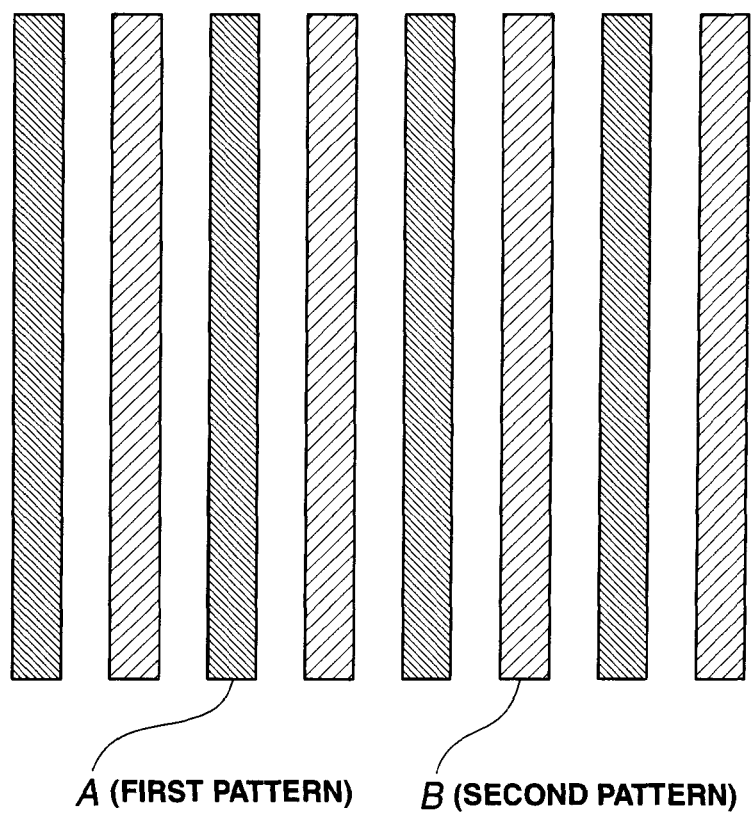
FIG. 7 is a plan view of a parallel line-and-space pattern formed in a double patterning test in Examples.

Next, Resist 7 in Table 1 as the second resist composition was coated onto the first resist pattern-bearing substrate and baked at 95° C. for 60 seconds to form a second resist film. Using an ArF excimer laser scanner model NSR-S610C (Nikon Corp., NA 1.30, σ0.98/0.78, 35° cross-pole illumination, azimuthally polarized illumination, 6% halftone phase shift mask), the wafer was exposed to a Y-direction 50-nm line/200-nm pitch pattern which was shifted 100 nm from the first pattern in X-direction. Immediately after exposure, the second resist film was baked (PEB) at 90° C. for 60 seconds and then developed for 30 seconds with a 2.38 wt % TMAH aqueous solution, completing a double patterning process. A 50-nm line/100 nm pitch L/S pattern was obtained (FIG. 7).

The line width of the first and second patterns at the end of double patterning was measured by a measuring SEM (CG-4000, Hitachi, Ltd.). The results are shown in Table 4.

Examples 4-2 to 4-4

Double Patterning Test by L/S Pattern Formation

Another double patterning test was carried out as in Example 4-1 using the first resist composition and resist-modifying composition in the combination shown in Table 4. The test results are also shown in Table 4.

TABLE 4

|  |  | 1st resist composition | 1st resist PEB temp. | Modifying composition | 2nd resist composition | Size of 1st pattern (nm) | Size of 2nd pattern (nm) |
|---|---|---|---|---|---|---|---|
| Example | 4-1 | Resist 1 | 100° C. | A | Resist 7 | 52 | 50 |
|  | 4-2 | Resist 3 | 115° C. | A | Resist 7 | 52 | 50 |
|  | 4-3 | Resist 3 | 115° C. | F | Resist 7 | 53 | 50 |
|  | 4-4 | Resist 1 | 100° C. | G | Resist 7 | 55 | 50 |

Example 5-1

Double Patterning Test by Hole Pattern Formation

On a substrate (silicon wafer) having an antireflective coating (ARC-29A, Nissan Chemical Industries Ltd.) of 95 nm thick, Resist 1 in Table 1 as the first resist composition was spin coated, then baked on a hot plate at 100° C. for 60 seconds to form a resist film of 100 nm thick. Using an ArF excimer laser scanner model NSR-S610C (Nikon Corp., NA 1.20, σ0.92, 35° dipole illumination), the resist film was exposed to a X-direction 60-nm line/120-nm pitch pattern. Immediately after exposure, the resist film was baked (PEB)

at 100° C. for 60 seconds and then developed for 30 seconds with a 2.38 wt % TMAH aqueous solution, obtaining a first line-and-space pattern having a line size of 60 nm. The resist-modifying composition A shown in Table 2 was coated on the first resist pattern and baked at 120° C. for 60 seconds. It was developed for 30 seconds with a 2.38 wt % TMAH aqueous solution, rinsed with deionized water, and baked at 140° C. for 60 seconds, completing modification treatment of the first pattern.

Figure 8:
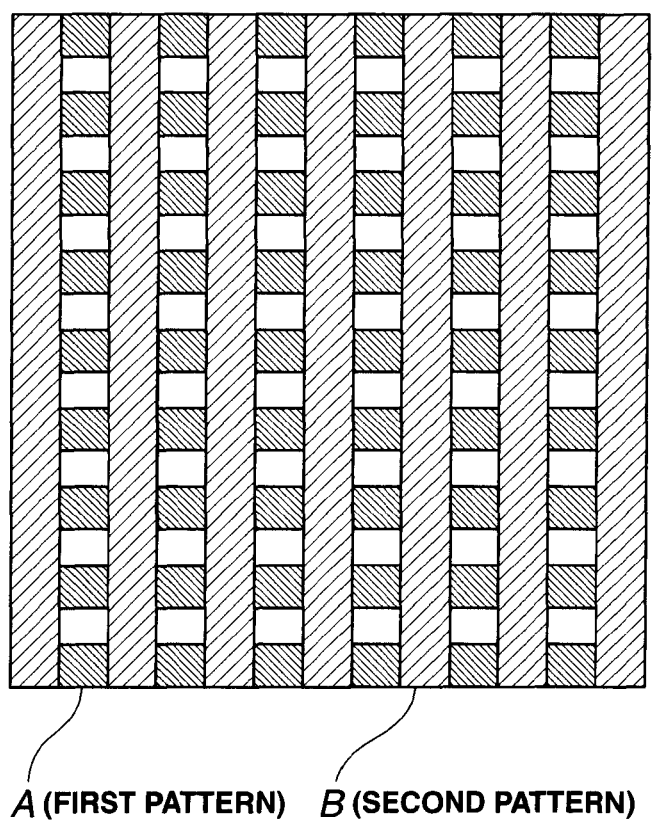
FIG. 8 is a plan view of a hole pattern formed in another double patterning test in Examples.

Next, Resist 7 in Table 1 as the second resist composition was coated onto the first resist pattern-bearing substrate and baked at 95° C. for 60 seconds to form a second resist film. Using an ArF excimer laser scanner model NSR-S610C (Nikon Corp., NA 1.20, σ0.92, 35° dipole illumination), the wafer was exposed to a Y-direction 60-nm line/120-nm pitch pattern which extended orthogonally to the first pattern. Immediately after exposure, the second resist film was baked (PEB) at 90° C. for 60 seconds and then developed for 30 seconds with a 2.38 wt % TMAH aqueous solution, obtaining a hole pattern (FIG. 8).

The size of the final hole pattern was measured by a measuring SEM (CG-4000, Hitachi, Ltd.). The results are shown in Table 5.

Examples 5-2 to 5-4

Double Patterning Test by Hole Pattern Formation

Another double patterning test was carried out as in Example 5-1 using the first resist composition and resist-modifying composition in the combination shown in Table 5. The test results are also shown in Table 5.

TABLE 5

|  |  | 1st resist composition | 1st resist PEB temp. | Modifying composition | 2nd resist composition | Hole size in X-direction (nm) | Hole size in Y-direction (nm) |
|---|---|---|---|---|---|---|---|
| Example | 5-1 | Resist 1 | 100° C. | A | Resist 7 | 58 | 60 |
|  | 5-2 | Resist 3 | 115° C. | A | Resist 7 | 58 | 60 |
|  | 5-3 | Resist 3 | 115° C. | F | Resist 7 | 57 | 60 |
|  | 5-4 | Resist 1 | 100° C. | G | Resist 7 | 56 | 60 |

It is evident from Tables 4 and 5 that when double patterning is carried out by the pattern forming process of the invention, it is possible to form a narrow pitch parallel line pattern by two exposures of parallel line patterns and to form a hole pattern by two exposures of orthogonal line patterns.

The pattern forming process, resist composition, and resist-modifying composition of the invention are advantageously applicable to the double patterning process of processing a substrate through two exposures and a single dry etching. Because of satisfactory retention of the first resist pattern including a large area feature, the invention is very useful in various instrumentations utilizing the large area feature, for example, alignment upon measurement by a measuring SEM.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2009-182136 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A multiple pattern-forming process comprising the steps of:
    (1) coating a first positive resist composition comprising as a base resin a polymer comprising recurring units adapted to increase alkali solubility under the action of acid and recurring units having lactone structure onto a substrate and baking to form a first resist film, exposing the first resist film to high-energy radiation, post-exposure baking, and developing the first resist film with an alkaline developer to form a first positive resist pattern including a large area pattern feature having a short side of at least 200 nm,
    (2) applying a resist-modifying composition comprising an aminosilanol compound as a basic nitrogen-containing compound having a conjugate acid pKa of at least 4 onto the first resist pattern and heating to modify the first resist pattern, and
    (3) coating a second positive resist composition thereon and baking to form a second resist film, exposing the second resist film to high-energy radiation, post-exposure baking, and developing the second resist film with an alkaline developer to form a second resist pattern, wherein the large area pattern feature in the first resist pattern has a film retentivity of at least 50% after the formation of the second resist pattern.

2. The process of claim 1 wherein the polymer in the first positive resist composition further comprises recurring units having a carboxyl group.

3. The process of claim 1, wherein the aminosilanol compound is selected from the following general formulae (S0), (S1) and (S2):

(S0)

wherein $A^{S1}$ is a straight, branched or cyclic $C_2$-$C_{20}$ alkylene group, $C_6$-$C_{15}$ arylene group, or $C_7$-$C_{16}$ aralkylene group, which may contain a hydroxyl, ether or amino group, $R^{S1}$ is each independently a $C_1$-$C_4$ alkyl group or $OR^{S2}$, $R^{S2}$ is hydrogen or a $C_1$-$C_6$ alkyl group, $R^{S3}$ is each independently hydrogen, or a $C_1$-$C_4$ alkyl group which may contain a hydroxyl or ether group, $R^{S3}$ may bond together to form a ring with the nitrogen atom to which they are attached,

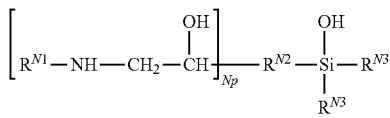
(S1)

wherein $R^{N1}$ is hydrogen or a straight, branched or cyclic $C_1$-$C_{20}$ alkyl group, $C_6$-$C_{10}$ aryl group, or $C_2$-$C_{12}$ alkenyl group, which may contain a hydroxyl, ether, ester or amino group, Np is 1 or 2, in the case of Np=1, $R^{N2}$ is a straight, branched or cyclic $C_1$-$C_{20}$ alkylene group which may contain an ether, ester or phenylene group, in the case of Np=2, $R^{N2}$ is the foregoing alkylene group with one carbon-bonded hydrogen atom eliminated, $R^{N3}$ is each independently hydrogen, a $C_1$-$C_6$ alkyl, $C_6$-$C_{10}$ aryl, $C_2$-$C_{12}$ alkenyl, $C_1$-$C_6$ alkoxy, $C_6$-$C_{10}$ aryloxy, $C_2$-$C_{12}$ alkenyloxy, $C_7$-$C_{12}$ aralkyloxy, or hydroxyl group, at least one of $R^{N3}$ is alkoxy or hydroxyl,

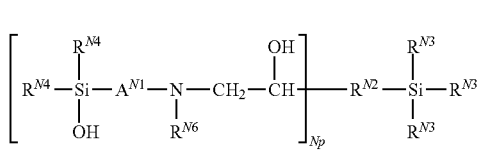
(S2)

wherein $A^{N1}$ is a straight, branched or cyclic $C_2$-$C_{20}$ alkylene group, $C_6$-$C_{15}$ arylene or $C_7$-$C_{16}$ aralkylene group, which may contain a hydroxyl, ether, or amino group, $R^{N4}$ is each independently a $C_1$-$C_4$ alkyl group or $OR^{N5}$, $R^{N5}$ is hydrogen or $C_1$-$C_6$ alkyl, $R^{N6}$ is each independently hydrogen or a $C_1$-$C_4$ alkyl group which may contain hydroxyl or ether group, Np, $R^{N2}$ and $R^{N3}$ are as defined above.

4. A multiple pattern-forming process comprising the steps of,
(1) coating a first positive resist composition comprising as a base resin a polymer comprising recurring units adapted to increase alkali solubility under the action of acid and recurring units having lactone structure onto a substrate and baking to form a first resist film, exposing the first resist film to high-energy radiation, post-exposure baking, and developing the first resist film with an alkaline developer to form a first positive resist pattern including a large area pattern feature having a short side of at least 200 nm,
(2) applying a resist-modifying composition comprising a basic nitrogen-containing compound having a conjugate acid pKa of at least 4 and an oxazoline compound onto the first resist pattern and heating to modify the first resist pattern, and
(3) coating a second positive resist composition thereon and baking to form a second resist film, exposing the second resist film to high-energy radiation, post-exposure baking, and developing the second resist film with an alkaline developer to form a second resist pattern, wherein
the large area pattern feature in the first resist pattern has a film retentivity of at least 50% after the formation of the second resist pattern.

5. The process of claim 4 wherein the oxazoline compound has the general formula (Ox):

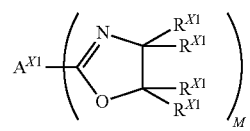
(Ox)

wherein M is an integer of 1 to 6, $A^{X1}$ is hydrogen, a single bond, a M-valent acyclic or cyclic $C_1$-$C_{20}$ hydrocarbon group or a M-valent $C_6$-$C_{15}$ aromatic group, and $R^{X1}$ is each independently hydrogen or methyl.

6. A multiple pattern-forming process comprising the steps of:
(1) coating a first positive resist composition comprising as a base resin a polymer comprising recurring units adapted to increase alkali solubility under the action of acid and recurring units having lactone structure onto a substrate and baking to form a first resist film, exposing the first resist film to high-energy radiation, post-exposure baking, and developing the first resist film with an alkaline developer to form a first positive resist pattern including a large area pattern feature having a short side of at least 200 nm,
(2) applying a resist-modifying composition comprising a basic nitrogen-containing compound having a conjugate acid pKa of at least 4 and a base resin comprising recurring units having a basic functional group onto the first resist pattern and heating to modify the first resist pattern, and
(3) coating a second positive resist composition thereon and baking to form a second resist film, exposing the second resist film to high-energy radiation, post-exposure baking, and developing the second resist film with an alkaline developer to form a second resist pattern, wherein
the large area pattern feature in the first resist pattern has a film retentivity of at least 50% after the formation of the second resist pattern.

7. The process of claim 6 wherein in the resist-modifying composition, the base resin comprises recurring units of the following general formula (1):

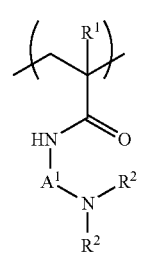
(1)

wherein $A^1$ is a straight, branched or cyclic $C_2$-$C_8$ alkylene group which may contain an ether group, $R^1$ is hydrogen or methyl, and $R^2$ is each independently a $C_1$-$C_4$ alkyl group or $R^2$ may bond together to form a heterocyclic ring with the nitrogen atom to which they are attached.

8. The process of claim 7 wherein the base resin further comprises recurring units of the following general formula (6):

(6)

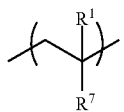

wherein $R^1$ is hydrogen or methyl, and $R^7$ is a $C_6$-$C_{15}$ aryl, $C_3$-$C_{10}$ hetero-aryl or $C_4$-$C_6$ lactam group.

9. The process of claim 1 wherein the polymer in the first positive resist composition comprises at least recurring units having formulae (2) to (4):

(2)

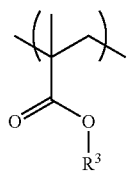

(3)

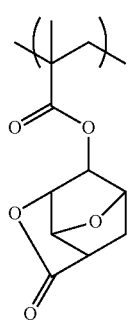

(4)

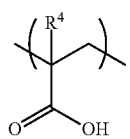

wherein $R^3$ is a branched or cyclic, tertiary $C_4$-$C_{20}$ alkyl group which may contain an ether group, and $R^4$ is hydrogen or methyl.

10. The process of claim 1 wherein the polymer in the first positive resist composition comprises at least recurring units having formulae (2) to (5):

(2)

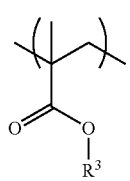

(3)

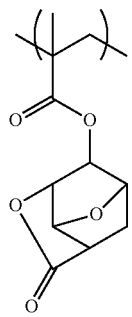

(4)

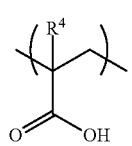

(5)

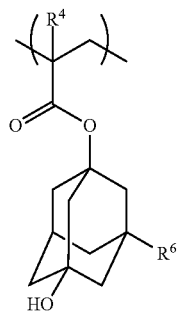

wherein $R^3$ is a branched or cyclic, tertiary $C_4$-$C_{20}$ alkyl group which may contain an ether group, $R^4$ and $R^5$ are each independently hydrogen or methyl, and $R^6$ is hydrogen or hydroxyl.

11. The process of claim 4 wherein the polymer in the first positive resist composition comprises at least recurring units having formulae (2) to (4):

(2)

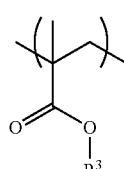

(3)

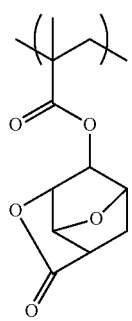

-continued (4)

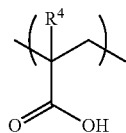

wherein $R^3$ is a branched or cyclic, tertiary $C_4$-$C_{20}$ alkyl group which may contain an ether group, and $R^4$ is hydrogen or methyl.

12. The process of claim 6 wherein the polymer in the first positive resist composition comprises at least recurring units having formulae (2) to (4):

(2)

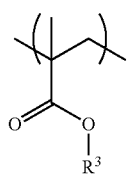

(3)

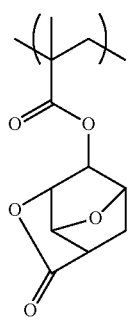

(4)

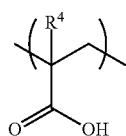

wherein $R^3$ is a branched or cyclic, tertiary $C_4$-$C_{20}$ alkyl group which may contain an ether group, and $R^4$ is hydrogen or methyl.

13. The process of claim 4 wherein the polymer in the first positive resist composition comprises at least recurring units having formulae (2) to (5):

(2)

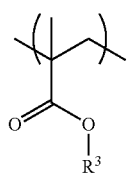

-continued (3)

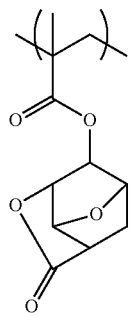

(4)

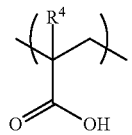

(5)

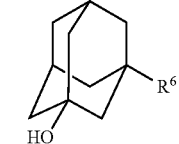

wherein $R^3$ is a branched or cyclic, tertiary $C_4$-$C_{20}$ alkyl group which may contain an ether group, $R^4$ and $R^5$ are each independently hydrogen or methyl, and $R^6$ is hydrogen or hydroxyl.

14. The process of claim 6 wherein the polymer in the first positive resist composition comprises at least recurring units having formulae (2) to (5):

(2)

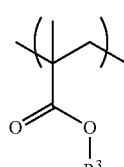

(3)

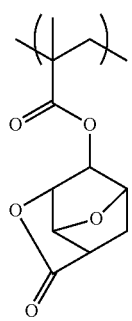

-continued
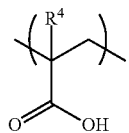
(4)
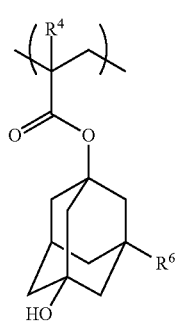
(5)
wherein $R^3$ is a branched or cyclic, tertiary $C_4$-$C_{20}$ alkyl group which may contain an ether group, $R^4$ and $R^5$ are each independently hydrogen or methyl, and $R^6$ is hydrogen or hydroxyl.
15. The process of claim 4 wherein the resist-modifying composition further comprises a base resin comprising recurring units having a basic functional group.
* * * * *